US012068884B1

(12) United States Patent
Bryant et al.

(10) Patent No.: US 12,068,884 B1
(45) Date of Patent: *Aug. 20, 2024

(54) ARCHITECTURE FOR A MULTICHANNEL GEOPHYSICAL DATA ACQUISITION SYSTEM AND METHOD OF USE

(71) Applicant: Earthsystems Technologies, Inc., Carrollton, TX (US)

(72) Inventors: John Bryant, Dallas, TX (US); Frederick Hershel Savage, Austin, TX (US); Timothy Beets, Austin, TX (US)

(73) Assignee: Earthsystems Technologies, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,510

(22) Filed: May 22, 2023

Related U.S. Application Data

(63) Continuation of application No. 18/321,462, filed on May 22, 2023, which is a continuation of application
(Continued)

(51) Int. Cl.
*H04L 12/40* (2006.01)
*G01V 3/20* (2006.01)
(Continued)

(52) U.S. Cl.
CPC .......... *H04L 12/40013* (2013.01); *G01V 3/20* (2013.01); *G01V 3/38* (2013.01);
(Continued)

(58) Field of Classification Search
CPC ... G01V 9/02; G01V 3/02; G01V 3/20; G01V 3/38; G06F 13/28; H04L 12/40013;
(Continued)

(56) References Cited

U.S. PATENT DOCUMENTS

| 2,172,778 A | 9/1939 | Taylor |
| 2,307,887 A | 1/1943 | Haynes |

(Continued)

FOREIGN PATENT DOCUMENTS

| JP | 3944335 B2 | 7/2007 |
| KR | 101274251 B1 | 6/2013 |
| WO | 9429752 A1 | 12/1994 |
| WO | 2011158103 A1 | 12/2011 |
| WO | 2015062327 A1 | 5/2015 |
| WO | 2015002558 A2 | 9/2015 |

OTHER PUBLICATIONS

Tanaka, Hiroyuki KM. "Muographic mapping of the subsurface density structures in Miura, Boso and Izu peninsulas, Japan." Scientific reports 5 (2015): 8305.
(Continued)

*Primary Examiner* — Dung B Huynh
(74) *Attorney, Agent, or Firm* — Schultz & Associates, P.C.

(57) ABSTRACT

A method for a multichannel geophysical data acquisition system is provided in the field of electrical resistivity tomography. Individual and autonomous node operating systems are provided. Separate communication channels for upstream and downstream data transfer, high voltage transfer and synchronization signals are provided. A novel use of high voltage isolation barriers is also provided. A direct memory access data transfer process is provided.

19 Claims, 42 Drawing Sheets

Related U.S. Application Data

No. 17/662,605, filed on May 9, 2022, now Pat. No. 11,671,277, which is a continuation of application No. 17/661,896, filed on May 3, 2022, now Pat. No. 11,658,844, which is a continuation of application No. 17/658,407, filed on Apr. 7, 2022, said application No. 16/948,061 is a continuation of application No. 16/948,059, filed on Aug. 28, 2020, now Pat. No. 11,323,285, said application No. 17/658,407 is a continuation-in-part of application No. 16/948,062, filed on Aug. 28, 2020, which is a continuation of application No. 16/948,061, filed on Aug. 28, 2020, now Pat. No. 11,329,843.

(51) Int. Cl.
  *G01V 3/38* (2006.01)
  *G06F 13/28* (2006.01)
  *H04L 7/00* (2006.01)
  *H04L 61/4552* (2022.01)

(52) U.S. Cl.
  CPC ............ *G06F 13/28* (2013.01); *H04L 7/0008* (2013.01); *H04L 12/40019* (2013.01); *H04L 61/4552* (2022.05)

(58) Field of Classification Search
  CPC ......... H04L 12/40019; H04L 12/40039; H04L 12/40052; H04L 12/40045; H04L 12/403; H04L 7/0008; H04L 61/4552; H04L 61/5038; H03M 1/66
  See application file for complete search history.

(56) References Cited

U.S. PATENT DOCUMENTS

| | | | |
|---|---|---|---|
| 3,735,249 A | 5/1973 | Stoll | |
| 3,968,428 A | 7/1976 | Numoto | |
| 4,023,140 A | 5/1977 | Siems et al. | |
| 4,042,906 A * | 8/1977 | Ezell | G01V 1/223 |
| | | | 367/67 |
| 4,210,813 A | 7/1980 | Romanovsky et al. | |
| 4,319,347 A | 3/1982 | Savit | |
| 5,357,202 A | 10/1994 | Henderson | |
| 5,537,045 A | 7/1996 | Henderson | |
| 5,920,828 A | 7/1999 | Norris et al. | |
| 6,226,601 B1 | 5/2001 | Longaker | |
| 6,332,109 B1 * | 12/2001 | Sheard | G01V 1/24 |
| | | | 324/357 |
| 6,359,438 B1 | 3/2002 | Bittar | |
| 6,404,203 B1 | 6/2002 | Lagmanson | |
| 6,549,012 B2 | 4/2003 | Stolarczyk | |
| 6,674,286 B2 | 1/2004 | Lagmanson | |
| 6,804,625 B1 | 10/2004 | Bryant | |
| 6,916,983 B2 | 7/2005 | Orsini et al. | |
| 6,977,867 B2 | 12/2005 | Chamberlain | |
| 7,069,780 B2 | 7/2006 | Ander | |
| 7,158,048 B2 | 1/2007 | Abdelhadi | |
| 7,239,154 B2 | 7/2007 | Lundstrom | |
| 7,269,095 B2 | 9/2007 | Chamberlain et al. | |
| 7,299,133 B2 | 11/2007 | Duncan et al. | |
| 7,353,132 B2 | 4/2008 | Sheard et al. | |
| 7,386,402 B2 | 6/2008 | Bryant | |
| 7,388,382 B2 | 6/2008 | Strack et al. | |
| 7,633,296 B2 | 12/2009 | Safinya et al. | |
| 7,663,973 B2 | 2/2010 | Chamberlain | |
| 7,689,364 B2 | 3/2010 | Lagmanson et al. | |
| 7,788,049 B2 | 8/2010 | Bryant et al. | |
| 7,813,883 B2 | 10/2010 | Bryant | |
| 8,019,547 B2 | 9/2011 | Bryant | |
| 8,209,125 B2 | 6/2012 | Berkovitch et al. | |
| 8,321,160 B2 | 11/2012 | Bryant et al. | |
| 8,380,439 B2 | 2/2013 | Lagmanson et al. | |
| 8,483,965 B2 | 7/2013 | Bradley et al. | |
| 8,892,410 B2 | 11/2014 | Krohn | |
| 8,965,705 B2 | 2/2015 | Lagmanson et al. | |
| 9,051,832 B2 | 6/2015 | Ahler et al. | |
| 9,151,861 B2 | 10/2015 | Labrecque | |
| 9,158,022 B2 | 10/2015 | Park et al. | |
| 9,293,843 B2 | 3/2016 | Lu | |
| 9,551,210 B2 * | 1/2017 | Bartel | G01V 3/26 |
| 9,638,821 B2 | 5/2017 | Meyer | |
| 9,700,893 B2 | 7/2017 | Moeny | |
| 9,921,330 B2 | 3/2018 | Berglund | |
| 9,952,345 B1 | 4/2018 | Harro | |
| 9,995,838 B2 | 6/2018 | Labrecque | |
| 10,012,063 B2 | 7/2018 | Storslett et al. | |
| 10,310,118 B2 | 6/2019 | Willis | |
| 10,408,960 B2 | 9/2019 | Berglund | |
| 10,901,117 B2 * | 1/2021 | Sale | H04Q 9/00 |
| 11,323,285 B1 * | 5/2022 | Bryant | G01V 3/02 |
| 11,477,411 B1 * | 10/2022 | Harfouche | H04N 23/698 |
| 11,658,844 B1 * | 5/2023 | Bryant | H04L 61/4552 |
| | | | 709/253 |
| 2001/0005407 A1 * | 6/2001 | Kaewell, Jr. | H04W 88/02 |
| | | | 375/356 |
| 2004/0039758 A1 * | 2/2004 | Li | G06F 12/0269 |
| 2008/0115082 A1 * | 5/2008 | Simmons | G06F 16/29 |
| | | | 707/999.003 |
| 2009/0043932 A1 * | 2/2009 | Bernardi | G11C 5/04 |
| | | | 710/110 |
| 2009/0248309 A1 * | 10/2009 | Neville | G01V 5/107 |
| | | | 250/269.4 |
| 2010/0029268 A1 | 2/2010 | Myer et al. | |
| 2010/0103918 A1 * | 4/2010 | Song | H04B 13/005 |
| | | | 370/343 |
| 2010/0194396 A1 * | 8/2010 | Bryant | G01V 3/04 |
| | | | 324/357 |
| 2012/0112753 A1 | 5/2012 | Wittle | |
| 2012/0223718 A1 | 9/2012 | Peppe et al. | |
| 2012/0243375 A1 * | 9/2012 | Melvin, II | G01S 15/876 |
| | | | 367/118 |
| 2013/0164725 A1 * | 6/2013 | Robbins | G09B 5/14 |
| | | | 434/350 |
| 2013/0198848 A1 * | 8/2013 | Wolff | G06F 21/568 |
| | | | 726/25 |
| 2014/0008968 A1 | 1/2014 | Money | |
| 2014/0254317 A1 | 9/2014 | Thompson et al. | |
| 2015/0050902 A1 | 2/2015 | Umeki et al. | |
| 2015/0167440 A1 | 6/2015 | Kasevich et al. | |
| 2015/0229511 A1 | 8/2015 | Le Pallec et al. | |
| 2015/0233242 A1 | 8/2015 | Li et al. | |
| 2016/0014598 A1 * | 1/2016 | Westhues | H04W 12/04 |
| | | | 380/259 |
| 2016/0131791 A1 * | 5/2016 | Wu | G01V 3/38 |
| | | | 702/7 |
| 2016/0170068 A1 * | 6/2016 | Donderici | G01V 3/28 |
| | | | 324/339 |
| 2016/0239025 A1 * | 8/2016 | van Der Merwe | F16K 31/082 |
| 2016/0282496 A1 * | 9/2016 | Yuan | G01V 3/02 |
| 2016/0334909 A1 * | 11/2016 | Zhang | G02F 1/13338 |
| 2016/0349405 A1 | 12/2016 | Martin et al. | |
| 2016/0370947 A1 * | 12/2016 | Chang | G06F 3/04166 |
| 2017/0108538 A1 * | 4/2017 | Wannenmacher | G01R 15/14 |
| 2017/0126390 A1 | 5/2017 | Akahane | |
| 2017/0153277 A1 | 6/2017 | Dragt et al. | |
| 2017/0315655 A1 | 11/2017 | Weinerth | |
| 2018/0267191 A1 | 9/2018 | Schmidt et al. | |
| 2018/0348038 A1 | 12/2018 | Kleman | |
| 2019/0001839 A1 | 1/2019 | Masuda | |
| 2019/0126290 A1 | 5/2019 | Takahashi et al. | |
| 2019/0130550 A1 * | 5/2019 | Mitsubayashi | G06T 5/50 |
| 2019/0148940 A1 | 5/2019 | Itaya | |
| 2019/0302149 A1 | 10/2019 | Kerr | |
| 2019/0391201 A1 * | 12/2019 | Chang | G01R 31/2834 |
| 2020/0001091 A1 | 1/2020 | Marnfeldt | |
| 2020/0015169 A1 * | 1/2020 | Maganti | H04W 52/0235 |
| 2020/0064941 A1 * | 2/2020 | Chang | G06F 3/044 |
| 2020/0064942 A1 * | 2/2020 | Chang | G06F 3/0383 |
| 2020/0069355 A1 | 3/2020 | Keidar | |

(56) References Cited

U.S. PATENT DOCUMENTS

| | | | |
|---|---|---|---|
| 2020/0110185 A1 | 4/2020 | Xu et al. | |
| 2020/0244265 A1* | 7/2020 | Paganini | H03K 19/00315 |
| 2020/0305004 A1* | 9/2020 | Ansley | H04L 12/2801 |
| 2020/0309641 A1 | 10/2020 | Balboni et al. | |
| 2020/0322726 A1* | 10/2020 | Wang | G08C 23/04 |
| 2020/0393395 A1 | 12/2020 | James et al. | |
| 2021/0044314 A1 | 2/2021 | Rodriguez et al. | |
| 2021/0088571 A1 | 3/2021 | Peng et al. | |
| 2021/0109250 A1* | 4/2021 | Sale | G01F 23/14 |
| 2021/0137408 A1 | 5/2021 | Ben-Haim et al. | |
| 2021/0208899 A1* | 7/2021 | Bornemann | G07C 5/08 |
| 2021/0231907 A1 | 7/2021 | Park | |
| 2021/0241971 A1 | 8/2021 | Bajai et al. | |
| 2022/0016415 A1* | 1/2022 | Arlotti | A61N 1/37282 |
| 2023/0014548 A1* | 1/2023 | Podvent | G16H 40/67 |

OTHER PUBLICATIONS

Liaw, Alfred L., et al. "Microseisms in geothermal exploration studies in Grass Valley, Nevada." Geophysics 44.6 (1979): 1097-1115.

Guffanti, Marianne, et al. "Volcano-monitoring instrumentation in the United States, 2008." US Geological Survey Open-File Report 1165 (2009).

Jordan, R., et al. "The Mars express MARSIS sounder instrument." Planetary and Space Science 57.14-15 (2009): 1975-1986.

Loke, M.H. "Electrical imaging surveys for environmental and engineering studies: A practical guide to 2-D and 3-D surveys." (1997).

Batayneh, Awni T. "2D Electrical Imaging of an LNAPL Contamination, Al Amiriyya Station, Jordan." Journal of Applied Sciences 5(1) : 52-59, 2005.

Cook, John C. "An Electrical Crevasse Detector" Geophysics, vol. 21, No. 4, 1956, p. 1055-70, 9 figs. Journal of Glaciology 3(22): 146-147.doi: 10.3189/S0022143000024485.

Schuster, C. L., et al. "Natural gas massive hydraulic fractureresearch and advanced technology project." Quarterly report: Febr. 1977-Apr. 1977 (1977) doi: 10.2172/7318329.

Athanasiou, E.N et al. "Non-destructive DC resistivity surveying using flat-base electrodes." Near Surface Geophysics 5. (2007): doi: 10.3997/1873-0604.2007008.

Kiflu, H. G. "Improved 2D and 3D resistivity surveys using buried electrodes and optimized arrays: The multi-electrode resistivity implant technique (MERIT)." Graduate Theses and Dissertations. University of South Florida. (2016).

* cited by examiner

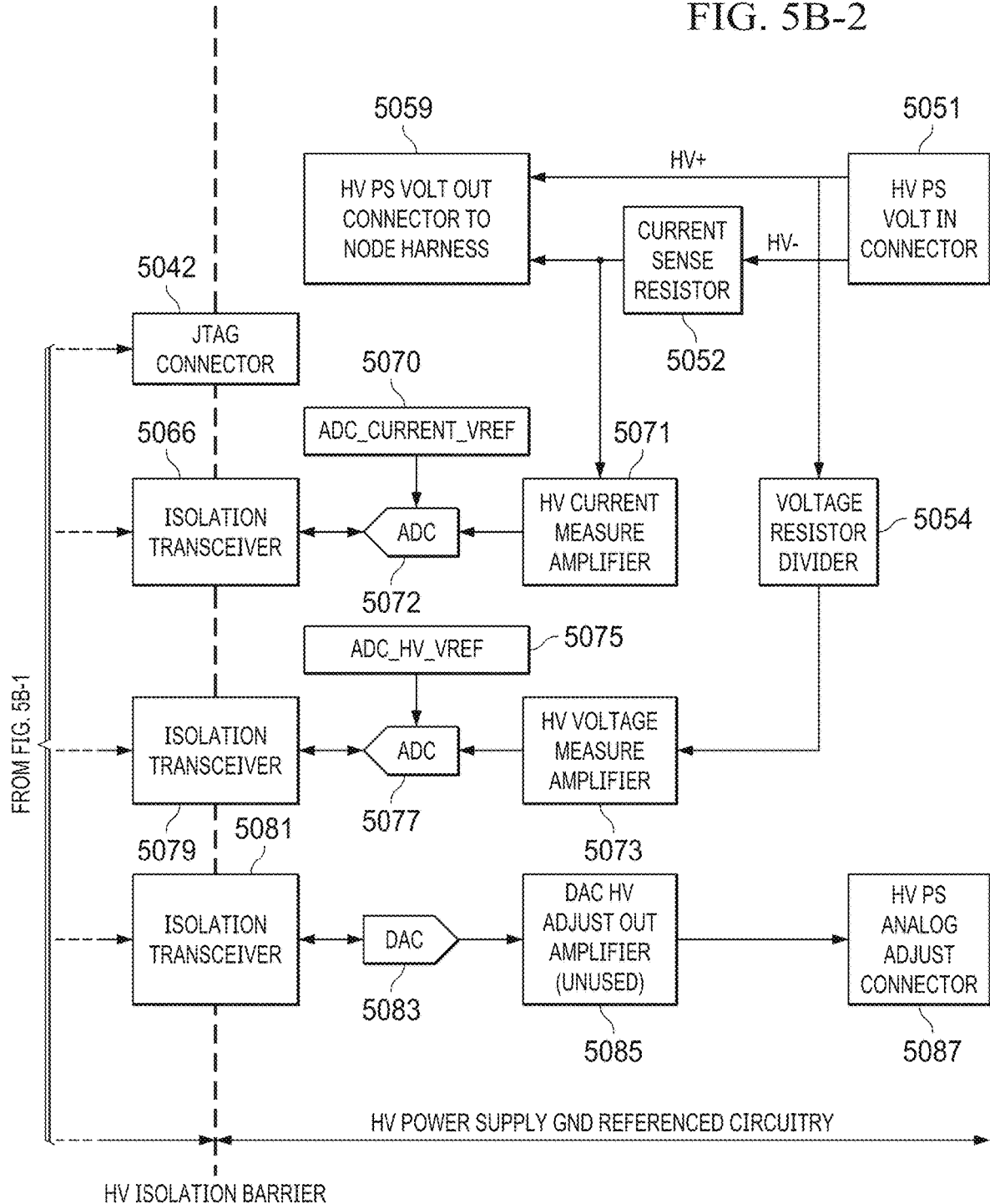

A dipole-dipole shot commences by sending messages sent down the communication
link, informing nodes what role to play -A, B, M, or N.
Each M-N pair is a channel. When the channels are chained together,
then the shot proceeds in "multi channel mode". A channel chain
looks like this:

Chan 1: M = 3, N = 4
Chan 2: M = 4, N = 5
etc.

Chains may go forward or backwards from the current injection
nodes, A and B. The chain length (number of channels) is only
limited by the total current draw of the array.

In pseudo-code, here's how a dipole survey works:

```
for (A=2, B=1; A < nodes-3; A++, B++) {   /* On PC */
    create_a_chain_of_M_N_pairs;    /* done by control board, based on msgs*/
                    /* received from PC */
    do_shot();    /* CB operates power supply and drives node state machines */
            /* with 1 bit pulses on RS-485 to processor GPIO */
    gather_data();    /* CB reads data from nodes, forwards to PC */
    end_of_data();    /* Tell PC shot is complete. */
}
```
The loop above may also be performed backwards, with A and B starting
at the end of the array.

In order to remove voltage offset from the resistivity data, and to
only do one shot per AB location, we do "4 phase sampling". There is
a positive and negative voltage phase. These phases are split in two
to allow both even and odd numbered channels to perform sampling
when the voltage is positive and negative.
The code that accomplishes this is shown below, in function do_shot().

```
/*
 * voltage: voltage limit
 * current: target current
 * multi:   do multi-channel shot. If this value is 0, shot will
 *      be single channel, which means that M and N nodes
 *      do not change identity during a shot.
 */
int16_t do_shot(uint16_t voltage, uint16_t current, uint16_t multi)
{
```

FROM FIG. 11F

```
/* Apply current/voltage settings in power supply */
   modbus_set_current(current);
   modbus_set_voltage(voltage);
   modbus_set_runstop(0);

/* SYNC 1 -- Send sync signal. A and B nodes will connect to +/-power */
   sync_signal();
   vTaskDelay(2);      /* wait 20 msec*/
   CURRENT_ON;         /* Turn on power supply */

/* Start task that monitors rising current level */
   gRamping= 1;
   xTaskNotifyGive(iTaskHandle);

/* Wait here till monitor task says current at target level */
   xSemaphoreTake(rampSem, portMAX_DELAY);
   gRamping= 0;

/* SYNC 2 --Tells N nodes to start sampling */
   sync_signal();

/* At the same time, read the source current and voltage */
   /* This is done by two independent tasks */
   xTaskNotifyGive(iTaskHandle);
   xTaskNotifyGive(sTaskHandle);

/* Wait here until sampling period expires */
   vTaskDelay(SAMPLING_TIMEA);

if (multi) {
       /* Sync 2.5: Send signal telling M and N nodes to swap roles */
       sync_signal();
       /* Wait for new N nodes to take sample */
       vTaskDelay(SAMPLING_TIMEB);
   }
```

FROM FIG. 11G

```
CURRENT_OFF;

vTaskDelay(2);   /* 20 msec*/

/* Sync 3: Tell nodes A and B to release the power lines */
    sync_signal();         /* release pins,   SYNC 3 */ vTaskDelay(50);        /* sleep for .5 sec */
    /* Sync 4: A and B swap roles, this will create a negative voltage source */
    /* M and N nodes return to their originally assigned roles */
    sync_signal();         /* A and B connect, SYNC 4 */
    vTaskDelay(50);        /* sleep for .5 sec */

CURRENT_ON;

/* Wait for current to ramp up again, for negative part of cycle */
    gRamping= 1;
    xTaskNotifyGive(iTaskHandle);
    xSemaphoreTake(rampSem, portMAX_DELAY);
    gRamping= 0;

/* Sync 5: Tell the N nodes to take samples */
    sync_signal();

/* At the same time, measure the source current and voltage */
    xTaskNotifyGive(iTaskHandle);
    xTaskNotifyGive(sTaskHandle);

vTaskDelay(SAMPLING_TIMEA); /* sleep for 1 sec */ if (multi) {
        /* Sync 5b: M nodes become N nodes, N nodes become M nodes */
        sync_signal();
        /* Wait while new N nodes take measurements */
        vTaskDelay(SAMPLING_TIMEB);
    }

/* Shot is done, turn off the current */
    CURRENT_OFF;
    vTaskDelay(20);

/* SYNC 6: Tell the A and B nodes to release power lines */
    sync_signal();
    vTaskDelay(50);

return (0);
}
```

FIG. 11H

ARCHITECTURE FOR A MULTICHANNEL GEOPHYSICAL DATA ACQUISITION SYSTEM AND METHOD OF USE

CROSS-REFERENCE TO RELATED APPLICATIONS

This application is a continuation of U.S. application Ser. No. 18/321,462 filed on May 22, 2023, which is a continuation of U.S. application Ser. No. 17/662,605 filed on May 9, 2022, now U.S. Pat. No. 11,671,277, granted on Jun. 6, 2023, which is a continuation of U.S. application Ser. No. 17/661,896 filed on May 3, 2022, now U.S. Pat. No. 11,658,844, granted on May 23, 2023, which is a continuation of U.S. application Ser. No. 17/658,407 filed on Apr. 7, 2022, which is a continuation-in-part of U.S. application Ser. No. 16/948,062 filed on Aug. 28, 2020, which is a continuation of U.S. application Ser. No. 16/948,061 filed on Aug. 28, 2020, now U.S. Pat. No. 11,329,843 granted on May 10, 2022 which is a continuation of U.S. application Ser. No. 16/948,059 filed on Aug. 28, 2020, now U.S. Pat. No. 11,323,285 granted on May 3, 2022. The patent applications identified above are incorporated herein by reference in its entirety to provide continuity of disclosure.

FIELD OF THE INVENTION

The field of the invention is electrical resistivity tomography (ERT) systems for locating subsurface anomalies, such as variations in density and the presence of groundwater. Raw resistivity data is collected by a reconfigurable network of sensors that distributes current into the ground and measures resulting voltages.

BACKGROUND OF THE INVENTION

ERT is a geophysical technique for imaging subsurface structures using electrical resistivity measurements made by electrodes impressed in the ground.

Resistivity can be computed if the intensity of a current injected into the ground, and the resulting potential difference established between measurement electrodes are known. Resistivity depends on the geometry of the electric field, the nature of the soil and the method used to measure the injected current and the resulting potential difference between the electrodes.

In practice, a system of electrodes is placed in the ground in a predetermined geometry. Current is then introduced into the ground through a pair of the electrodes. An electric field results and the current is measured. Voltage measurements are taken at various other pairs of electrodes in the system. Resistivity valves at various depths in the ground can then be determined from the measured current and the voltages.

A resistivity model is created using a least squares data inversion on the resistivity values that minimizes the error in the data. The resistivity model is then subjected to geostatistical analysis, using kriging or other methods to derive a resistivity map. The resistivity map includes equipotential lines indicating varying bands of resistivity at varying depths in the soil. The bands can be used to locate subsurface moisture and other anomalies.

Many topologies are known for electrode placement in an ERT survey. Among them are the Wenner, Wenner-Schlumberger Pole-dipole and dipole-dipole arrangements.

Referring to FIG. 1, a dipole-dipole topology 100 will be described. In the dipole-dipole topology, the spacing between the current injection probes 105 and the voltage measurement probes 107 is the same. The distance between current injection probes 105 and voltage measurement probes 107, is typically a whole number multiplier "n" of the distance "a".

Referring to FIG. 2, an example of a channel of test data in a dipole-dipole arrangement 200 will be described. Electrodes 202, 204, 206, 208, 210, 212, 214, 216, 218, 220 and 222 are inserted in ground 224 at an equidistant spacing "a" in a straight line. A known current is injected at current injection probes 230, the resulting differential voltage at electrode pairs 237, 239, 241, 243, 245, 247, 249 and 251, is measured to obtain the apparent resistivity of the subsurface can be determined at different depths forming a two-dimensional matrix of resistivity values. In this example, impressing a current injection probes 230 and taking a voltage reading at electrode pairs 237 results in a resistivity value for position 280 at depth 260 and horizontal distance 268. Similarly, a voltage reading at electrode pairs 239 results in a resistivity value for position 281 at depth 261 and distance 269. Likewise, a voltage reading at electrode pairs 241 results in a resistivity value for position 282 at depth 262 and distance 270. A voltage reading at electrode pairs 243 results in a resistivity value for position 283 at depth 263 and distance 271. A voltage reading at electrode pairs 245 results in a resistivity value for position 284 at depth 264 and distance 272. A voltage reading at electrode pairs 247 results in a resistivity value for position 285 at depth 265 and distance 273. A voltage reading at electrode pairs 249 results in a resistivity value for position 286 at depth 266 and distance 274. A voltage reading at electrode pairs 251 results in a resistivity value for position 287 at depth 267 and distance 275. As can be seen, the farther away the voltage electrodes are from the current injection electrodes, the deeper into the earth the resistivity values are taken. The string of resistivity values for this single placement of the current injection probes can be termed a "channel" of resistivity data.

In a dipole-dipole topography, resistivity can be calculated from the following equation:

$$P_A = \frac{V}{I}\pi A n(n+1)(n+2) \quad \text{Eq. 1}$$

Where:
n=the integer value representing the spacing distance from the current injection electrodes to the measurement electrodes
π=a constant
A=internode spacing
$P_A$=resistivity
V=voltage potential measured across neighboring measurement electrodes
I=current impressed at the injector electrodes.

Referring to FIG. 3, in order to complete an ERT survey, several (or many) diagonal channels of data are required. After each set of voltage measurements is taken, the current injection probes are typically advanced from left to right from position 302 to positions 304, 306, 308, 310, 312 and 314, in sequence. As additional voltage differential measurements are taken, separate channels of resistivity readings are derived and advanced in the same sequence from channel 320, channel 322, to channel 324, to channel 328, to channel 330 and to channel 332. The channels form linear diagonal lines at approximately 45° from an interstitial position between the current injection nodes. The result is a set of differential resistivity values associated with a set of subsurface points directly below the electrodes. The set of differential resistivity values is then subjected to curve smoothing routines which result in a set of continuous equipotential lines that can be interpreted to discover subsurface anomalies.

Many systems currently exist for employing ERT in the field. One very typical system is the Super Sting System available from Advanced Geosciences, Inc. of Austin, Texas. The Super Sting System provides a continuous cable with multiple cylindrical electrodes which may be configured as either transmitters or receivers. Each electrode typically contacts the ground with a single metal stake contact. One of the main drawbacks to this type of system, is that the cable segments must be connected with very careful attention to the order in which they are connected. This makes them time consuming to use. Further, the cable sections and nodes can potentially fail during use, resulting in unintelligible or useless data. Further, the data collection provided by these systems can be limited because of the relatively slow speed of the mechanical relays in each survey node and data contention on the single communication line.

Another known system is described in U.S. Pat. No. 8,019,547 to Bryant. The invention of the '547 patent employs reconfigurable nodes located at the stakes. The nodes may be set as either a current impression nodes or a voltage measurement nodes. Programming of the nodes is carried out by a single controller. One potential drawback to this type system is that the various controllers all share a common ground with the high voltage supply line. The common ground makes data acquisition and communication difficult due to noise created by the high voltage and current values necessary to impress current into the injection probes.

A similar known system is described in U.S. Pat. No. 8,380,439 to Lagmanson. This system likewise includes a series of nodes which are remotely reconfigurable. The nodes have individual unique addresses which are discovered by a single controller. The process used by the controller requires a communication with each node and so is relatively time consuming. Once discovered, the controller can set the probes to a current injection or a voltage measurement function. Data acquisition in this system is relatively slow due to the communication protocols used which can cause faulty data. Further, voltage measurement by the probes requires a physical disconnection from the power circuit which considerably lengthens the time necessary to achieve all the required voltage measurements.

U.S. Pat. No. 6,332,109 to Sheard similarly discloses a geological data acquisition system which includes a plurality of nodes for obtaining measurement signals. The nodes are connected on a 4-channel cable connection which necessarily limits the speed at which the data can be transmitted before and after excitation pulses are employed. The 4-channel system also suffers from inherent noise problems resulting in potentially unreliable data.

U.S. Pat. Nos. 5,357,202 and 5,537,045 to Henderson both disclose directly monitoring the soil subjacent to a fluid containment area by burying electrodes. Henderson '202 discloses a plurality of four-plate electrode systems. A voltage and a known current are applied across the outer pair of plates. The resulting potential difference is measured across the inner pair of plates. Henderson '045 also discloses a system of individual electrodes that, by impressing a current into the ground and varying the spacing of the potential measurement electrodes, can indirectly measure the resistivity at a calculated depth. One problem in using in the system(s) disclosed by Henderson is electrode galvanization. Electrode galvanization occurs when a consistent current of the same plurality is impressed into the ground over a long period of time. The result is a resistive barrier on the electrodes which causes erroneous readings and useless data.

U.S. Pat. No. 6,804,625 to Bryant, discloses a method and apparatus for creating an electrical resistivity map of the volume beneath a slab foundation by placing electrodes through a foundation, and applying a current through them. The invention employs an array of electrodes to impress a known current in the soil and measure the resulting electrical potential of the electrodes. Bryant '625 further discloses a method for converting the measured potential to a resistivity value, assigning the resistivity value to a spatial coordinate, and storing a plurality of values in computer files.

In all cases, the current state of the art is unsatisfactory because it does not adequately isolate the high voltage current signal from the measurement instruments creating incorrect readings and unreadable data. The systems of the prior art also suffer from slow data transfer and slow system configuration times. The prior art is also unsatisfactory because it fails to provide adequate temperature control for required instrumentation leading to further unreliable data. Moreover, the state of the art does not provide for adequate memory management or communication speed. The current state of the art is also unsatisfactory because it fails to account for electrode galvanization.

SUMMARY OF THE INVENTION

The preferred embodiment provides a system for impressing current into the ground and gathering resistivity data from a set of nodes that operate independently of one another but in synchronization to carry out an ERT survey. A preferred embodiment also provides for individual and autonomous operating systems running on each processor in each node. Separate communication channels are provided for upstream and downstream data transfer, high voltage transfer and synchronization signals. A novel set of high voltage isolation barriers is also provided in both the master control board and each node in the array. High voltage isolation is also provided by a triple-ground reference circuit topology. A preferred embodiment also provides for a rapid means of isolated data transfer by employing a novel form of direct memory access between the processors of the nodes and the master control board. Near instantaneous and error free packet transfer is achieved, greatly increasing the speed and accuracy of the ERT survey.

The preferred embodiment provides an alternating waveform of the injected current during the sequence of geophysical test in order to maximize the precision of data readings. The preferred embodiment also provides measurement node type assignments that are interleaved to compress survey time.

The preferred embodiment also provides for a novel method of self-calibration of the nodes to quickly and exactly calibrate the precision measurement devices required for voltage measurements.

The preferred system further comprises a novel set of nodes that have are identical and un-serialized at system start up, but then are independently self-addressed by each node to maximize system flexibility to reduce maintenance time.

The preferred system also provides a set of survey programming that does away with node programming tables in favor of faster looped survey algorithms.

The preferred system further provides a novel cabling system which isolates the high voltage supply channel from a synchronization channel, an independent measurement channel and a memory bus channel for quiet and error free command and measurement data packet transmission.

In the event of damage to a sensor or damage to an interconnecting cable, a replacement sensor or cable may be added to the array of sensors without excessive downtime and expensive field repairs because all of the nodes are identical and are un-serialized. Further, provisions are made for single channel testing which eliminates the necessity for repeating an electrode survey after a node malfunction.

A preferred embodiment system further comprises a novel enclosure cooling system, including strategically placed ducting and insulation, which maintains proper and consistent controller temperature in elevated temperature ambient environments, which greatly enhances the precision of the current and voltage measurements.

A preferred embodiment of the system further comprises a novel node enclosure which includes a failsafe four bar linkage toggle to each ground stake which enhances physically stability of the nodes during the testing and increases the reliability of electrical connectivity to the stake, thereby reducing measurement error and decreasing both setup and survey times.

A preferred embodiment further provides for a novel automatic polarity reversal during the survey routine which substantially reduces or eliminates electrode galvanization.

BRIEF DESCRIPTION OF THE DRAWINGS

In the detailed description of the preferred embodiments presented below, reference is made to the accompanying drawings.

FIG. 5A-1-5A-2 is a schematic diagram of a preferred embodiment of a master control board.

FIG. 5B-1-5B-2 is a schematic diagram of a preferred embodiment of a master control board.

FIG. 6A-1-6A-3 is a schematic diagram of a preferred embodiment of a measurement node.

FIG. 6B-1-6B-4 is a schematic diagram of a preferred embodiment of a measurement node.

FIGS. 11F, 11G and 11H is an example of a software routine for survey looping.

DETAILED DESCRIPTION OF THE INVENTION

In the description that follows, like parts are marked throughout the specification and figures with the same numerals, respectively. The figures are not necessarily drawn to scale and may be shown in exaggerated or generalized form in the interest of clarity and conciseness.

Figure 1:
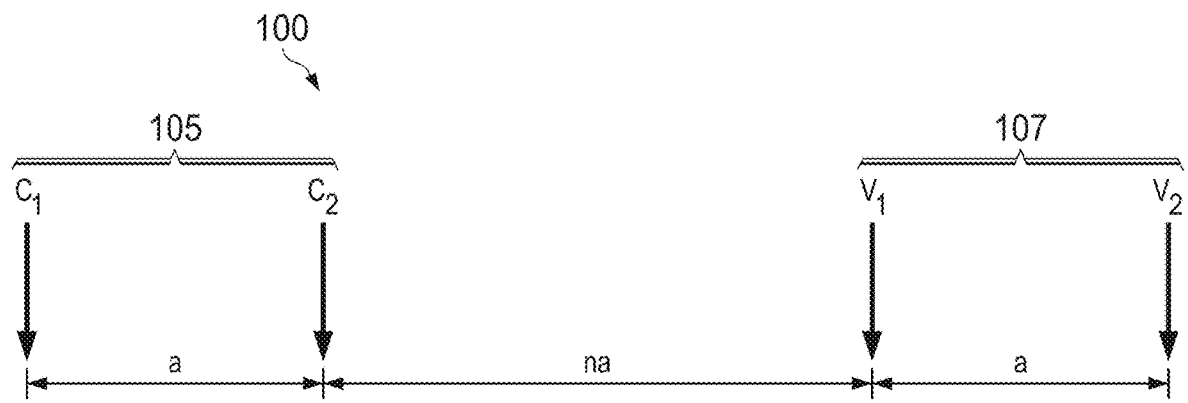
FIG. 1 is a schematic diagram of a dipole-dipole arrangement topology.
Figure 3:
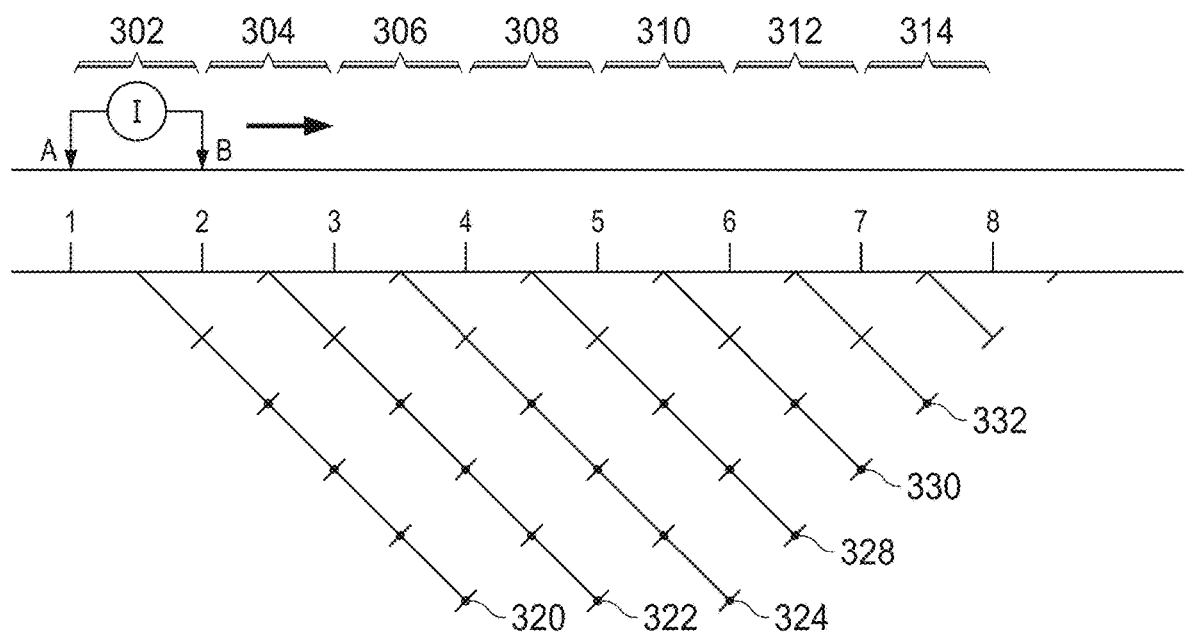
FIG. 3 is a schematic diagram of a set current injection probes traversing a dipole-dipole topology.
Figure 2:
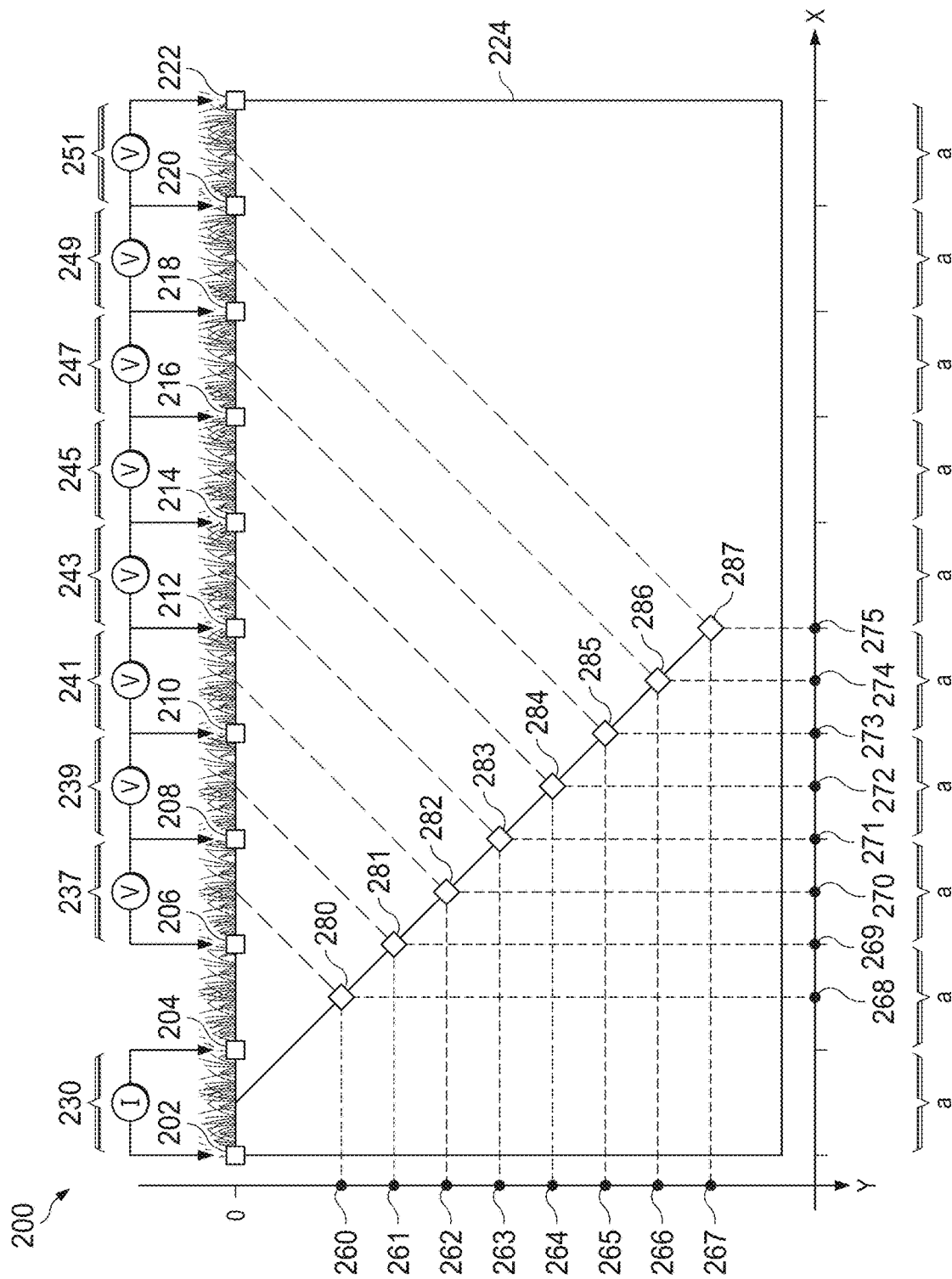
FIG. 2 is a schematic diagram of a typical dipole-dipole test data channel.
Figure 4A:
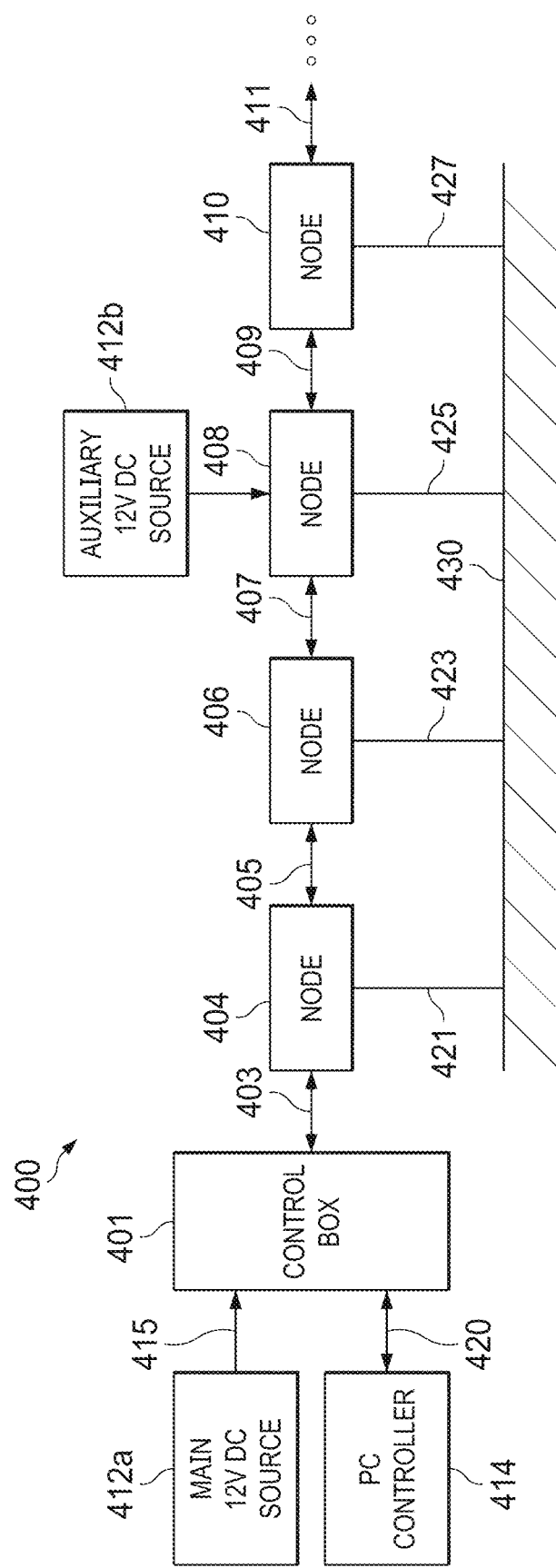
FIG. 4A is a schematic diagram of a preferred embodiment of the system.

Referring to FIG. 4A, a schematic diagram of a preferred embodiment will be described. System 400 includes control box 401 connected to an upstream set of nodes 404, 406, 408 and 410. The system may have any number of nodes as indicated by the ellipses in the drawing. Node 404 is connected to control box 401 and node 406. Node 406 is connected downstream to node 408 and upstream to node 404. Node 408 is connected downstream to node 410 and upstream to node 406. Node 408 is also operatively connected to auxiliary 12V DC source 412b. Auxiliary 12V DC source 412b is provided to extend the maximum number of nodes in the array to approximately 50. However, though use of an auxiliary 12V DC source at approximately every 25 nodes, the number of nodes in the array can be extended to approximately 100, given a node spacing of about 4 meters. Extending the maximum number of nodes is important because it vastly extends the distance over which a survey may be conducted over the prior art. Node 410 is in the terminal position in this example system and is only connected downstream to node 408. Each of nodes 404, 406, 408 and 410 is mechanically and electrically connected to a metallic stake 421, 423, 425 and 427, respectively, that is driven into ground 430.

The control box and the nodes are connected to each other via separate system communication cables 403, 405, 407, 409 and 411, as will be further described. Control box 401 is connected to PC controller 414 via standard USB cable 420. Control box 401 is also connected to main 12V DC power source 412a via dual 50 Amp connector cable 415.

PC controller 414 is typically a laptop computer operating a Windows® operating system and a control application used for coordinating system functions and displaying graphical resistivity maps.

Figure 4B:
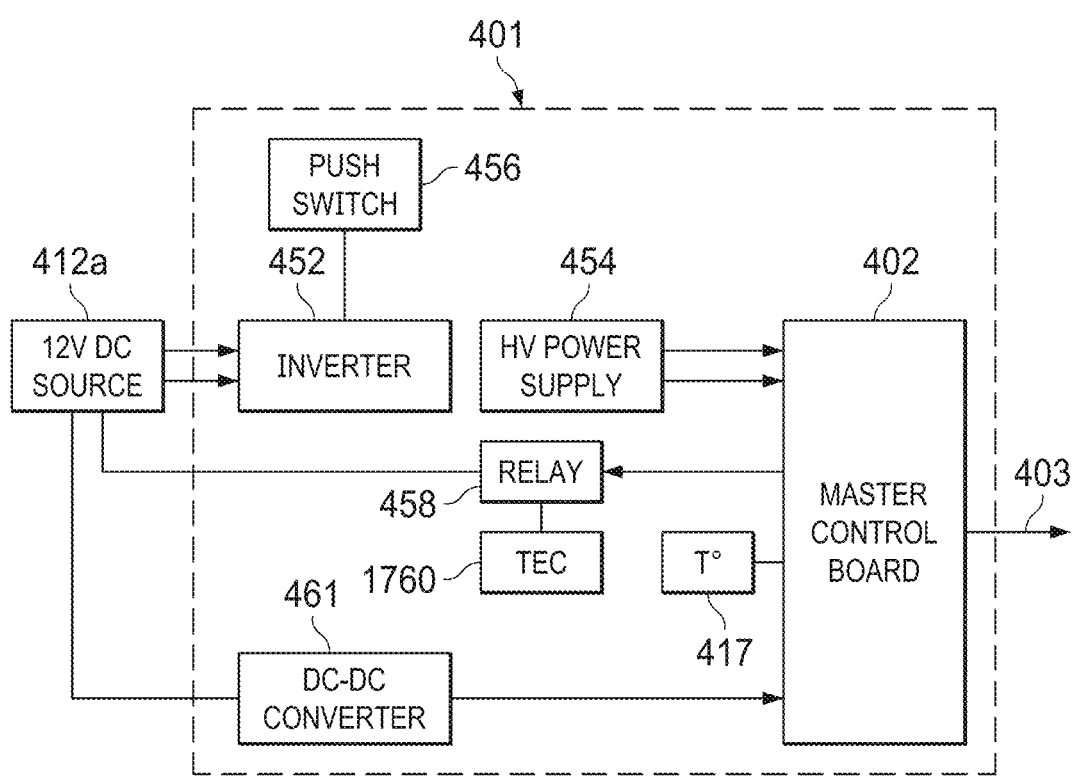
FIG. 4B is a schematic diagram of a control box of a preferred embodiment.

Referring to FIG. 4B, a schematic architecture diagram of control box 401 will be described.

Control box 401 includes inverter 452, high voltage power supply 454, master control board 402, and regulated 12V DC power source 412a.

12V DC power source 412a supplies 12V DC power to power master control board 402 through a separate isolated DC-DC converter 461, eliminating any electrical connection to the high voltage circuitry return. DC-DC converter 461 is the Cincon Electronics CQB150 W-24S28. 12V DC power source 412a in a preferred embodiment is a 12V DC battery. In a preferred embodiment, the battery is an automotive lead acid battery capable of storing 800 cold cranking Amps. In other embodiments, 12V DC power source 412a can also be provided by a solid-state power supply.

Inverter 452 is connected to 12V DC power source 412a and is activated by push switch 456. Inverter 452 preferably has an input voltage of 12V, an output voltage of 220V and an output frequency of 50 Hz. The output of the inverter is a pure sine wave with an actual power of 1500 W and a peak power of 0 W. Inverter 452 is preferably Part No. CJ-3000Q available from Banggood.com of Hong Kong.

Inverter 452 supplies power to the high voltage power supply. Relay 458 is controlled by master control board 402. High voltage power supply 454 is further connected to master control board 402 to supply high voltage to the nodes of the system. High voltage power supply 454 in a preferred embodiment is a precision programmable DC power supply with a temperature drift of less than 50 ppm, 0.1% accuracy and resolution of 10 mV and 1 μA with an adjustable voltage range from 0 to 1000V and an adjustable current range from 0 to 1 A. Equivalent command interface is possible for a 0 to 500V supply with current adjustable from 0 to 2 A. Output power is preferably 100 W. Low ripple is a preferred attribute of the high voltage power supply including a voltage ripple of less than 5 mV RMS and a current ripple of less than 3 mV and a read back value temperature coefficient of 50 ppm. In a preferred embodiment, high voltage power supply 454 is Part No. HSPY-600, available from aliexpress.com.

Activation of the high voltage power supply is accomplished by pressing the power button on inverter 452 which generates the AC voltage required for the power supply. Control signals are sent from master control board 402 to high voltage power supply 454 using an RS232 interface.

12V DC power source 412a is further connected to thermoelectric cooler 1760 through actuating relay 458. Master control board 402 controls the thermoelectric cooler based on temperature data from thermostat 417. In a preferred embodiment, thermoelectric cooler 1760 is the TEC Air Cooler available from TE Technologies, Inc. of Traverse City, Michigan. Preferably, thermoelectric cooler 1760 operates at a supply voltage of 12V DC, Model No. AC-027 requiring approximately 27 W operating power at a 0° temperature difference, available from TE Technologies, Inc.

Figure 4C:
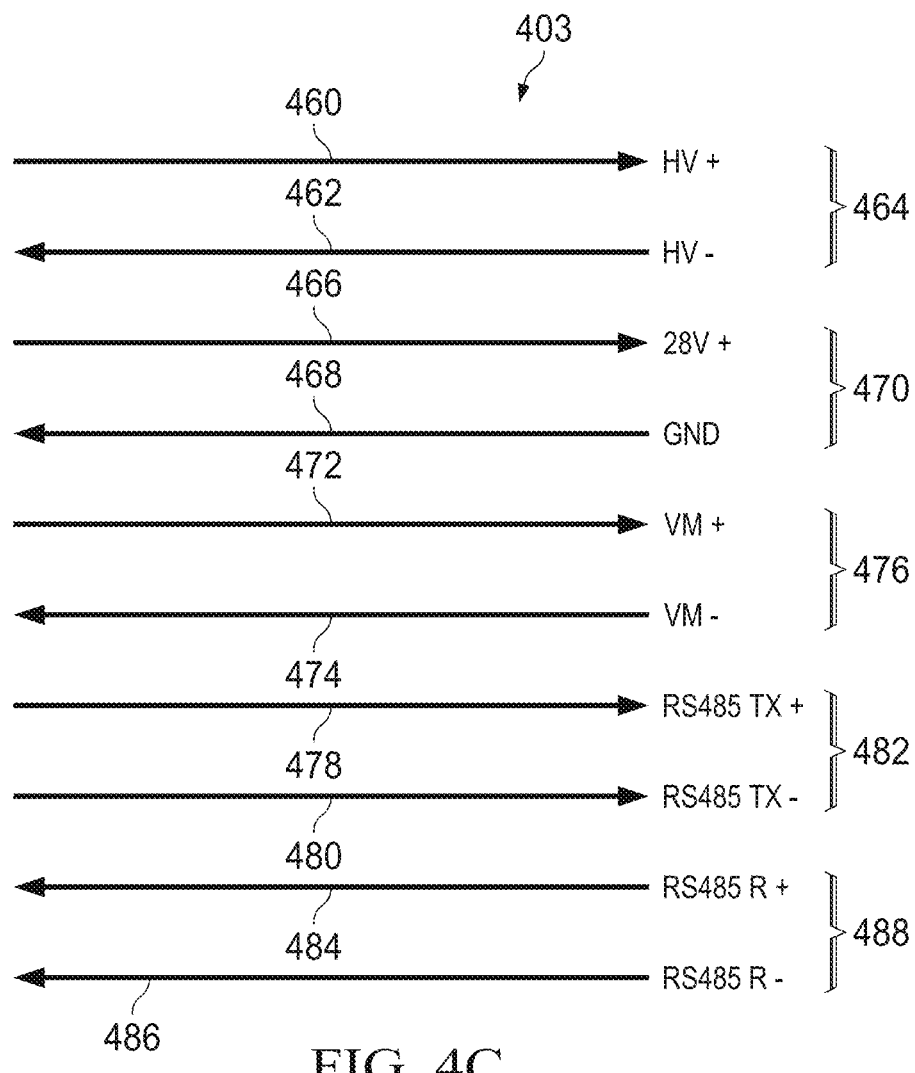
FIG. 4C is a schematic diagram of a data cable of a preferred embodiment.

Referring to FIG. 4C, an example of system communication cable 403 will be further described.

Line 460 includes the high voltage positive signal. Line 462 includes the high voltage negative signal. Together lines 460 and 462 comprise a high power bus 464. High power bus 464 delivers a high voltage high current signal for injection by the nodes.

Line 466 comprises a positive 28V DC power signal. Line 468 comprises a ground for the positive 28V DC power signal. Together lines 466 and 468 comprise supply power bus 470. Supply power bus 470 is used to provide operational current for each of the nodes and, in one embodiment, also for synchronization signaling, as will be further described.

Line 472 comprises the positive voltage measurement line. Line 474 comprises the negative voltage measurement line. Together lines 472 and 474 comprise isolated voltage measurement bus 476. Lines 472 and 474 form a twisted pair. All voltage measurements taken at the various nodes are communicated on the isolated voltage measurement bus. The twisted pair configuration is important because it reduces noise and increases the isolation of the communications channels.

Line 478 comprises the positive RS485 transmit line. Line 480 comprises the negative RS485 transmit line. Together lines 478 and 480 comprise upstream communication bus 482. Lines 478 and 480 form a twisted pair. All upstream communications between the master control board and the nodes takes place on the respective point to point upstream communications bus.

Line 484 comprises the positive RS485 receive line. Line 486 comprises the negative RS485 receive line. Together lines 484 and 486 comprise respective point to point downstream communication bus 488. Lines 484 and 486 form a twisted pair. All downstream communications between the nodes and the master control board take place on the downstream communication bus.

The nodes are connected through a "daisy chain" configuration using the isolated RS485 upstream and downstream communication busses. The RS485 implementation is full duplex. In a preferred embodiment, the communications feed runs at 1 MBd. The band rate is an important improvement over the prior art because it substantially shortens the time required for system communications and greatly reduces errors in the data packets sent and received.

Figure 4D:
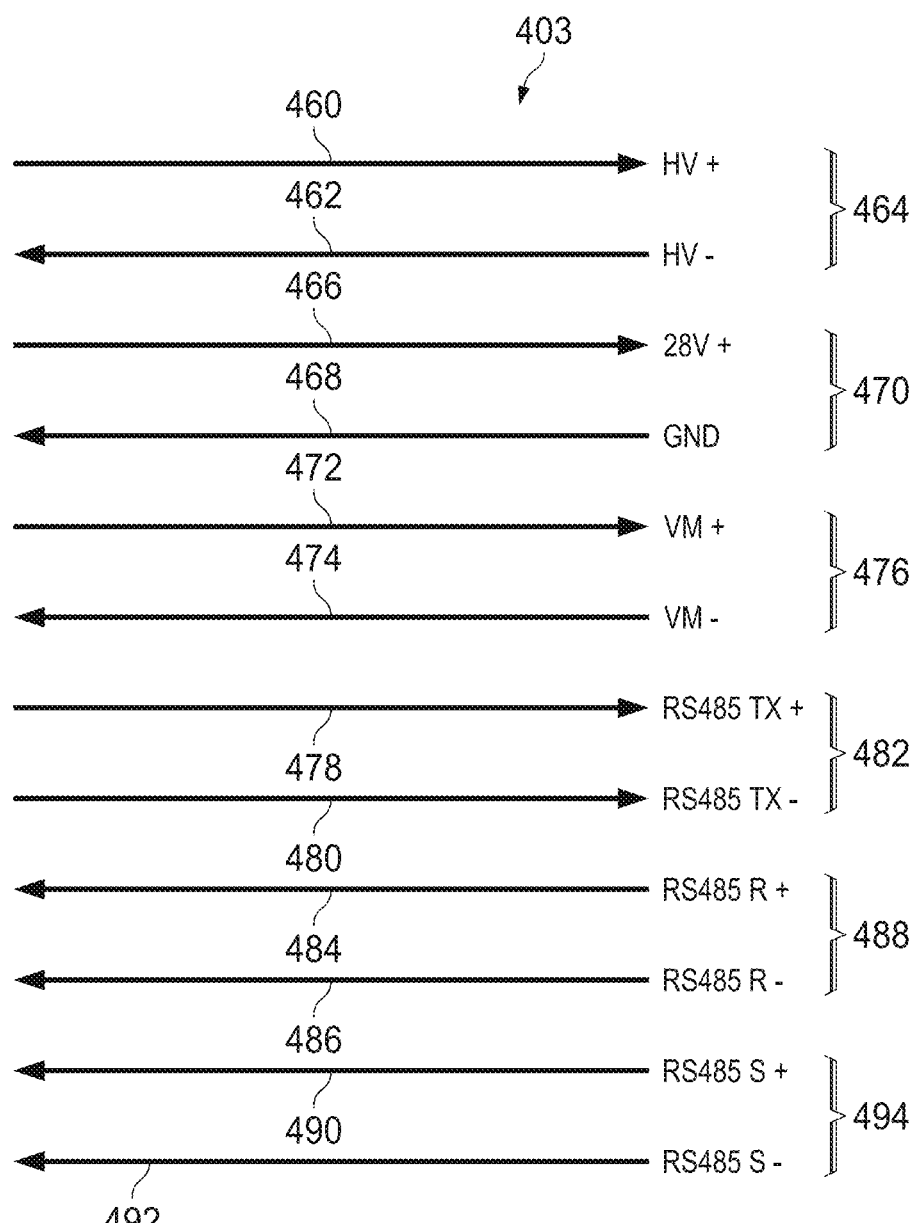
FIG. 4D is a schematic diagram of a data cable of a preferred embodiment.

Referring to FIG. 4D, an alternate embodiment of system communication cable 403 will be described. Line 490 comprises the sync positive signal. Line 492 comprises the sync negative signal. Together lines 490 and 492 comprise synchronization bus (or sync line) 494. In one embodiment, the sync line is used for sending node configurations and measurement timing commands across the entire array.

Figures 1, 5A:
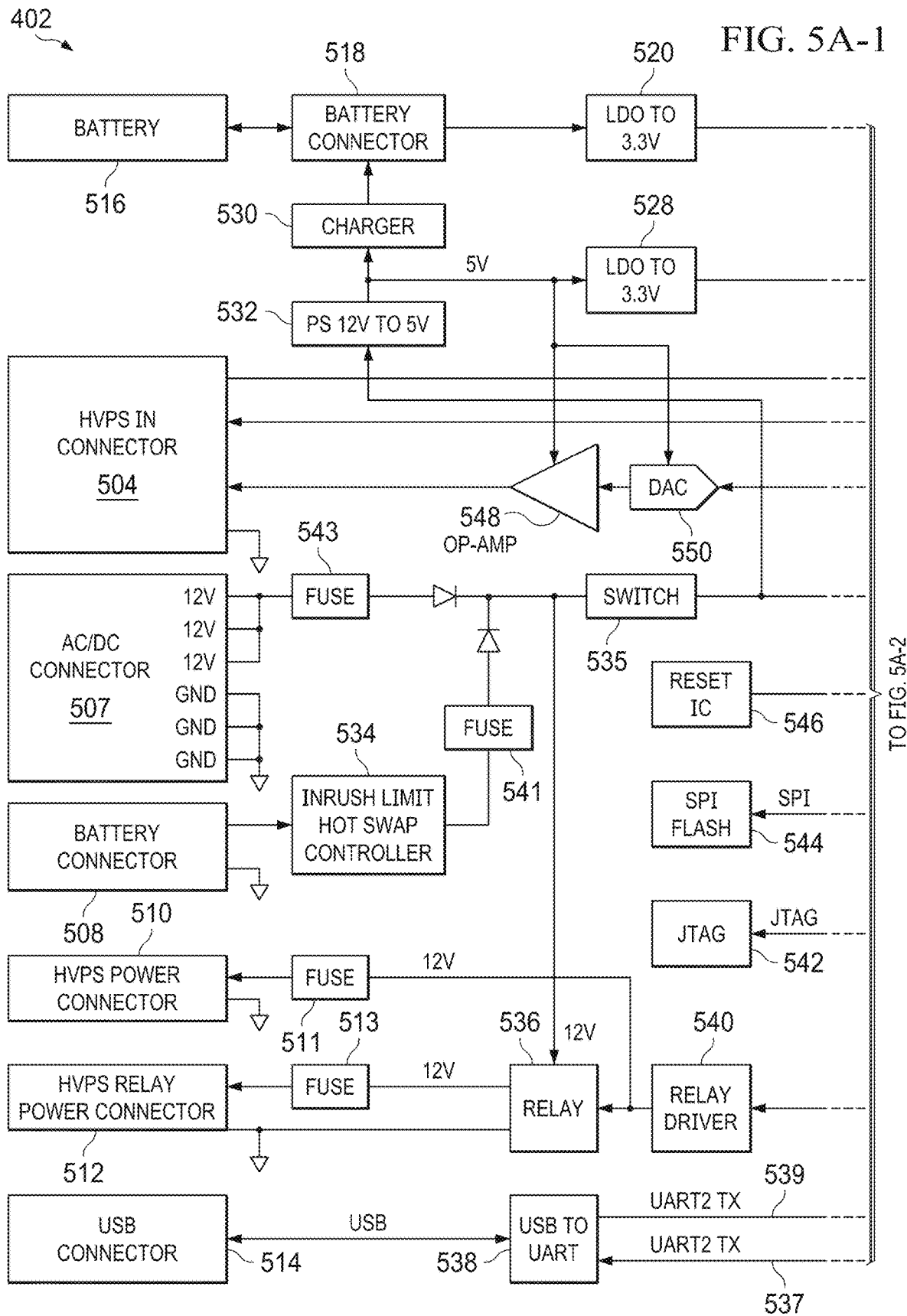
Figures 2, 5A:
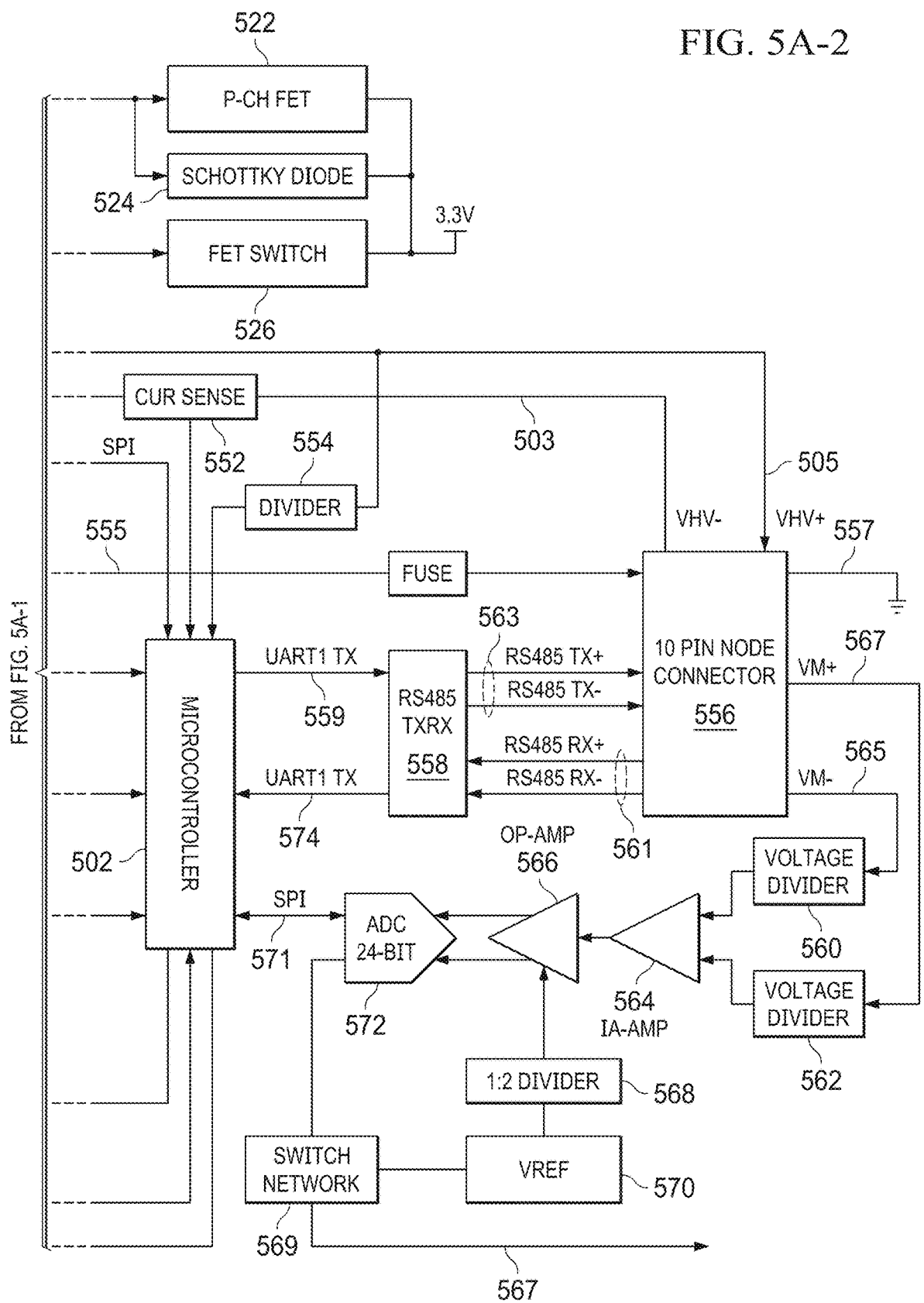

Referring to FIG. 5A, a schematic diagram of master control board 402 will be described.

The functions of master control board 402 are provided by microcontroller 502. Microcontroller 502 in a preferred embodiment is a RISC CPU microprocessor including 16 bit registers and a dedicated DMA controller. In a preferred embodiment, the microcontroller is Part No. MSP43OF149 available from Texas Instruments of Dallas, Texas.

The microcontroller operates on a Free RTOS operating system for embedded devices. The operating system provides for multiple threads and tasks. Thread priorities are used to control a direct memory access functions of the system. Data is passed using direct memory access to local memory on the master control board and each node microcontroller. In each case, the local CPU of the microprocessor initiates data transfer and then conducts other operations until it receives an interrupt from the local DMA controller when the transfer operation is complete. In this way, much less CPU overhead is used for data transfer because each processor can transfer data from its local memory without occupying processor time thus allowing computation and data transfer to proceed in parallel. Moreover, since the data rate for DMA is extremely fast compared to the sync pulse transmitters, the transfer of measurement and system communication packets can be considered to be nearly instantaneous.

Internode communication is packetized serial over UART/RS-485. UARTs are capable of high data rates (e.g. 1 Megabaud), provided that the processor is sufficiently quick to handle transmit and receive interrupts. The master control board sets up a DMA channel between the UART and memory. As data characters arrive in the UART receive register, the DMA controller transfers them to system memory sequentially. When a predetermined number of characters has been received, the DMA controller then interrupts the microcontroller, which stores the characters in memory. The microcontroller then reinitializes the DMA channel to receive the next data packet.

Serial transmission of data can be accomplished by the same mechanism. A DMA channel is prepared by the microcontroller, it puts data at a predetermined memory location, and the DMA controller moves the data from memory to the transmit register of the UART. Data is transferred upstream through the array of nodes to the master control board by chaining the DMAs together. When a packet arrives from a downstream facing port, the node CPU is interrupted by the DMA controller. The CPU then starts a DMA channel for the upstream port, to transfer the data from memory to the UART, and so on to the next node.

UART alone cannot be used to transmit the data to the next node. Therefore, at the board edge, there is a UART to RS485 bridge, which transmits the UART data as RS485, along the twisted pair to the next bridge chip, which does the inverse process, namely, it transforms RS485 signals to UART signals, which are then received by the UART module and DMA controller of the processor, as will be further described.

Microcontroller 502 supports a UART connection through lines 537 and 539. Lines 537 and 539 are connected to USB to UART interface 538. The USB to UART interface is provided to allow asynchronous data transfer between the microcontroller and PC controller 414 through USB connector 514. Data transfer rates can range from 300Bd to 3 MBd. Microcontroller 502 also supports Jtag interface 542 for debugging.

Microcontroller 502 is further connected to relay driver 540. Relay driver 540 is used to activate the high voltage power supply. Relay driver 540 is further connected to high voltage power connector 510 through fuse 511. Relay driver 540 is further connected to relay 536. Relay 536 is a general purpose single pole double throw 12V activated relay. Relay 536 is further connected to high voltage power supply relay power connector 512 through fuse 513.

Microcontroller 502 is further connected to SPI flash supervisor 544. The flash supervisor provides microcontroller initialization and timing supervision. In a preferred embodiment, SPI flash supervisor includes boot instructions and initial programming for the microcontroller. In a preferred embodiment, the SPI flash supervisor is the TPS 3838 chip available from Texas Instruments of Dallas, Texas. Microcontroller 502 is further connected to reset IC 546. In a preferred embodiment, the reset IC is provided in the TPS 3838 chip.

Microcontroller 502 is further connected to RS485 transceiver 558 through UART upstream connection 559 and UART downstream connection 574. RS485 transceiver 558 provides full duplex RS485 communications support to the upstream nodes. RS485 transceiver 558 provides downstream channel 561 and upstream channel 563. Both channels are connected to the upstream nodes through ten pin node connector 556. In a preferred embodiment, the transceiver combines a differential driver and differential receiver which operate from a single power supply. In a preferred embodiment, the transceiver supports a wide common mode voltage range making it suitable for connection to multiple ports over long cable runs. In a preferred embodiment, RS485 transceiver 558 is the SN65HVD1792 transceiver chip available from Texas Instruments of Dallas, Texas. Both transceivers are terminated by appropriate resistor networks (not shown) as the master control board is the upstream termination point for both RS485 communication channels.

Microcontroller 502 is further connected to 24 bit analog to digital converter ("ADC") 572 through line 571. ADC 572 accepts external differential reference voltage of 1.25V from voltage reference 570. In a preferred embodiment, the voltage reference is Part No. LTC2415 available from Analog Devices, Inc. of Norwood, Massachusetts.

ADC 572 is further connected to op amp 566. Op amp 566 is preferably a low power, differential input output amplifier driver with an adjustable gain. In a preferred embodiment, the gain is fixed at a gain of 2. Op amp 566 provides a 3.5 ppm/° C. gain temperature coefficient and 5 ppm gain long term stability. Op amp 566 is a preferably Part No. LTC1992 available from Analog Devices.

Op amp 566 is further connected to voltage divider 568. Voltage divider 568 provides a 1:2 voltage divider resistor network connected between voltage reference 570 and op amp 566.

Voltage reference 570 is further connected to switch network 569. Switch network 569 is designed to alternately connect voltage reference 570 either to ADC 572 or positive voltage measurement line 567 for self calibration, as will be further described.

Op amp 566 is further connected to instrumentation amplifier (IA) 564. IA 564 is preferably a precision instrumentation amplifier with an extremely low gain error of 0.08% maximum and 10 ppm maximum non-linearity. IA 564 is further connected to voltage divider 560 and voltage divider 562.

Both voltage divider 560 and voltage divider 562 are preferably a six lead voltage divider resister network array of 10K, 9.99MΩ±0.1% 31 mw±30 ppm/° C. 15-SIP. The voltage divider networks are provided to condition to signal from the voltage measurement bus for the instrumentation amplifier.

Voltage divider 560 is further connected to negative voltage measurement line 565 which communicates with the upstream nodes through ten pin node connector 556. Voltage divider 562 is further connected to positive voltage measurement line 567 and communicates with the upstream nodes through ten pin node connector 556.

Microcontroller 502 is further connected to voltage divider 554. Voltage divider 554 is provided to condition the signal from positive high voltage supply line 505 before connecting to microcontroller 502 for monitoring.

High voltage input connector 504 is connected to voltage divider 554 and also to positive high voltage supply line 505. Positive high voltage supply line 505 communicates to the upstream nodes through ten pin node connector 556. High voltage input connector 504 is further connected to current sense amplifier 552. Current sense amplifier 552 is further connected to negative high voltage supply line 503 which communicates with the upstream nodes through ten pin node connector 556. Current sense amplifier 552 is also connected to microcontroller 502. Importantly, all current measurements for the system are taken through the current sense amplifier by microcontroller 502. In a preferred embodiment, the current sense amplifier is Part No. INA194 available from Texas Instruments.

Microcontroller 502 is further connected to analog to digital converter ("DAC") 550. In a preferred embodiment, DAC 550 is Part No. AD5620 available from Mouser Electronics of Mansfield, Texas. DAC 550 is further connected to op amp 548. Op amp 548 is a precision operational amplifier with a large maximum dynamic range and high signal to noise ratio adapted for operation at low voltages. Op amp 548 is further connected to high voltage input connector 504. DAC 550 and op amp 548 allow the microprocessor to program the high voltage power supply as required.

12V DC power is supplied to the circuit either through AC/DC connector 507 or battery connector 508. Battery connector 508 is connected to hot swap controller 534. Hot swap controller 534 provides inrush current control to limit system voltage droop and transients when the battery is activated or replaced. In a preferred embodiment, the hot swap controller is Part No. LM5069 available from Texas Instruments of Dallas, Texas.

Hot swap controller 534 is further connected to switch 535 through fuse 541. Switch 535 is likewise connected to AC/DC connector 507 through fuse 543 and controls power to the master control board and the nodes. The 12V supply is further connected to the upstream nodes through ten pin node connector 556. The 12V supply is further supplied to step down switching regulator 532. In a preferred embodiment, the step down switching regulator is Part No. LT3481 from Analog Devices. The regulator supplies 5V DC to charger 530 and to low drop out regulator 528. Low drop out regulator 528 provides clean 3.3V DC to the circuit through FET switch 526. In a preferred embodiment, low drop out regulator 528 is Part No. ADM7171ACPZ-3.3-R7 available from Analog Devices.

Charger 530 is further connected to battery 516 through battery connector 518. Charger 530 is preferably a single input, single cell lithium ion battery charger, Part No. BQ24040 available from Texas Instruments. Battery 516 is preferably the 400 mAmp hour lithium ion battery companion Part No. PRT-13851 available from SparkFun Electronics of Boulder, Colorado.

Charger 530 is further connected to low drop out regulator 520 through battery connector 518. Low drop out regulator 520 is further connected to P-channel transistor 522 and Schottky diode 524. The output of the P-channel transistor and Schottky diode are provided to stabilize power to the system when switching from charging mode to battery power mode, as will be further described.

Positive 28V DC supply line 555 is further connected to ten pin node connector 556 for communication with upstream nodes. Similarly, ground line 557 is connected to ten pin node connector 556 for communication to further downstream nodes.

Figures 1, 5B:
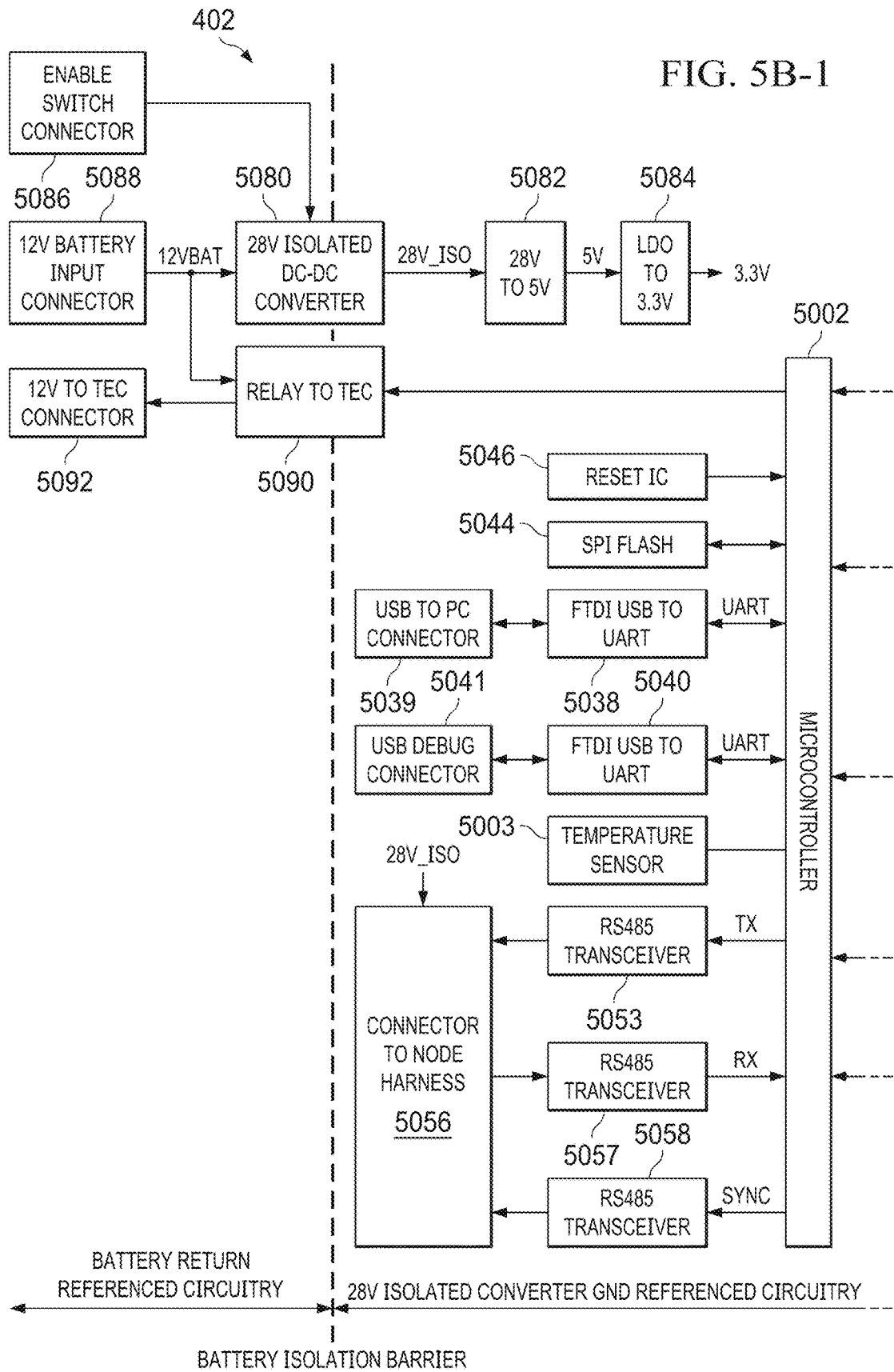

Referring to FIG. 5B, a schematic diagram of an alternate embodiment of master control board 402 will be described.

The functions of master control board 402 are preferably provided by microcontroller 5002.

Microcontroller 5002 in a preferred embodiment, includes a 16 bit risc architecture running a 16 megahertz. In a preferred embodiment, the microcontroller is Part. No. MSP430FR5994IPNR, available from Texas Instruments of Dallas, Texas.

Microcontroller 5002 supports UART connection to USB to UART interface 5038 to PC controller 414 through connector 5039. Microcontroller 5002 further supports debugging through USB to UART interface 5040 through connection to PC controller 414 through connector 5041. Microcontroller 5002 further supports JTAG connector 5042 for debugging.

Microcontroller 5002 is further connected to SPI flash supervisor 5044. In a preferred embodied, the SPI flash supervisor is Part No. WT5Q80DVSSIG available from Winbond of Taichung City, Taiwan. The SPI supervisor functions as previously described.

Microcontroller 5002 is further provided with reset supervisor 5046, which controls reset functions of the microprocessor.

Microcontroller 5002 is further operatively connected to RS485 transceivers 5053, 5057 and 5058. RS485 transceiver 5053 is responsible for coordinating transmission of data signals to upstream nodes. RS485 transceiver 5057 is responsible for receiving communications from upstream nodes. RS485 transceiver 5058 is responsible for transmitting synchronization signal to downstream nodes. Each of RS485 transceivers 5053, 5057 and 5058 are operatively connected to connecter 5056 for connection to upstream nodes.

Microcontroller 5002 is further operatively connected to temperature sensor 5003. Temperature sensor 5003 is used to obtain a reference temperature for operation of thermoelectric cooler 1760, as will be further described.

Current sense resistor 5052 is operatively connected to high voltage power supply connector 5051 and high voltage power supply connector 5059. High voltage power supply connector 5051 is connected to the high voltage input from the control box. High voltage power supply connector 5059 is connected to other upstream nodes.

Current sense resistor 5052 is operatively connected to high voltage current measurement amplifier 5071. In a preferred embodiment, the high voltage current measurement amplifier is Part No. AD8606 available from Analog Devices. Preferably, the high voltage current measurement amplifier is a precision amplifier is a high speed, low noise circuit, single supply amplifier. High voltage current measurement amplifier 5071 is operatively connected to ADC converter 5072, which incorporates current reference 5070, as previously described.

ADC converter 5072 is further connected to isolation transceiver 5066. Isolation transceiver 5066 is a general purpose digital isolator Part No. ADUM1401BRWZ available from Digikey. The isolator is provided to electrically isolate the microprocessor from the high common mode voltage of the high voltage signal from the current sense resistor, thereby avoiding ground current circulation and injection of noise into the measurement.

Isolation transceiver 5066 is operatively connected to microcontroller 5002 in order to transmit measurements from the current sense resistor.

Voltage resistor divider 5054 is operatively connected to the positive high voltage supply line. Voltage resistor divider 5054 is further connected to high voltage measurement amplifier 5073, which monitor the high voltage signal. High voltage measurement amplifier 5073 is operatively connected to ADC 5077, as previously described. ADC 5077 draws its voltage reference from reference chip 5075. Reference chip 5075 is preferably Part No. LT6657 available from Linear Technology, which provides a precision voltage reference with low drift and predictable temperature behavior. ADC 5077 is operatively connected to isolation transceiver 5079. Isolation transceiver 5079 is operatively connected to microcontroller 5002 and transmits a digital signal related to the high voltage value.

High voltage power supply analog adjust connector 5087 is operatively connected to high voltage power supply 454 for minor corrections to the high voltage output. In order to condition the analog signal, microcontroller 5002 communicates a digital signal to DAC 5083 through isolation transceiver 5081. DAC 5083, in a preferred embodiment, is Part No. 56GSA/S, which is an 8 bit analog to digital converter with low power consumption. The digital analog converter communicates with the high voltage power supply through output amplifier 5085.

Isolation transceiver 5066, isolation transceiver 5079, and isolation transceiver 5081, together, form a high voltage isolation barrier between the master control board 28V isolated converter ground referenced circuitry and the high voltage power supply ground referenced circuitry. The isolation barrier insulates the microcontroller and associated circuits from any potential undesired transient signals through a common ground or other electrical connection to the high voltage power supply.

Microcontroller 5002 receives 28V power from isolated DC-DC converter 5080. The DC-DC converter is operatively connected to step down resistor 5082 and low dropout regulator 5084. The DC-DC converter is activated by enable switch 5086. The DC-DC converter is directly connected to 12V battery 5088.

Microcontroller 5002 is further operatively connected to TEC relay 5090. TEC relay 5090 is further connected to thermoelectric cooler 1760 through connector 5092.

Isolated DC-DC converter 5080 and TEC relay 5090 form a battery isolation barrier between the battery return ground referenced circuitry and the 28V isolated converter ground referenced circuitry. The isolation barrier insulates the microcontroller and associated circuits from any potential undesired transient signals communicated through a common ground or other electrical connection to the 12V battery.

Connecter 5056 further supplies 28V power to upstream nodes from the DC-DC converter.

Figure 6A:
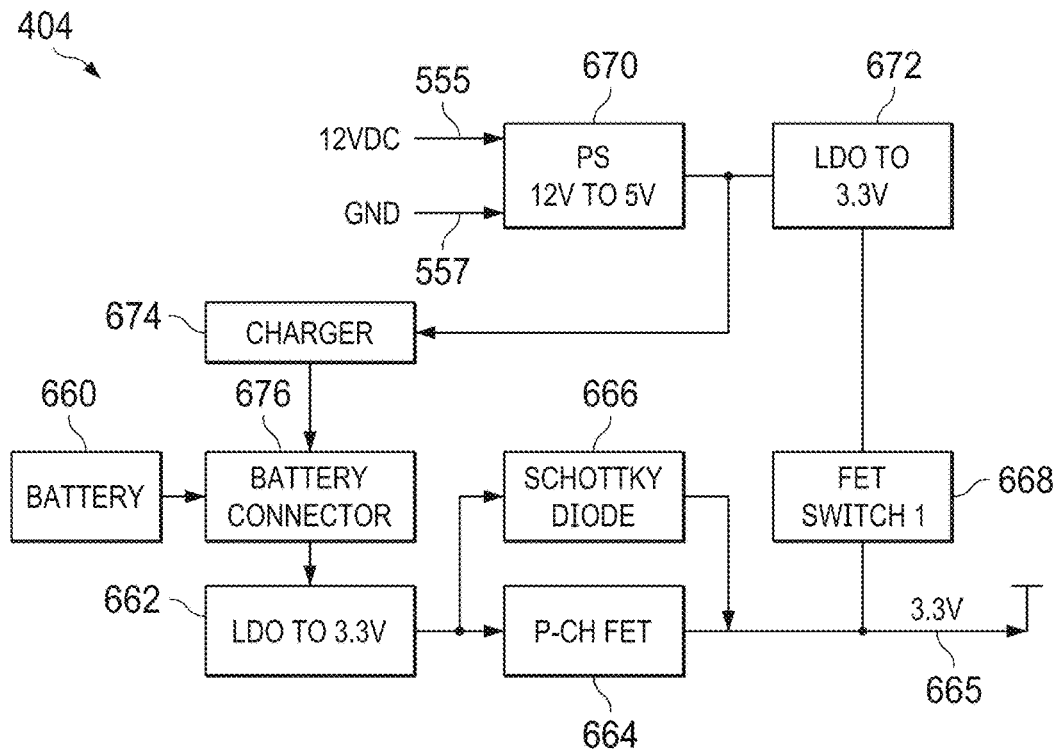
Figure 1:
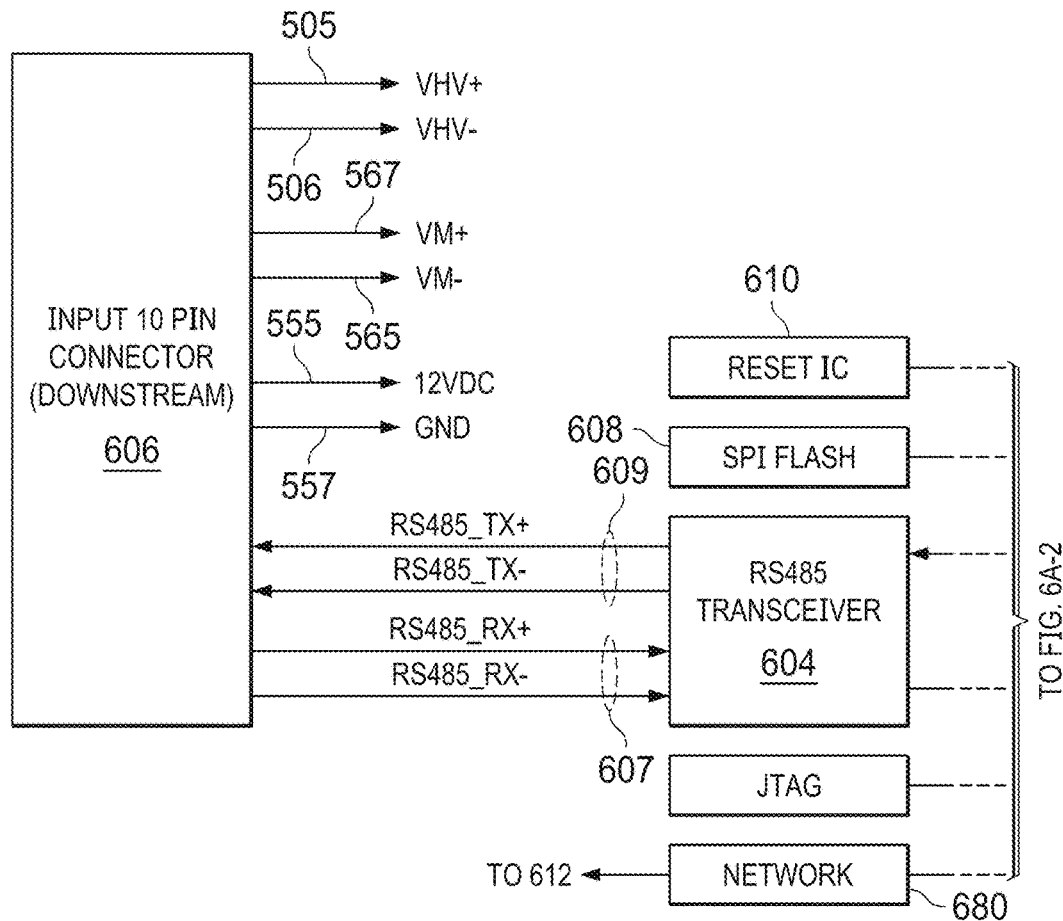
Figures 2, 6A:
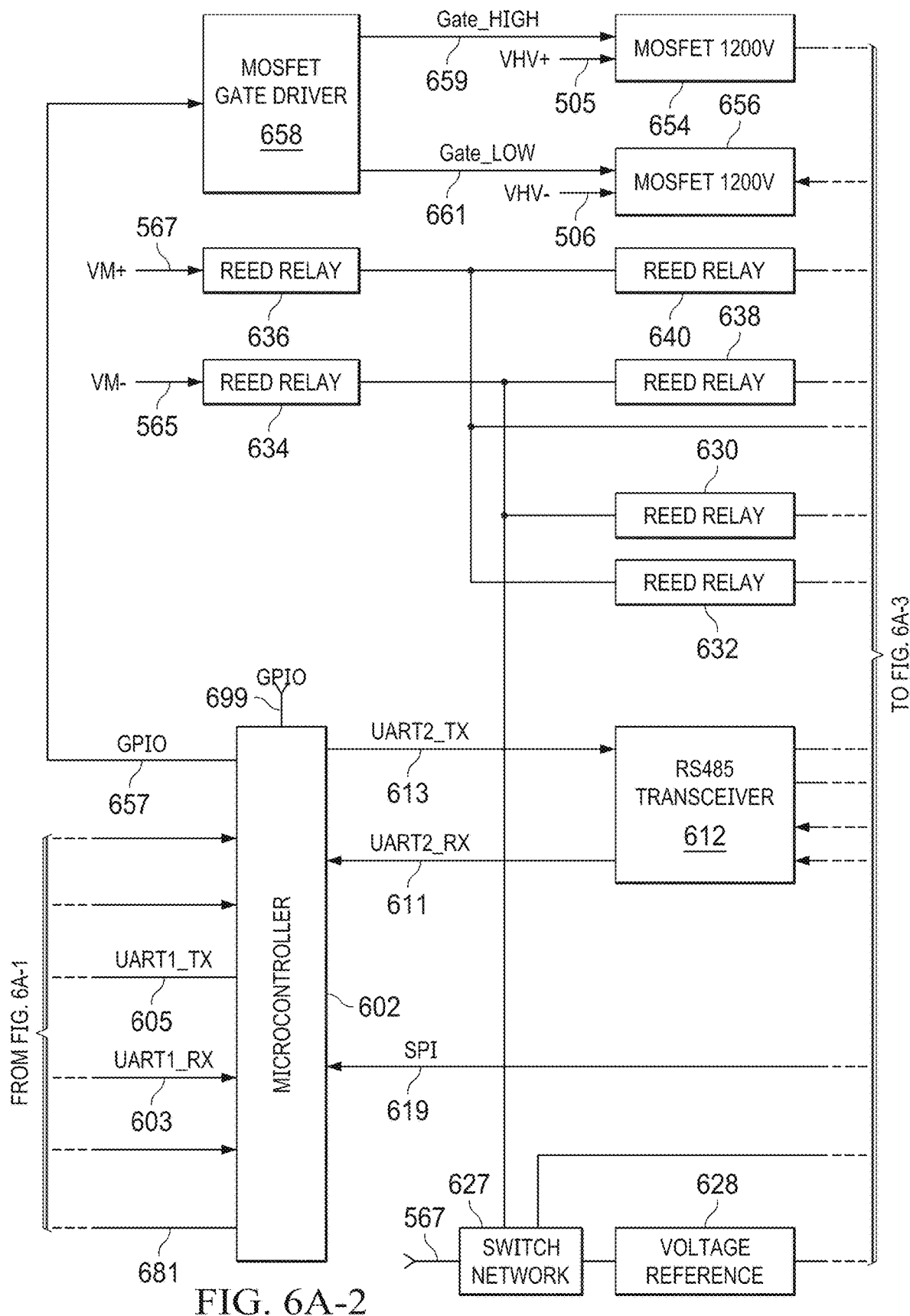
Figures 3, 6A:
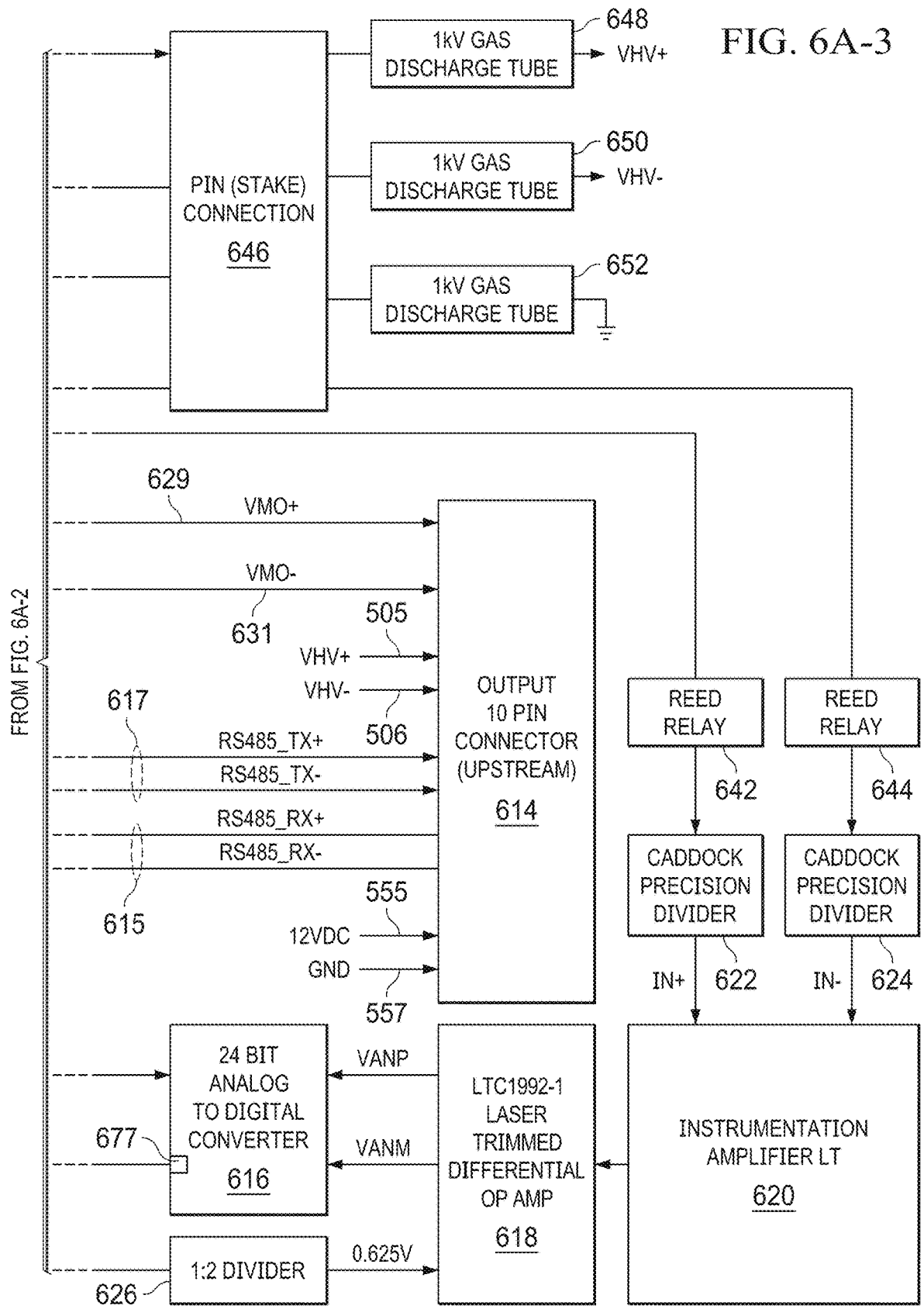

Referring to FIG. 6A, an example of node 404 will be further described.

Node 404 includes microcontroller 602. In a preferred embodiment, microcontroller, 602 is Part No. MSP430F149 available from Texas Instruments. Microcontroller 602 is provided with transmit UART port 605 and receive UART port 603. UART port 605 and UART port 603 are further connected to RS485 transceiver 604. RS485 transceiver 604 is a three state differential line driver and differential input line receiver operating at 3.3V. Preferably the transceiver is Part No. SN658HVD30 available from Texas Instruments. RS485 transceiver 604 has separate input and output pins for full duplex bus communication at distances of up to 1,500 meters. RS485 transceiver 604 is further connected to downstream receive line 607 and upstream transmit line 609. Receive line 607 and transmit line 609 are connected to input ten pin connector 606 for communication with further upstream nodes or the downstream master control board.

Microcontroller 602 is provided with the same RTOS as microcontroller 502 and operates with the same direct memory access format.

Microcontroller 602 is further connected to SPI flash 608. SPI flash 608 provides circuit initialization, initial programming, and timing supervision for the microprocessor. In a preferred embodiment, the SPI flash supervisor is the TPS 3838 chip available from Texas Instruments of Dallas, Texas. Microcontroller 602 is further connected to reset IC 610. In a preferred embodiment, the reset IC is provided in the TPS 3838 chip.

Microcontroller 602 is further connected to RS485 transceiver 612. RS485 transceiver 612 is connected to the microcontroller via receiver UART line 611 and transmit UART line 613. RS485 transceiver 612 is further connected to RS485 receive lines 615 and RS485 transmit lines 617. Transmit lines 617 and receive lines 615 are connected to upstream nodes through output ten pin connector 614. RS485 transceiver 612 is an identical part in a preferred embodiment to RS485 transceiver 604.

Microcontroller 602 provides serial peripheral interface 619. Serial peripheral interface 619 is connected to 24 bit analog to digital converter ("ADC") 616. ADC 616 is preferably Part No. LTC2415-1 available from Analog Devices.

ADC 616 is further connected to switch network 627. Switch network 627 is further connected to reed relay 630, positive voltage measurement line 567 and voltage reference 628. The switch network is designed to alternatively connect voltage reference 628 to either ADC 616 or reed relay 630. Likewise, switch network 627 is designed to alternatively connect positive voltage measurement line 567 to voltage reference pin 677 of ADC 616 or reed relay 630, as will be further described. Voltage reference 628 typically provides a controlled 1.25V. In a preferred embodiment, voltage reference 628 is Part No. LT6657 available from Analog Devices.

Voltage reference 628 is further connected to 1:2 voltage divider 626. Voltage divider 626 supplies approximately 0.625V to differential op amp 618. Differential op amp 618 is connected to ADC 616. Signals to differential op amp 618 are provided by instrumentation amplifier 620. In a preferred embodiment, the instrumentation amplifier is Part No. LT1157 available from Analog Devices.

Input to the instrumentation amplifier is provided by divider network 622 and divider network 624. Each of divider networks 622 and 624 is a power per element voltage divider resister network 100K, 9.9 Mohm±1% 31 MW, ±30 ppm/° C. 15-SIP, 6 lead resistor network. Preferably, Part No. HVD5-B10M-050-05-ND available from Digi-Key Corporation of Thief River Falls, Minnesota.

Microcontroller 602 further provides general purpose input output port 657. Port 657 is connected to MOSFET gate driver 658. MOSFET gate driver 658 controls the application of the high voltage signal. MOSFET gate driver 658 is preferably is a high power, high speed driver with independent high and low side reference output channels, including a floating channel. MOSFET gate driver 658 includes gate high line 659 and gate low line 661. Gate high line 659 is connected to MOSFET 654. Gate low line 661 is connected to MOSFET 656. In a preferred embodiment, MOSFET gate driver 658 is Part No. IR2011(S)PBF available from Infineon Technologies of Neubiberg, Germany.

Positive high voltage supply line 505 and negative high voltage supply line 506 are supplied through input ten pin connector from the closet downstream node. Likewise, positive high voltage supply line 505 and negative high voltage supply line 506 flow through to the upstream nodes through output ten pin connector 614. Positive high voltage supply line 505 is connected to MOSFET 654. Negative high voltage supply line 506 is connected to MOSFET 656. Both MOSFETs 654 and 656 are high speed switching low capacitance MOSFETs, preferably Part No. C2M0080120D available from Mouser Electronics. Each of MOSFETs 654 and 656 are connected to and controlled by general purpose input output port 657 of microcontroller 602.

MOSFET 654 is further connected to stake connection 646. Likewise, MOSFET 656 is connected to stake connection 646. Stake connection 646 is a rigid mechanical linkage to a durable metal rod, as will be further described.

Positive voltage measurement line 567 and negative voltage measurement line 565 are provided to the node through input ten pin connector 606 from the nearest downstream node. Positive voltage measurement line 567 is connected to reed relay 636. Negative voltage measurement line 565 is further connected to reed relay 634. Reed relay 636 is connected to reed relay 640, reed relay 642 and reed relay 632. Reed relay 634 is further connected to reed relay 638, reed relay 630 and switch network 627. Reed relay 644 is connected between stake connection 646. Reed relay 630 provides positive voltage measurement output 629 to the next upstream node via output ten pin connector 614. Likewise, reed relay 632 provides negative voltage measurement output 631 to the next upstream node via output ten pin connector 614.

In a preferred embodiment, each of reed relays 630, 632, 634, 636, 638, 640, 642 and 644 is a high voltage relay Part No. KT12-1A-40L-SMD available from Digi-Key. Each of reed relays 630, 632, 634, 636, 638, 640, 642, and 644 are connected to general purpose input output port 699 of microcontroller 602. The microcontroller opens or closes the relays to configure the node to various node configuration types, as will be further described.

Reed relay 642 is connected to divider network 622. Reed relay 644 is also connected to divider network 624. Divider network 622 and divider network 624 provide the input voltage to instrumentation amplifier 620.

28V DC supply line 555 and ground line 557 are provided to the node through input ten pin connector 606 from a downstream node. 28V DC supply line 555 and ground line 557 flow through to the upstream nodes through output ten pin connector 614. 28V DC supply line 555 and ground line 557 are connected to step down switching regulator 670. Switching regulator 670 is preferably Part No. LT3481 available from Analog Devices. Switching regulator 670 provides a 5V signal to low drop out regulator 672. Regulator 672 is preferably Part No. ADM7171ACP-3.3-R7 available from Digi-Key. Regulator 672 provides an output voltage of 3.3V to field effect transistor 668. Field effect transistor 668 operates as a switch to supply line 665, which supplies operating voltage to the microcontroller and the remaining components of the node.

Switching regulator 670 further provides 5V operating voltage to charger 674. Charger 674 is connected to battery 660 through battery connector 676. Low drop out regulator 662 is also connected to battery 660 and charger 674 through battery connector 676. Battery charger 674 is preferably Part No. BQ24040. Battery 660 is preferably Part No. PRT1-113851. Regulator 662 is preferably Part No. ADM7171ACP-3.3-R7.

Regulator 662 is further connected to P-channel field effect transistor 664 and Schottky diode 666. Schottky diode 666 and P-channel field effect transistor 664 are connected to 3.3V supply line 665 and are provided to smooth transitions between circuit operation between 28V DC supply line 555 and battery 660.

Lightning protection is provided through gas discharge tube 648 for positive high voltage connection, gas discharge tube 650 for negative high voltage connection and gas discharge tube 652 for the ground connection.

Microcontroller 602 is further connected to programmable transceiver termination resistors network 680 through GPIO port 681. Termination resistors network 680 is operatively connected to transceiver 612. Termination resistor network 680 is provided to selectively terminate the communication channel in the case where the node is the last upstream measurement node in the system, as will be further described.

Figures 1, 6B:
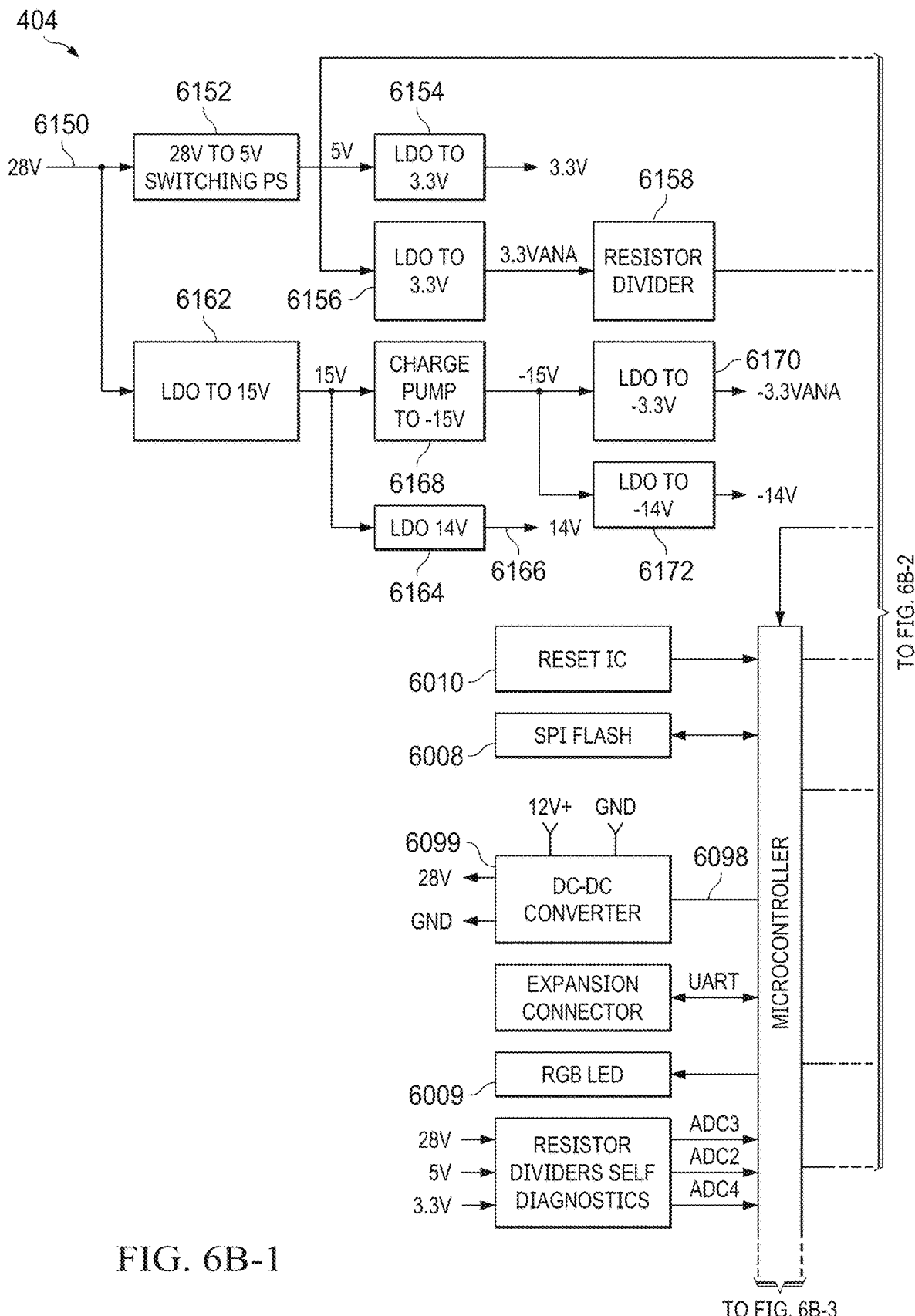
Figures 2, 6B:
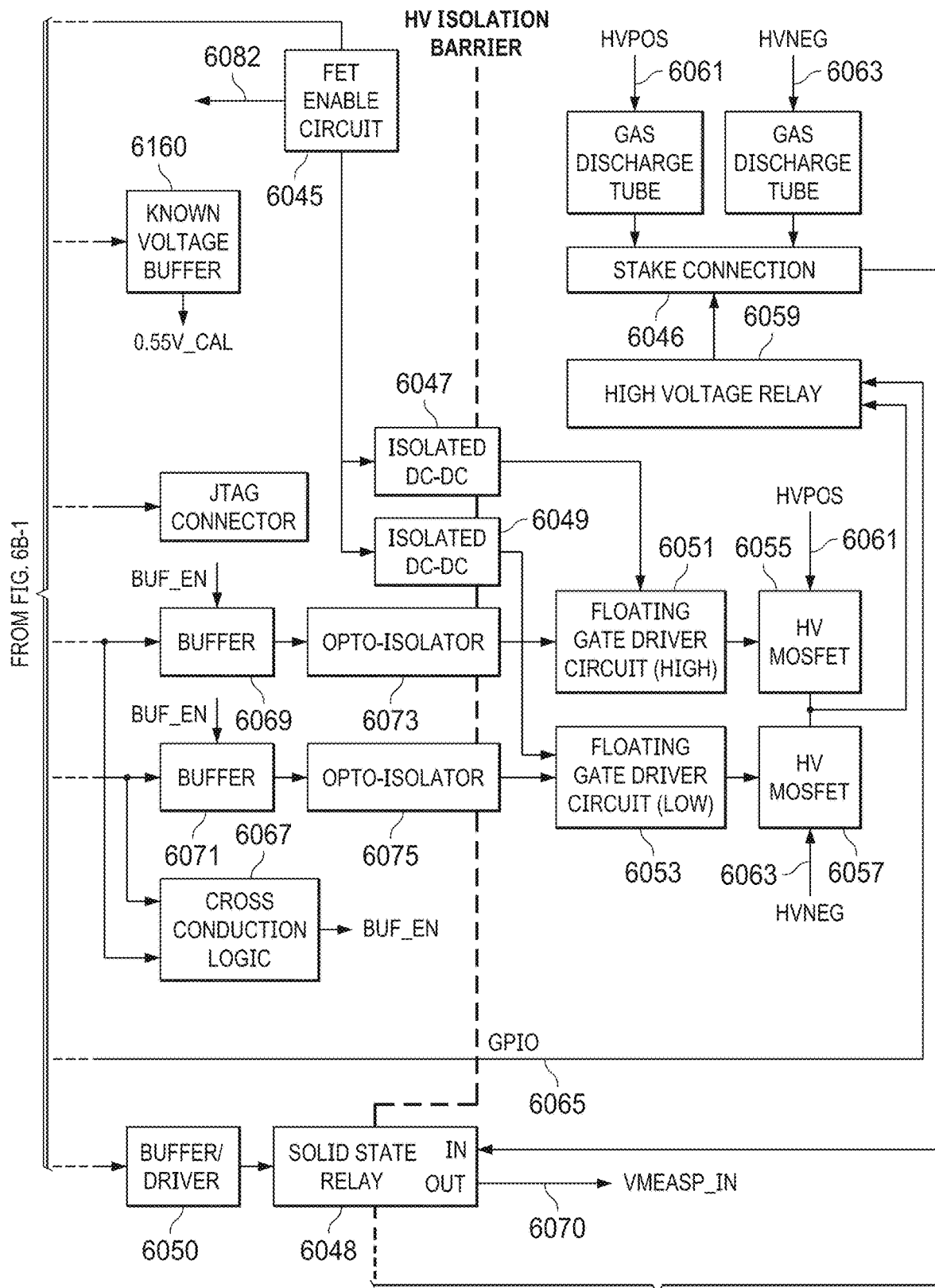
Figures 3, 6B:
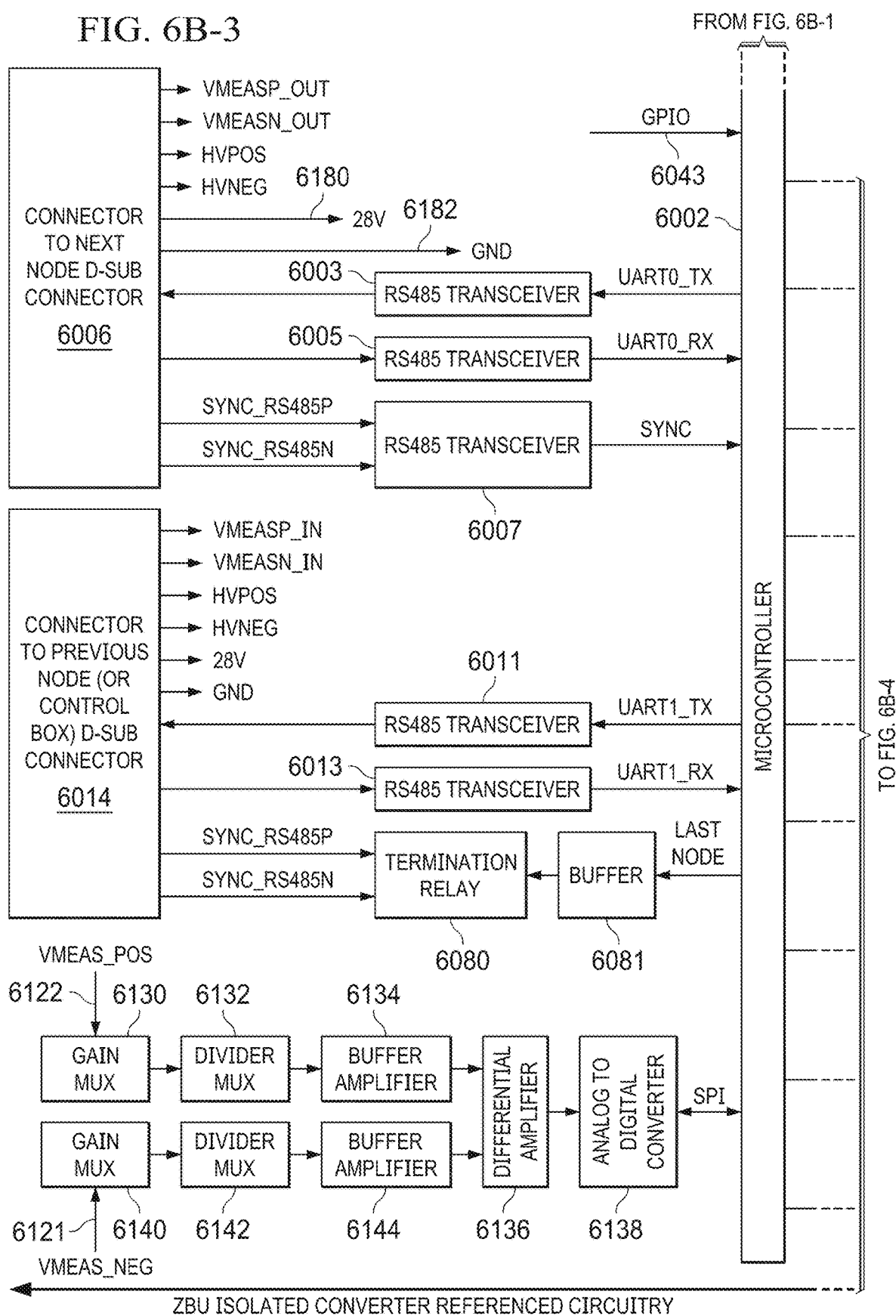
Figures 4, 6B:
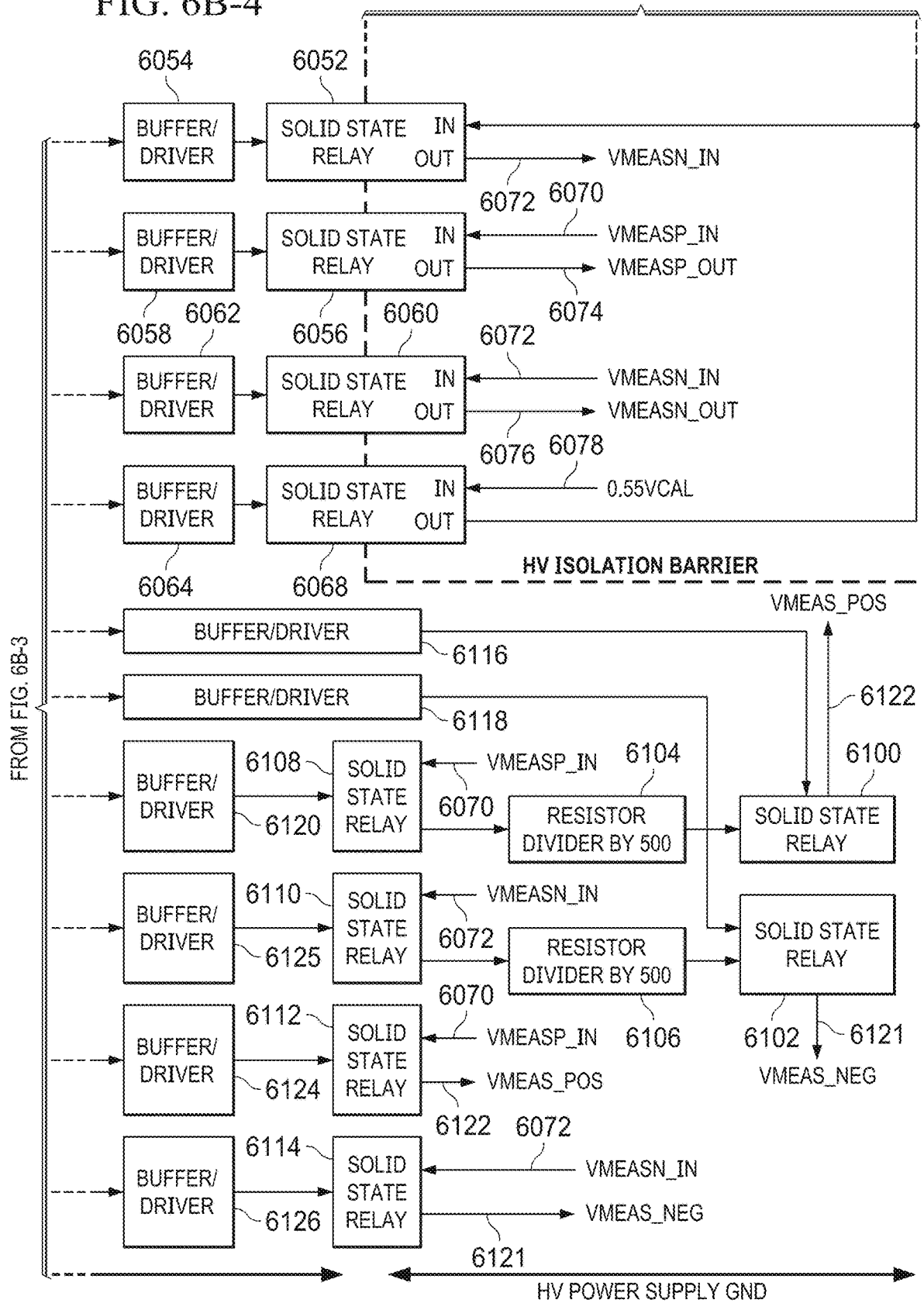

Referring to FIG. 6B, an alternate embodiment of node 404 will be described.

Node 404 includes microcontroller 6002. In a preferred embodiment, microcontroller 6002 is Part. No. MSP430FR5994IPNR, available from Texas Instruments as previously described.

Microcontroller 6002 is operatively connected to RS485 transceiver 6003 and RS transceiver 6005. RS485 transceiver 6003 is responsible for transmit functions to the next upstream node. RS485 transceiver 6005 is responsible for receive operations for data from the next upstream node. RS485 transceivers 6003 and 6005 are operatively connected to connecter 6006, for further connection to an upstream node. RS485 transceiver 6003 is responsible for sending upstream communications of synchronization pulses, as will be further described. RS485 transceiver 6005 is responsible for receiving upstream communications of synchronization pulses, as will be further described. RS485 transceiver 6007 is responsible for communications of synchronization pulses, as will be further described.

Microcontroller 6002 is further operatively connected to RS485 transceiver 6011 and 6013. RS485 transceiver 6011 operates to send transmissions from the microcontroller to the downstream node or control box. RS485 transceiver 6013 operates to receive data signals from the downstream node or the control box and transmitting them to microcontroller 6002. RS485 transceivers 6011 and 6013 are operatively connected to connector 6014 for further connection to an upstream node or the control box.

Microcontroller 6002 is further connected to termination relay 6080 through buffer 6081. Termination relay 6080 includes termination resistors which are provided to terminate the RS485 communication channels in case the node is the last upstream measurement node in the array, as will be further described. Termination relay 6080 is operatively connected to connecter 6014 for connection to the next downstream node or the control box.

Microcontroller 6002 is further provided with SPI flash supervisor 6008 and reset IC 6010, as previously described. Microcontroller 6002 is further connected to RGB LED 6009, for visual communication of various states of the microprocessor, as will be further described.

Microcontroller 6002 controls injection current to stake connection 6046 through FET enable circuit 6045 connected to the microcontroller through general-purpose input output pin 6043 through line 6082. FET enable circuit 6045 enables isolated DC-DC converters 6047 and 6049, which provide electrical separation between the microcontroller and the high voltage supply. In a preferred embodiment, isolated DC-DC converters 6047 and 6049 are Part Nos. PDS1S available from CUI, Inc.

Isolated DC-DC converter 6047 is connected to floating gate driver circuit 6051, which provides appropriate voltage and current for high voltage MOSFET 6055.

High voltage MOSFET 6055 is connected between high voltage positive power supply line 6061 and high voltage relay 6059. High voltage relay 6059 is operatively connected to stake connection 6046. A high voltage relay is enabled through GPIO line 6065, which is operatively connected to microcontroller 6002.

Likewise, isolated DC-DC converter 6049 is connected to floating gate driver circuit 6053 which supplies the appropriate voltage and current to high voltage MOSFET 6057. High voltage MOSFET 6057 is connected between high voltage negative power supply line 6063 and high voltage relay 6059.

In order to prevent cross conduction between high voltage MOSFET 6055 and 6057, cross conduction logic 6067 is provided. Cross conduction logic 6067 provides a buffer enable line to each of buffers 6069 and 6071. Buffer 6069 is further connected to opto-isolator 6073. Opto-isolator 6073 provides further isolation between buffer 6069 and high voltage MOSFET 6055. Opto-isolator 6073 is further connected to floating gate driver circuit 6051 which controls switching of high voltage MOSFET 6055.

Likewise, buffer 6071 is operatively connected to opto-isolator 6075. Opto-isolator 6075 is operatively connected to floating gate driver circuit 6053. Microcontroller 6002 controls switching of high voltage MOSFET 6057, through the buffer circuit, the opto-isolator and the floating gate driver.

Stake connection 6046 is further connected to relay 6048, relay 6052, and relay 6068. Relay 6048 is further connected to positive voltage measurement input line 6070 and controlled by microcontroller 6002 through buffer circuit 6050.

Relay 6052 is further connected to negative voltage measurement input line 6072. Relay 6052 is controlled by microcontroller 6002 through buffer circuits 6054.

Relay 6056 is connected between positive voltage measurement input line 6070 and the positive voltage measurement output line 6074. Relay 6056 is controlled by microcontroller 6002 through buffer circuit 6058

Relay 6060 is connected between negative voltage measurement input line 6072 and negative voltage measurement output line 6076. Relay 6060 is controlled by microcontroller 6002 through buffer circuit 6062.

Relay 6068 is connected to the 0.55V calibration line 6078. Microcontroller 6002 controls sending the calibration signal to the stake connection through buffer circuit 6064.

Isolated DC-DC converter 6047, isolated DC-DC converter 6049, opto-isolator 6073, opto-isolator 6075 and relays 6048, 6052, 6056, 6060 and 6068 form a high voltage isolation barrier between the node 28V isolated converter ground referenced circuitry and the high voltage power supply ground referenced circuitry. The isolation barrier insulates the microcontroller and associated circuits from potential undesired signaling through a common ground or other electrical connections to the high voltage power supply.

Microcontroller 6002 controls resistor divider network 6104 through buffer circuit 6120 through solid-state relay 6108. Solid-state relay 6108 is connected to positive voltage measurement input line 6070 and resistor divider network 6104. Resistor divider network 6104 is further connected to solid-state relay 6100. Microcontroller 6002 controls solid-state relay 6100 through buffer circuit 6116. Solid-state relay 6100 is connected to positive voltage measurement line 6122.

Microcontroller 6002 controls resistor divider network 6106 through buffer circuit 6125 and solid-state relay 6110. Solid-state relay 6110 is connected between negative voltage measurement input line 6072 and resistor divider network 6106. Resistor divider network 6106 is connected to solid-state relay 6102. Solid-state relay 6102 is controlled by microcontroller 6002 through buffer circuit 6118. Solid-state relay 6102 is further connected to negative voltage measurement line 6121.

Buffer circuit 6124 is connected between microcontroller 6002 and solid-state relay 6112. Solid-state relay 6112 is further connected to positive voltage measurement input line 6070 and positive voltage measurement line 6122.

Buffer circuit 6126 is connected between microcontroller 6002 and solid-state relay 6114. Solid-state relay 6114 is further connected to negative voltage measurement input line 6072 and negative voltage measurement line 6121.

Positive voltage measurement line 6122 is further connected to variable gain amplifier 6130. Variable gain amplifier 6130 is further connected to voltage divider network 6132. Voltage divider network 6132 is connected to buffer amplifier 6134. Buffer amplifier 6134 is connected to the positive side of differential amplifier 6136. Differential amplifier 6136 is connected through analog to digital converter 6138 to microcontroller 6002. Analog to digital converter 6138 communicates the voltage mounted measurement at the stake connection, as will be further described.

Solid-state relays 6108 and 6110, in combination with resistor divider networks 6104 and 6106, and solid-state relays 6100 and 6102 provide an alternate embodiment of "auto scaling" voltage divider circuit 700 and replaces like components in alternate embodiments for use in a measurement node, as previously described.

Negative voltage measurement line 6121 is connected to variable gain amplifier 6140. Variable gain amplifier 6140 is further connected to voltage divider network 6142. Voltage divider network 6142 is connected to buffer amplifier 6144. Buffer amplifier 6144 is further connected to differential amplifier 6136 and supplies the negative voltage measurement signal to analog to digital converter 6138.

Variable gain amplifiers 6130 and 6140 are switched resistors into the feedback loop of each amplifier channel to generate a gain closed loop. Voltage divider networks 6132 and 6142 operate similarly except at the output of the operation amplifier so as not to interfere with feedback paths.

Positive voltage measurement output line 6074 and negative voltage measurement output line 6076 are connected to upstream connector 6006 for communication to the next upstream node. Positive voltage measurement input line 6070 and negative voltage measurement input line 6072 are connected to connector 6014 for communication to the previous node or the control box. High voltage positive power supply line 6061 and high voltage negative power supply line 6063 are both connected to connector 6006 for communication to the next upstream node and connector 6014 for connection to the next downstream node or the control box.

28V power supply line 6180 and 28V ground line 6182 are connected to both connectors 6006 and 6014 for communication to the next node downstream or the control box, respectively. Step down transformer 6152 is connected to 28V supply line 6150. Stepdown transformer 6152 is further connected to low dropout regulator 6154 for conversion to 3.3V, and low dropout regulator 6156 for conversion to 3.3V. Regulator 6156 is further connected to resistor divider network 6158 and known voltage buffer 6160 for production of a controlled 0.55V calibration signal, which is connected to relay 6068 and used to calibrate the node voltage measurement functions.

Step down transformer 6152 is further connected to regulator 6162. Regulator 6162 is further connected to regulator 6164 for production of a 14V signal 6166.

Regulator 6162 is further connected to charge pump 6168. Charge pump 6168 provides a negative 15V signal to regulators 6170 and 6172 for production of a negative 3.3V signal and a negative 14V signal, respectively.

Microcontroller 6002 is further connected to DC-DC converter 6099. DC-DC converter 6099 is further connected to auxiliary 12V DC source 412b. DC-DC converter 6099 operates to supply a 28V signal which is connected to the next upstream node through connector 6014. Presence of the auxiliary 12V DC source is sensed by microcontroller 6002 through sense line 6098. In a preferred embodiment, DC-DC converter 6099 is Part No. CBQ150 W-24S48 available from Cincon.

Figure 7:
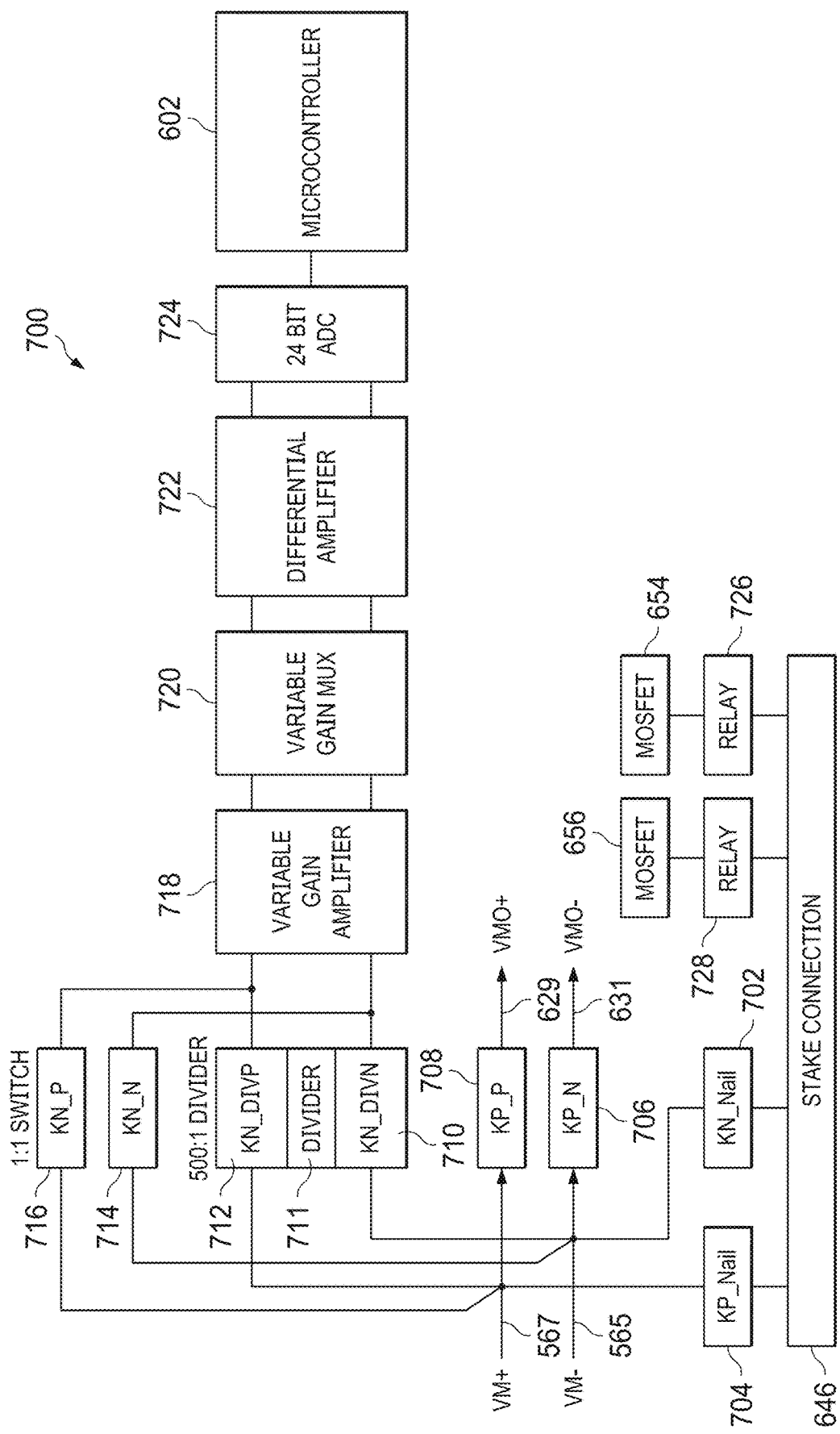
FIG. 7 is a schematic diagram of a preferred embodiment of a measurement voltage divider network.

Referring to FIG. 7, an alternate embodiment of "auto scaling" voltage divider circuit 700 will be described. The circuit replaces like components in alternate embodiments of a measurement node.

Positive voltage measurement line 567 is connected to passthrough reed switch 716, voltage divider reed switch 712, passthrough reed switch 708 and passthrough reed switch 704. Negative voltage measurement line 565 is connected to passthrough reed switch 714, voltage divider reed switch 710, passthrough reed switch 706 and passthrough reed switch 702. In a preferred embodiment, each voltage divider reed switches 712 and 710 are further connected to a 500:1 voltage divider network 711. Voltage divider network 711 is employed to condition extremely large measurement signals.

Passthrough reed switch 716 is further connected to variable gain amplifier 718. Variable gain amplifier 718 is employed to amplify extremely small measurement signals. In a preferred embodiment, variable gain amplifier 718 is a combination of two low noise amplifiers whose gain is controlled by a series of switched resistor networks. In a preferred embodiment, the op amps are Part No. 0PA2140 low powered J-FET amplifiers available from Texas Instruments. Passthrough reed switch 714 is connected to variable gain amplifier 718. Voltage divider reed switch 712 is likewise connected to variable gain amplifier 718. Voltage divider reed switch 710 is also connected to variable gain amplifier 718.

Passthrough reed switch 708 is connected to upstream positive voltage measurement output 629. Passthrough reed switch 706 is connected to upstream negative voltage measurement output 631.

Passthrough reed switch 704 is connected to stake connection 646. Passthrough reed switch 702 is connected to stake connection 646.

MOSFET 654 is connected to relay 726. Relay 726 is connected to stake connection 646. MOSFET 656 is connected to relay 728. Relay 728 is further connected to stake connection 646. The relays are provided in the circuit to eliminate leakage current through the MOSFETs to the stake as a result of the high voltage bias between the high voltage line and the ground.

Variable gain amplifier 718 is connected to variable gain multiplexer 720. The variable gain multiplexer is an active voltage divider which is capable of attenuating large signals of up to 12.5V down to the acquisition level of ADC 724. In a preferred embodiment, variable gain multiplexer 720 employs a pair of op amps through a switched resistor network. In a preferred embodiment, each of the op amps is Part No. OPA2140 available from Texas Instruments.

Variable gain multiplexer 720 is connected to differential amplifier 722. The differential amplifier is used to condition the signal to a midpoint voltage activation level for ADC 724.

Differential amplifier 722 is connected to ADC 724. ADC 724 is likewise connected to microcontroller 602. In a preferred embodiment, ADC 724 demonstrates a very precise 2.5 ppm gain error and 0.23 ppm noise to produce a 24 bit differential analog to digital conversion with a range of 2.7 to 5.5 supply voltage. The full scale differential input range is from −0.5V referenced to 0.5V reference. In a preferred embodiment, calibration of the ADC is not necessary because measurements are taken on alternating positive and negative high voltage waveforms which cancel any offset present. In a preferred embodiment, ADC 724 is the LTC241 5-series analog to digital converter, is available from Linear Technology Corporation.

Each of switches 702, 704, 706, 708, 710, 712, 714, and 716, and relays 728 and 726 are connected to the general purpose input output port of microcontroller 602 and are controlled thereby.

The voltage divider circuit is useful in situations where very large voltage measurements are required. The divider circuit employs an "auto scaling" feature to precondition the voltage measurement for the ADC. When a large voltage is detected at the stake, ADC 724 automatically indicates an overflow condition. When this occurs, variable gain multiplexer 720 is automatically switched into the circuit in order to attenuate the signal by a factor of 12. If the overflow condition persists, then voltage divider network 711 is automatically switched into the circuit to attenuate the signal by a factor of 500.

Figure 8:
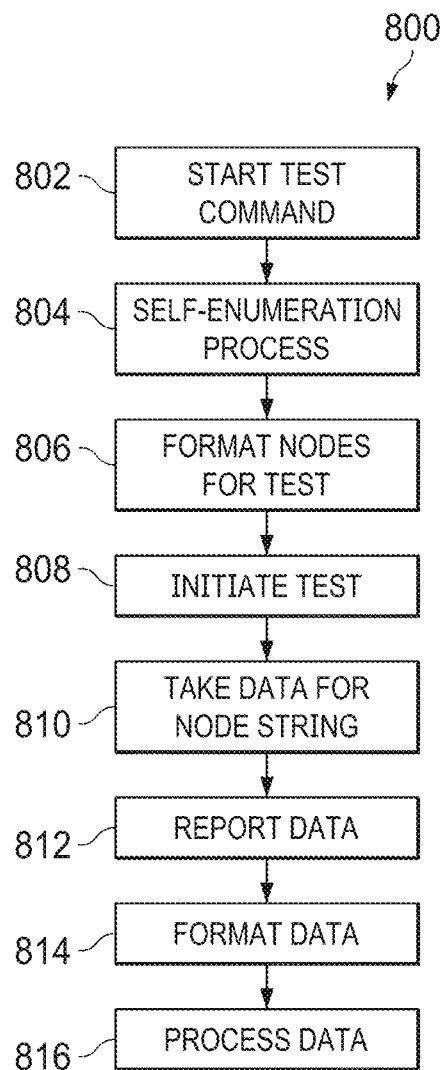
FIG. 8 is a preferred embodiment of an ERT survey method.

Referring to FIG. 8, method 800 for obtaining test data will be described. At step 802, PC controller 414 receives a start test from the graphic user interface. The start test command includes a test format, and a file name for test data to be recorded. The start test command is sent to the master control board.

At step 804, the master control board initiates a self-enumeration process at the nodes, as will be further described.

At step 806, the master control board formats the test protocol, as will be further described.

At step 808, the master control board initiates the test procedure, as will be further described.

At step 810, the various nodes take voltage readings, as will be further described.

At step 812, the nodes report test data, as will be further described. To report test data, testing, the CPU of each node places one packet of test data in the DMA pipeline which is then moved to the master control board, along the downstream communication bus in order, without further intervention. In a preferred embodiment, each packet passed through direct memory access includes an 8 byte payload with a hardware cyclic redundancy check, CRC16, at each node.

At step 814, the master control board formats the reported test data and forwards it to PC controller 414. Once the master control board receives a packet of test data from each node, the test data packets are assembled into a table of the appropriate format which is then forwarded to the PC controller through UART transmission lines 539 and 537. In a preferred embodiment, the master control board assembles the data into a pre-universal resistivity file (PURF) type format, including measurements of A, B, M, N, V/I, I, error percent, and chargeability, C, in microvolts/volts.

At step 816, the PC controller processes the data into an intelligible graphic format. In a preferred embodiment, processing the data includes conducting a regression correlation on the raw resistivity data to create a resistivity model. The resistivity model is converted into a graphical form which can then be analyzed to detect and locate subsurface soil anomalies.

Figure 9A:
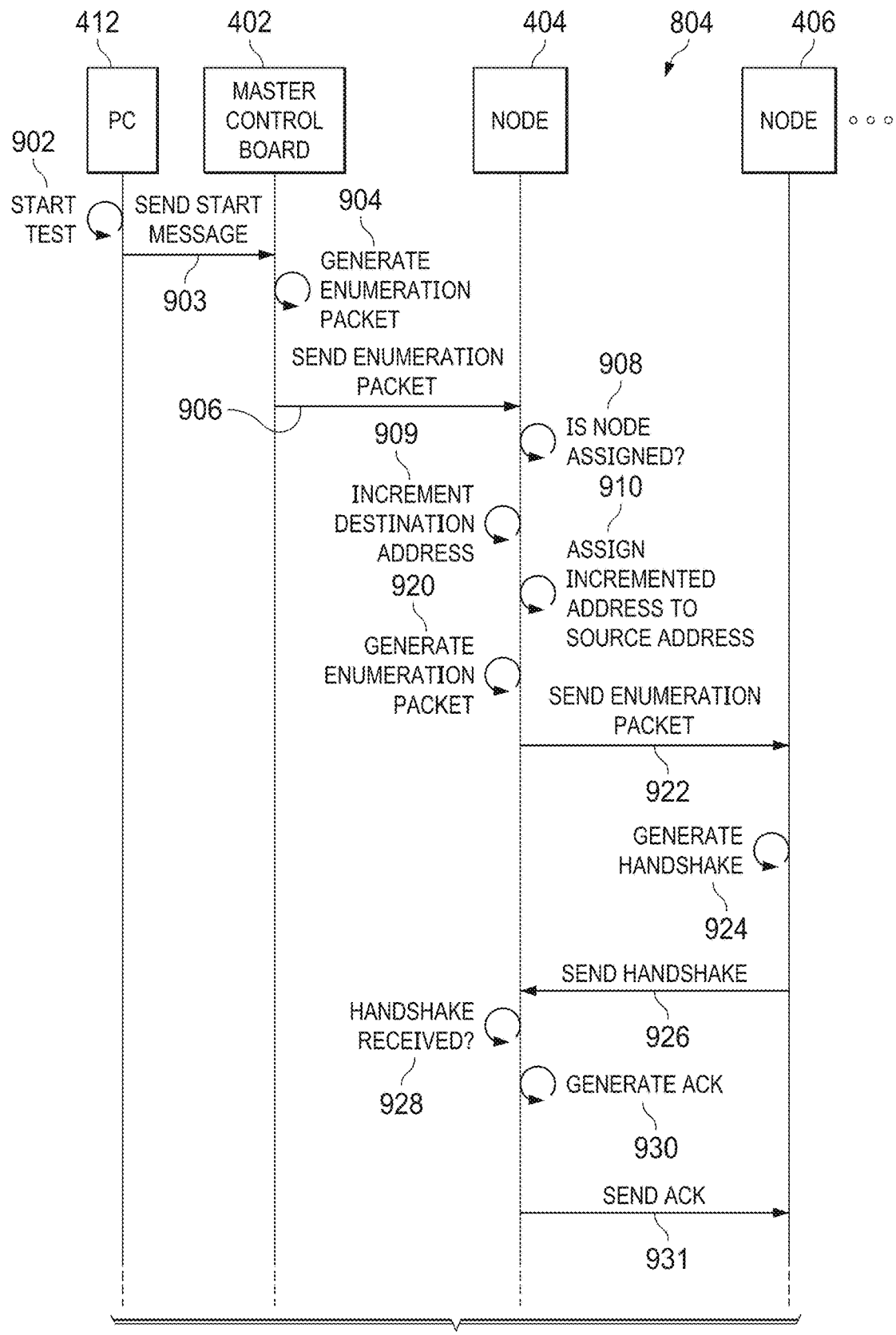
FIG. 9A is a preferred embodiment of a method of node self-enumeration.
Figure 9B:
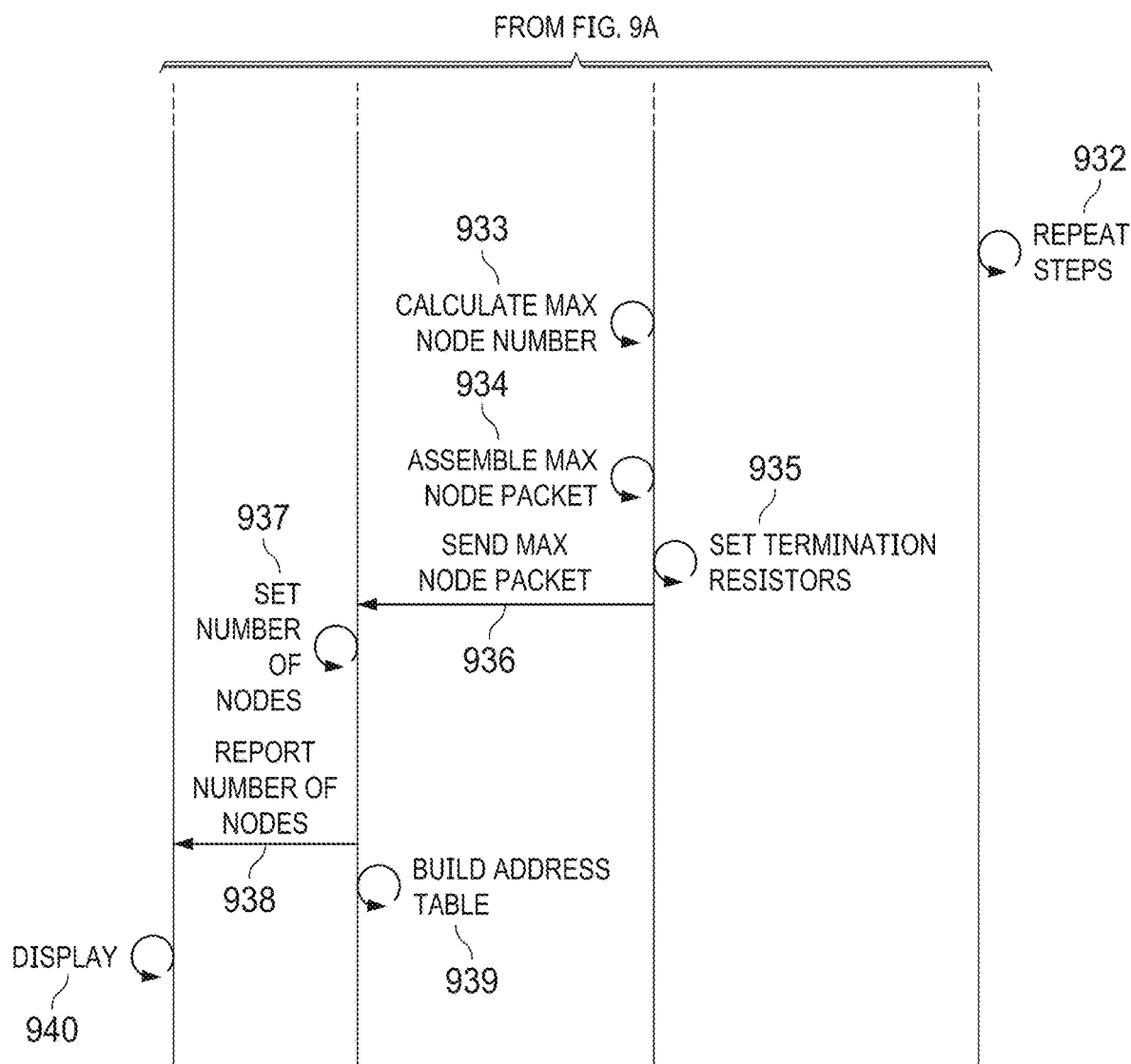
FIG. 9B is a preferred embodiment of a method of node self-enumeration.

Referring to FIGS. 9A and 9B, the node self-enumeration process of step 804 will be further described. In this example, two nodes, 404 and 406 are shown. However, as the ellipsis in the drawing indicates, any number of nodes may exist in the system limited only by a signal to noise ratio. Each measurement node in the array is identical to its upstream and downstream neighbors.

At step 902, PC controller 412 generates a start test message. The start test message, in a preferred embodiment, includes a test protocol and an array type. At step 903, the PC controller sends the start test message to the master control board.

At step 904, master control board 402 generates an enumerate data packet. In a preferred embodiment, the enumerate data packet includes a single 8 byte payload. 4 bites of the payload represent the source address of the master control board, in this example 0000. The 4 byte destination address in the data packet is also set to 0000, as none of the nodes has an address. The source address of the master control board is arbitrary and may take on other values. The source address and the destination address of the enumeration packet should be the same value.

At step 906, master control board 402 sends the enumeration data packet to node 404 using direct memory access. At step 908, node 404 determines whether or not it has an address. If not, then node 404 proceeds to step 909. If so, node 404 proceeds to step 920.

At step 909, node 404 increments the destination address by 0001. At step 910, node 404 assigns itself the incremented address.

At step 920, node 404 generates an enumeration data packet. The enumeration data packet includes the source address of node 404. In this example, the source address is the packet is 0001, and the destination address 0000, as the next upstream node has no address. At step 922, node 404 forwards the enumeration data packet to upstream node 406 using the upstream communications channel.

At step 924, node 406 generates a handshake code. In a preferred embodiment, the handshake code is any arbitrary 4 byte number. At step 926, node 406 sends the handshake code to node 404.

At step 928, node 404 determines whether or not a handshake code has been received within a predetermined timeout period. If so, the method moves to step 930. If not, the method moves to step 933.

At step 930, node 404 generates an acknowledgment to the handshake code. At step 931, node 404 sends the acknowledgement to node 406. At step 932, upon receipt of the acknowledgement from node 404, node 406 undertakes steps 908, 909, 910, 920, 922, 924, 926, 928, 930 and 931, as previously described, with the next upstream node in the array. The process is repeated recursively at each node until all the nodes in the array have self-enumerated, and the last upstream node has set its termination resistors.

At step 933, node 404 calculates the maximum number of nodes in the array. In a preferred embodiment, the number of nodes in the array is calculated by the last upstream node in the array by subtracting the source address from its newly self-assigned destination address. The result is the number of nodes in the array. At step 934, node 404 assembles the max node packet. The max node packet includes a single 4-byte value indicating the calculated number of nodes in the array.

At step 935, node 404 sets its RS485 termination resistors indicating that it is the terminal node on RS485 communications channels.

At step 936, node 404 sends the max node packet to master control board 402 using the downstream RS485 communications channel. Node 406 submits the acknowledgment packet to the DMA controller which uses the upstream communications channel to automatically place the acknowledgement packet in the appropriate location in the memory of the master control board. The DMA controller of the master control board automatically generates an interrupt to the CPU of the master control board when the acknowledgement packet is received.

At step 937, master control board 402 sets the number of nodes to match the number of nodes indicated in the max node packet. At step 938, master control board 402 sends the number of nodes to PC controller 412.

At step 939, master control board 402 builds a table of node addresses starting with its own address and incrementing the address once for each node in the array as indicated in the max node packet. At step 940, PC controller 412 displays the number of nodes in the array.

Advantageously, neither the measurement nodes, nor the master control board, nor the PC controller does, or is required to, determine a relative ordering or repetitively send addresses of the nodes back to the master control board. Eliminating the necessities of discovering node addresses and a relative position of the nodes in the array makes the survey process far faster than the prior art. Further, since none of the nodes has a unique identifier, it is easier, faster and far less error prone to change the nodes in the field in case of malfunction. Still further, eliminating the requirement to transfer node identifiers in data packets vastly reduces the possibility of address errors occurring in the system.

Figure 10A:
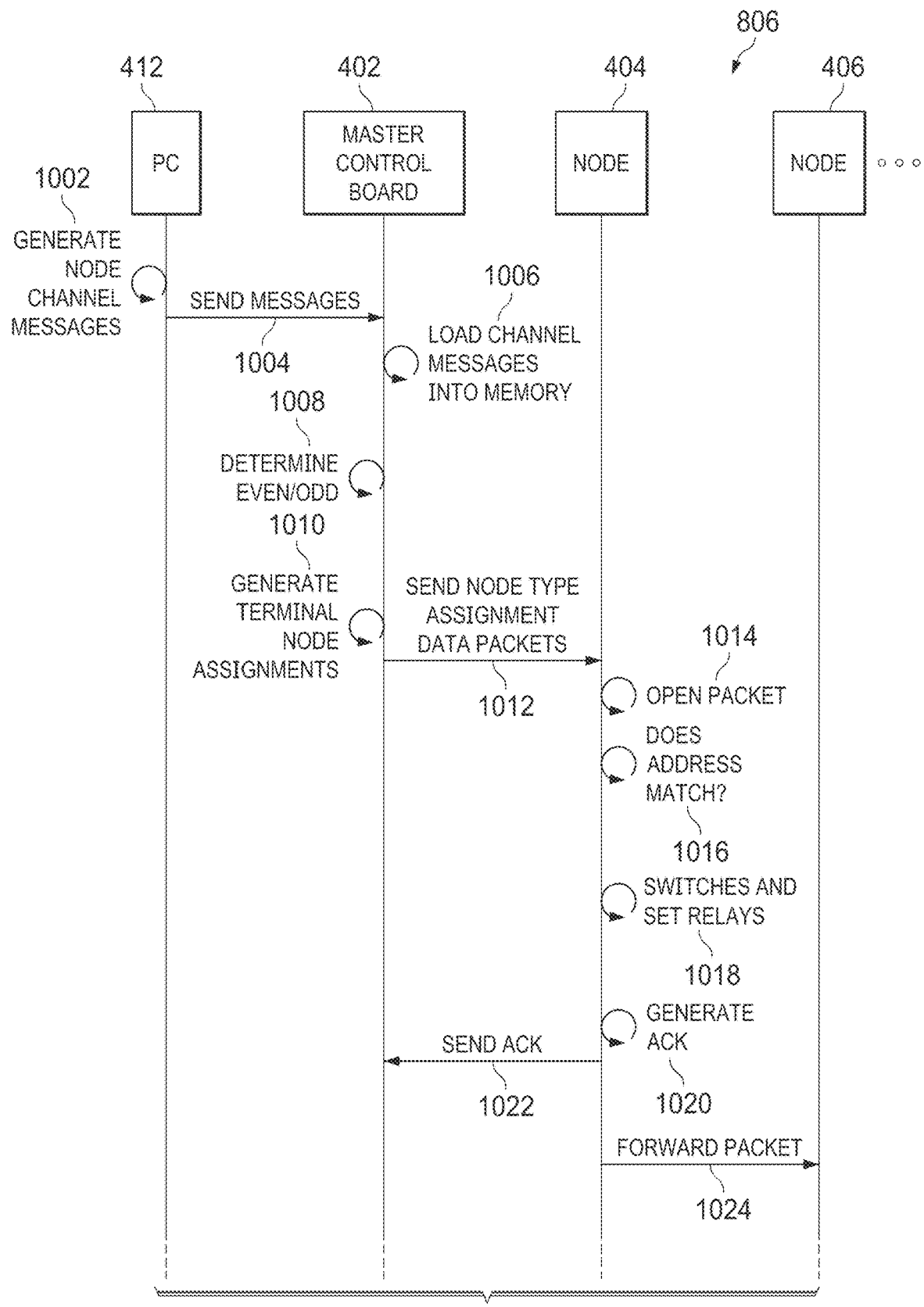
FIG. 10A is a preferred embodiment of a method of formatting an ERT test topology.
Figure 10B:
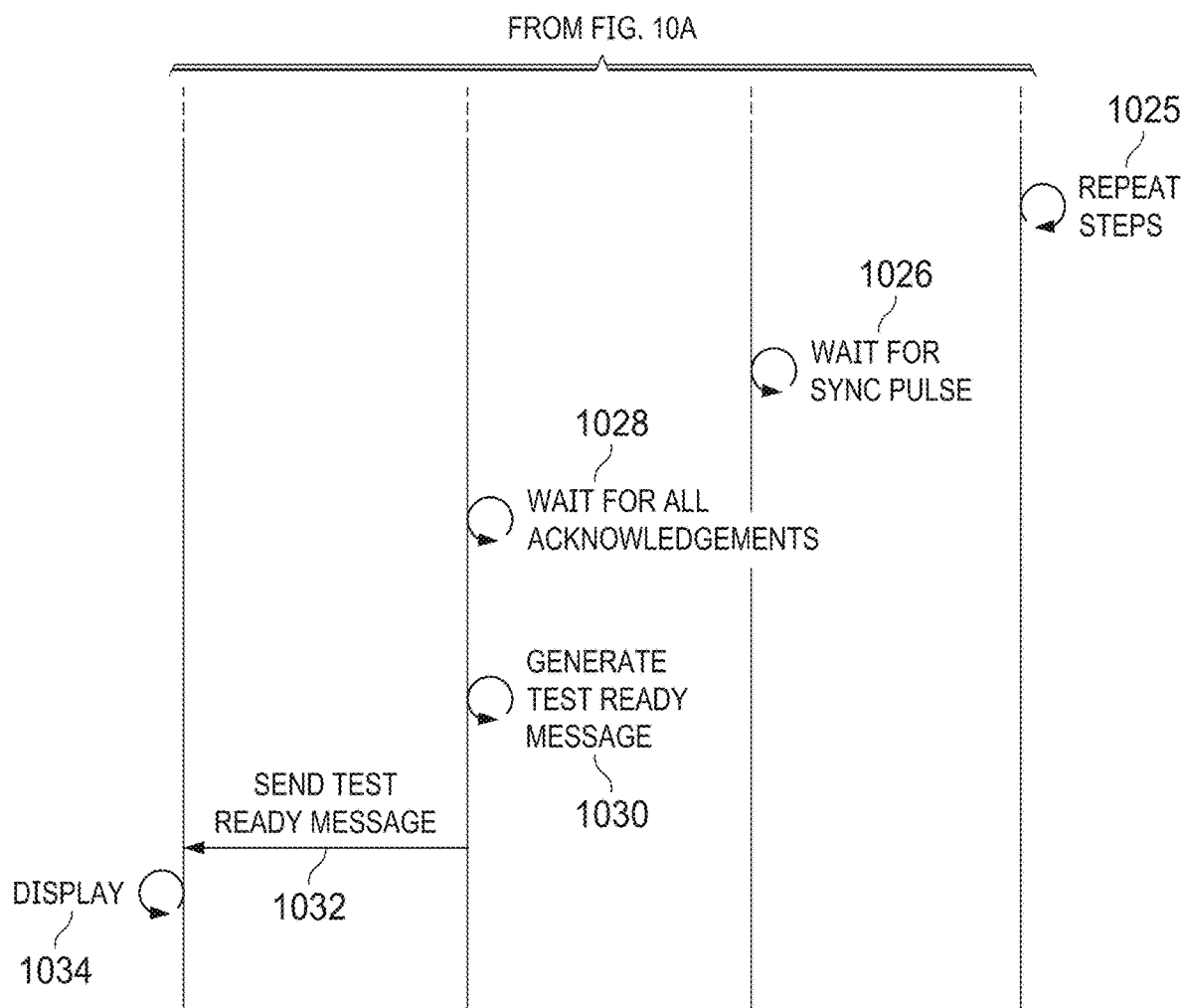
FIG. 10B is a preferred embodiment of a method of formatting an ERT test topology.

Referring to FIGS. 10A and 10B, a preferred method of formatting the nodes for test of step 806 will be further described.

At step 1002, PC controller 412 generates a series of node assignment messages.

Each node may be assigned one of the following states:
A—Inject node +
B—Inject node −
P—Pass through node
M—Measurement +
N—Measurement −
LM—M type but does not react to a second transition sync pulse
LN—N type but does not react to a second transition sync pulse
SM—M type at first transition sync pulse, N type at second transition sync pulse
SN—N type at first transition sync pulse, M type at second transition sync pulse
S—Skip Node (high z, all switches off).

The node assignment messages comprise a separate "channel assignment message" for each node, for each desired channel of test data. The channel assignment messages are enumerated from 0 to n, where (n−2) is the highest channel of test data. Each channel assignment message includes node assignments for each pair of adjacent nodes. For a dipole-dipole test, the first two nodes, node 1 and node 2 in each array are typically assigned to an A type node and a B type node current injection, respectively, as will be further described. In other embodiments, such as when the nodes are reversed in order, the A and B nodes may be the two most upstream nodes in the array.

In the case where only a single channel of test data is required, a broadcast message is sent indicating that the nodes are not to toggle between M and N states, further employing the "bifunctional" node states LM, LN, SM or SN, as will be further described. A single channel of data may be required if a bad data point is reported from a completed survey. Testing from a single channel is important because it enables the system to repair bad data in one channel without the need to repeat an entire survey.

An example of five (5) channel assignment messages for a case of seven (7) nodes, placed in a linear dipole-dipole array, left to right survey order, with nodes at equidistant positions 1-7, is shown below in Table 1.

TABLE 1

| Channel Message | Node/Type | Node/Type |
|---|---|---|
| 0 | 1/A | — |
| 1 | — | 2/B |
| 2 | 3/M | 4/N |
| 3 | 4/M | 5/N |
| 4 | 5/M | 6/N |
| 5 | 6/M | 7/N |

In a second and following sets of channel messages, the assignment of A and B nodes advances to the next upstream node in each case until the survey is completed, as will be further described.

At step 1004, PC controller 412 sends the channel assignment messages to the master control board.

At step 1006, master control board 402 loads the channel assignment messages. At step 1008, master control board 402 determines from the channel messages whether or not an even number or an odd number nodes is present. At step 1010, master control board 402 generates terminal node assignments for the first node in the array and the last node in the array. If an odd number of nodes is present, then the first measurement node is assigned LM type and the last node is assigned SM type. In the case of an even number of nodes, the first measurement node is assigned LM type and the last node is assigned N type. Node 1 is assigned an A type node assignment. Node 2 is assigned an B type node assignment.

At step 1012, master control board 402 sends node type assignment packets, each addressed to its respective node, in order, to node 404 using direct memory access via the RS485 upstream communication channel.

At step 1014, node 404 receives an interrupt from the DMA controller and opens the first node assignment packet that it receives. At step 1016, node 404 compares the destination address in the packet to its address. If the destination address matches its address, then at step 1018, it sets its reed switches and relays to match its node type assignment. The various switch and relay settings are maintained in memory at each node.

Referring again to FIGS. 5A and 5B, an example of reed switch and relay settings for the various node type assignments are shown in Table 2 below.

TABLE 2

| Node Type | 638 | 640 | 632 | 630 | 636 | 634 | 654 | 656 | 644 | 642 |
|---|---|---|---|---|---|---|---|---|---|---|
| A | O | O | O | O | O | O | C | O | O | O |
| B | O | O | O | O | O | O | O | C | O | O |
| P | O | O | C | C | C | C | O | O | O | O |
| M | C | O | O | C | O | O | O | O | O | O |
| N | O | C | O | O | C | O | O | O | C | C |
| LM | C/O/O | O/C/C | O | C/O/O | O/C/C | O | O | O | O/C/C | O/C/C |
| LN | O/C/C | C/O/O | O | O/C/C | C/O/O | O | O | O | C/O/O | C/O/O |
| SM | C/C/O | O/O/C | O | C/C/O | O/O/C | O | O | O | O/O/C | O/O/C |
| SN | O/O/C | C/C/O | O | O/O/C | C/C/O | O | O | O | C/C/O | C/C/O |
| S | O | O | O | O | O | O | O | O | O | O |

Referring again to FIG. 7, an example of reed switch and relay settings for the various node type assignments are shown in Table 3 below.

TABLE 3

| Node Type | 702 | 704 | 706 | 708 | 710 | 712 | 714 | 716 | 726 | 728 | 654 | 656 |
|---|---|---|---|---|---|---|---|---|---|---|---|---|
| A | O | O | O | O | O | O | O | O | C | O | C | O |
| B | O | O | O | O | O | O | O | O | O | C | O | C |
| P | O | O | C | C | O | O | O | O | O | O | O | O |
| M | O | C | O | C | O | O | O | O | O | O | O | O |
| N | C | O | O | O | O | O | C | C | O | O | O | O |
| LM | O/C/C | C/O/O | O | C/O/O | O | O | O/O/C | O/C/C | O | O | O | O |
| LN | C/O/O | O/C/C | O | O/C/C | O | O | O/C/C | C/O/O | O | O | O | O |
| SM | O/O/C | C/C/O | O | C/C/O | O | O | O/C/C | O/O/C | O | O | O | O |
| SN | C/C/O | O/O/C | O | O/O/C | O | O | C/C/O | C/C/O | O | O | O | O |
| S | O | O | O | O | O | O | O | O | O | O | O | O |

In the case where the voltage divider network 711 is employed to auto scale the node, the reed switches and relays are set according to Table 4 below.

TABLE 4

| Node Type | 702 | 704 | 706 | 708 | 710 | 712 | 714 | 716 | 726 | 728 | 654 | 656 |
|---|---|---|---|---|---|---|---|---|---|---|---|---|
| A | O | O | O | O | O | O | O | O | C | O | C | O |
| B | O | O | O | O | O | O | O | O | O | C | O | C |
| P | O | O | C | C | O | O | O | O | O | O | O | O |
| M | O | C | O | C | O | O | O | O | O | O | O | O |
| N | C | O | O | O | C | C | O | O | O | O | O | O |
| LM | O/C/C | C/O/O |  | C/O/O | O/C/C | O/O/C | O | O | O | O | O | O |
| LN | C/O/O | O/C/C | O | O/C/C | C/O/O | C/C/O | O | O | O | O | O | O |
| SM | O/O/C | C/C/O | O | C/C/O | O/O/C | O/O/C | O | O | O | O | O | O |
| SN | C/C/O | O/O/C | O | O/O/C | C/C/O | C/C/O | O | O | O | O | O | O |
| S | O | O | O | O | O | O | O | O | O | O | O | O |

Where:
 "O" denotes off
 "C" denotes on
 The "/" slash denotes a sync pulse transition, as will be further described.

At step 1020, node 404 generates an acknowledgment packet. At step 1022, node 404 sends the acknowledgment packet to master control board 402 via direct memory access.

If, at step 1016 the address of the type assignment packet does not match the address of node 404, then node 404 proceeds to step 1024. At step 1024, node 404 forwards the node type assignment packet to the next upstream node on the communications channel, in this example node 406.

At step 1025, node 406 repeats steps 1014, 1016, 1018, 1020, 1022 and 1024, as previously described, either setting its switches and relays, or forwarding the node assignment packet to the next upstream node. The process continues recursively at all upstream nodes until all nodes are configured according to their node assignment packets.

At step 1026, node 404 waits for a synchronization pulse on 28V DC supply line 555, as will be further described.

At step 1028, master control board 402 waits for acknowledgment packets from all enumerated nodes.

At step 1030, once it has received acknowledgement packets from all nodes, master control board 402 generates a "test ready" message. At step 1032, master control board 402 forwards the test ready message to PC controller 412. At step 1034, PC controller 412 displays the test ready message on the GUI, and waits for further instructions.

Figure 11A:
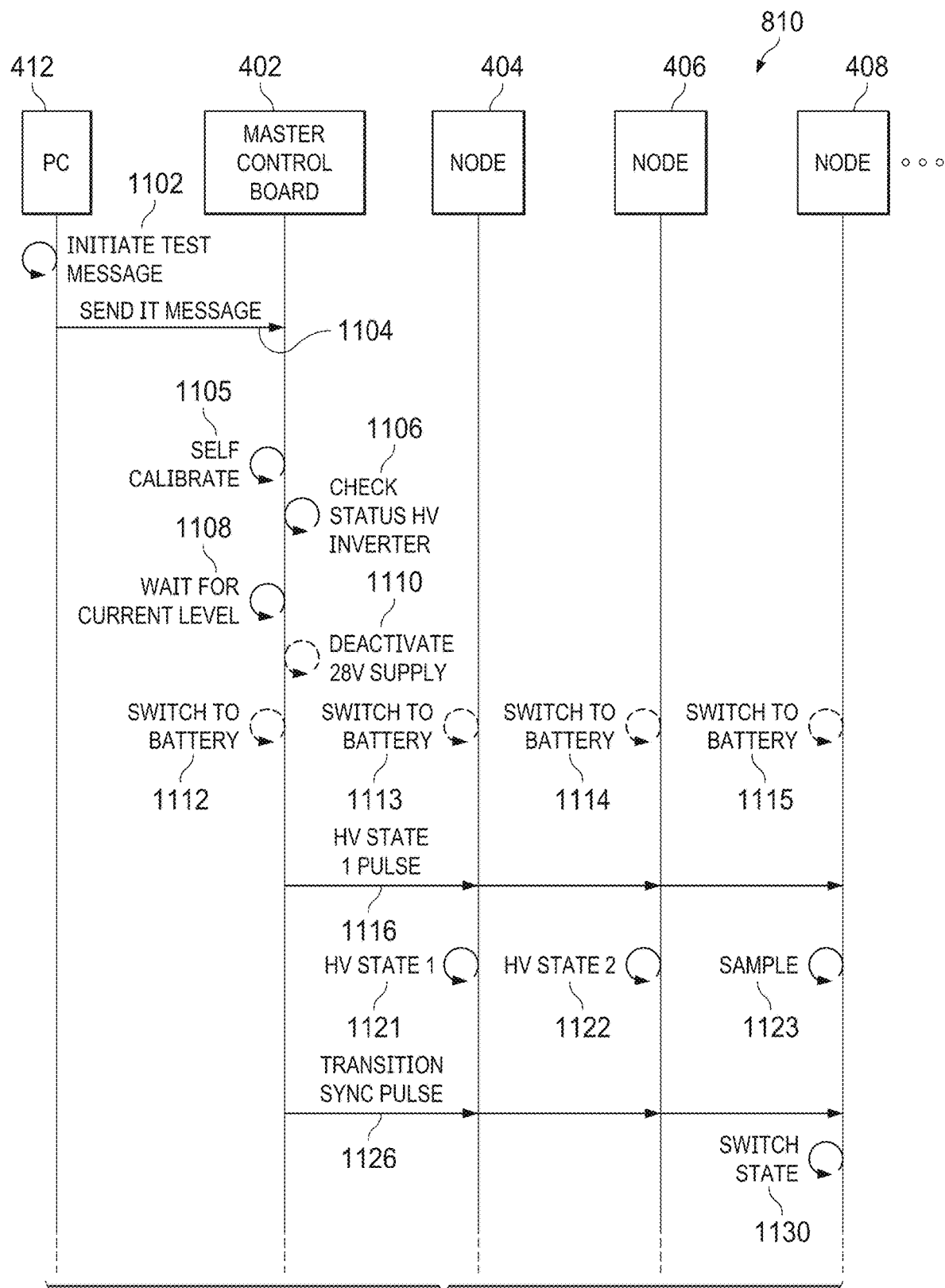
FIG. 11A is a preferred embodiment of a method of taking ERT test data.
Figure 11B:
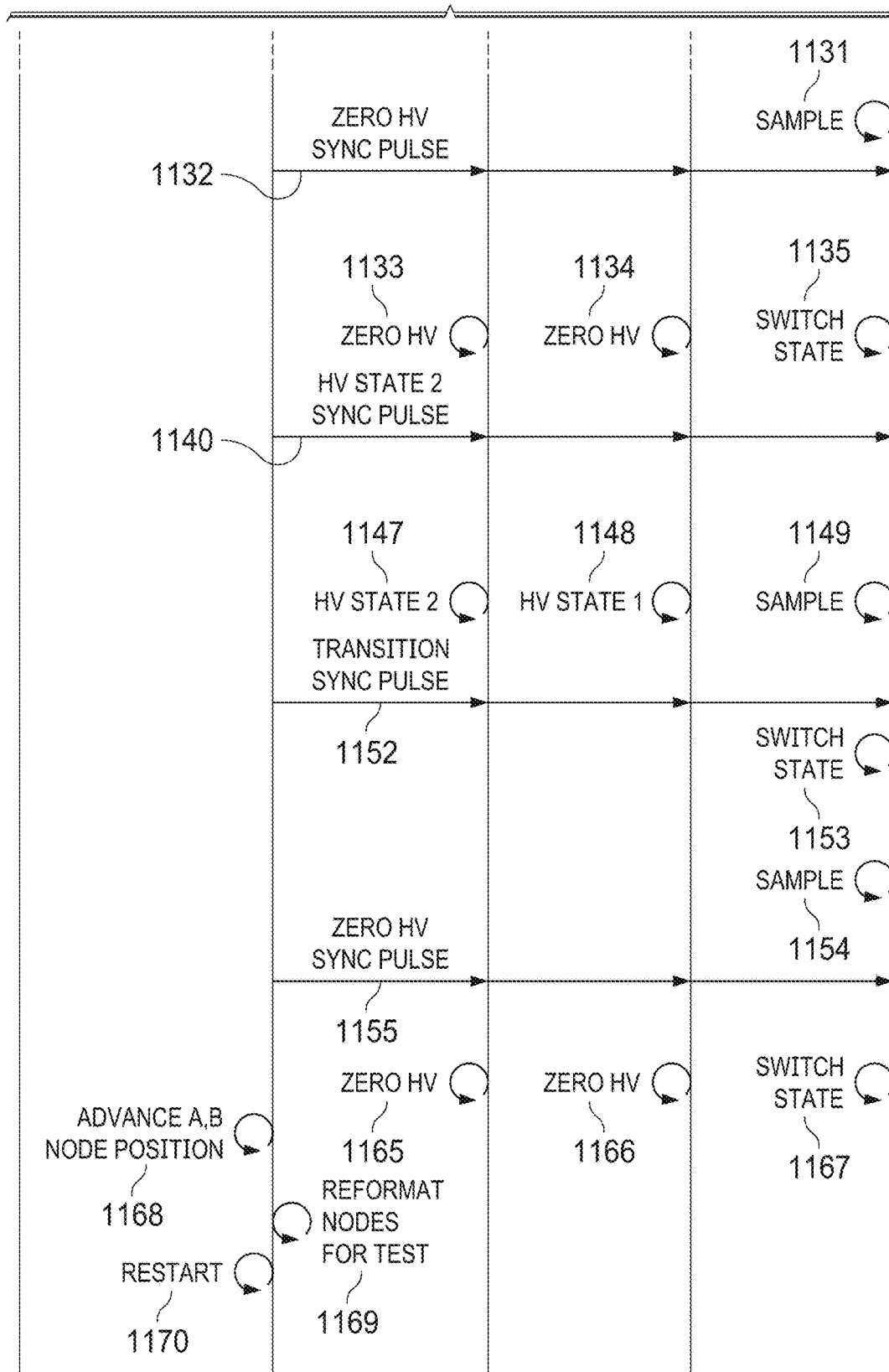
FIG. 11B is a preferred embodiment of a method of taking ERT test data.

Referring to FIGS. 11A and 11B, a preferred method of taking data by a node string of step 810, will be further described. In this example, node 404 is configured as node type "A", node 406 is configured as node type "B", and node 408 is configured as a measurement node type. In this example, the circuits of FIGS. 5A and 6A are employed.

At step 1102, PC controller 412 generates an "initiate test" message. At step 1104, PC controller 412 sends the initiate test message to master control board 402. At step 1105, the master control board executes a self calibration routine, as will be further described. At step 1106, master control board 402 checks the status of the positive high voltage supply line 505 and negative high voltage supply line 506.

At step 1108, master control board 402 waits for the current level to reach a predetermined value by monitoring current sense amplifier 552. In a preferred embodiment, a 2 Amp current limit setting is used. In an alternate embodiment, master control board 402 waits for a preset time period, or until the current reaches a railed value, before proceeding. In this way, the circuit advantageously monitors the current delivery only until it reaches a high limit preset or becomes unchanging so as not to delay a test procedure due to low current injection into the soil.

At optional step 1110, the master control board deactivates the 28V DC power supply to the upstream nodes by shutting down switch 535. At optional step 1112, master control board 402 switches to battery power through regulator 520, P-channel transistor 522 and Schottky diode 524. Schottky diode 524 smooths the transition from the power supply to the battery to avoid supply voltage noise.

Likewise, at optional step 1113, node 404 switches to battery supply power through regulator 662, P-channel field effect transistor 664 and Schottky diode 666. In the same way, at optional step 1114, node 406 switches to battery power. Likewise, at optional step 1115, node 408 switches to battery power.

At step 1116, master control board 402 sends a high voltage state 1 pulse on the 28V supply line.

At step 1121, node 404 switches to high voltage state 1 by activating MOSFET 654 and relay 726. Activating MOSFET 654 and relay 726 connects positive high voltage supply line 505 to stake connection 646.

At step 1122, node 406 activates high voltage state 2. In a preferred embodiment, node 406 activates MOSFET 656 and relay 728, thereby connecting negative high voltage supply line 506 to stake connection 646.

At step 1123, node 408 participates in taking two measurement samples in its original node type configuration. In this example, node 408 would be set to a "LM" node type assignment and so would direct its stake connection to the next upstream node for measurement.

At step 1126, master control board 402 transmits a transition sync pulse to the nodes by pulsing 28V DC supply line 555, or a pulse on the RS485 sync line, as will be further described.

At step 1130, node 408, in response to the transition sync pulse toggles its node type assignment. For example, if node 408 is assigned as an "M" state, it toggles to an "N" state. If the node is assigned an "LM" node type it toggles to an "S" node type. If the node is assigned a "LN" type it toggles to an "S" node type. If the node is assigned a "SM" node type, it toggles from an "M" node type to an "N" node type. If the node is assigned a "SN" node type, then it toggles from an "N" node type to a "M" node type. If the node is assigned "S" node type then no change takes place. Table 5 below shows the node response to a sync pulse.

TABLE 5

| Prior State | Next State |
|---|---|
| M | N |
| N | M |

TABLE 5-continued

| Prior State | Next State |
|---|---|
| LM | S |
| LN | S |
| SM M | N |
| SN N | M |
| S | S |

At step 1131, node 408 participates in taking two samples in its new node type configuration.

At step 1132, master control board 402 sends a zero high voltage sync pulse on the 28V DC supply line 555, or a pulse on the RS485 sync channel. As a result, at step 1133, node 404 disconnects the high voltage. Likewise, node 406, at step 1134, disconnects the high voltage. At step 1135, node 408 toggles back to its original node type configuration, as previously described.

At step 1140, master control board 402 sends a high voltage state 2 sync pulse on 28V DC supply line 555, or a pulse on the RS485 sync channel. As a result, node 404, at step 1147, activates MOSFET 656 and relay 728 to supply negative high voltage to stake connection 646. At step 1148, node 406 activates MOSFET 654 and closes relay 726 to supply high voltage to stake connection 646.

At step 1149, node 408 participates in taking two measurement samples in its original node type configuration.

At step 1152, master control board 402 sends a second transition sync pulse to the nodes. At step 1153, node 408 switches its node state to its new node type configuration. At step 1154, node 408 participates in taking measurement samples in its new node type configuration. At step 1155, master control board 402 sends a zero high voltage sync pulse to the nodes. As a result, at step 1165, node 404 disconnects the high voltage from the stake connection by turning off MOSFET 656 and opening relay 728. Likewise, at step 1166, node 406 disconnects the high voltage from the stake connection by turning off MOSFET 654 and opening relay 726. At step 1167, node 408 returns to its original node type configuration.

At step 1168, master control board 402 advances the A and B node position upstream, to gather data from the next test channel, as will be further described.

At step 1169, master control board 402 reformats all nodes for the next upstream test channel in the survey by calculating and sending a new set of channel assignment messages. At step 1170, master control board 402 restarts the test procedure by returning to step 1116 and repeating the following steps until the survey is complete.

Figure 11C:
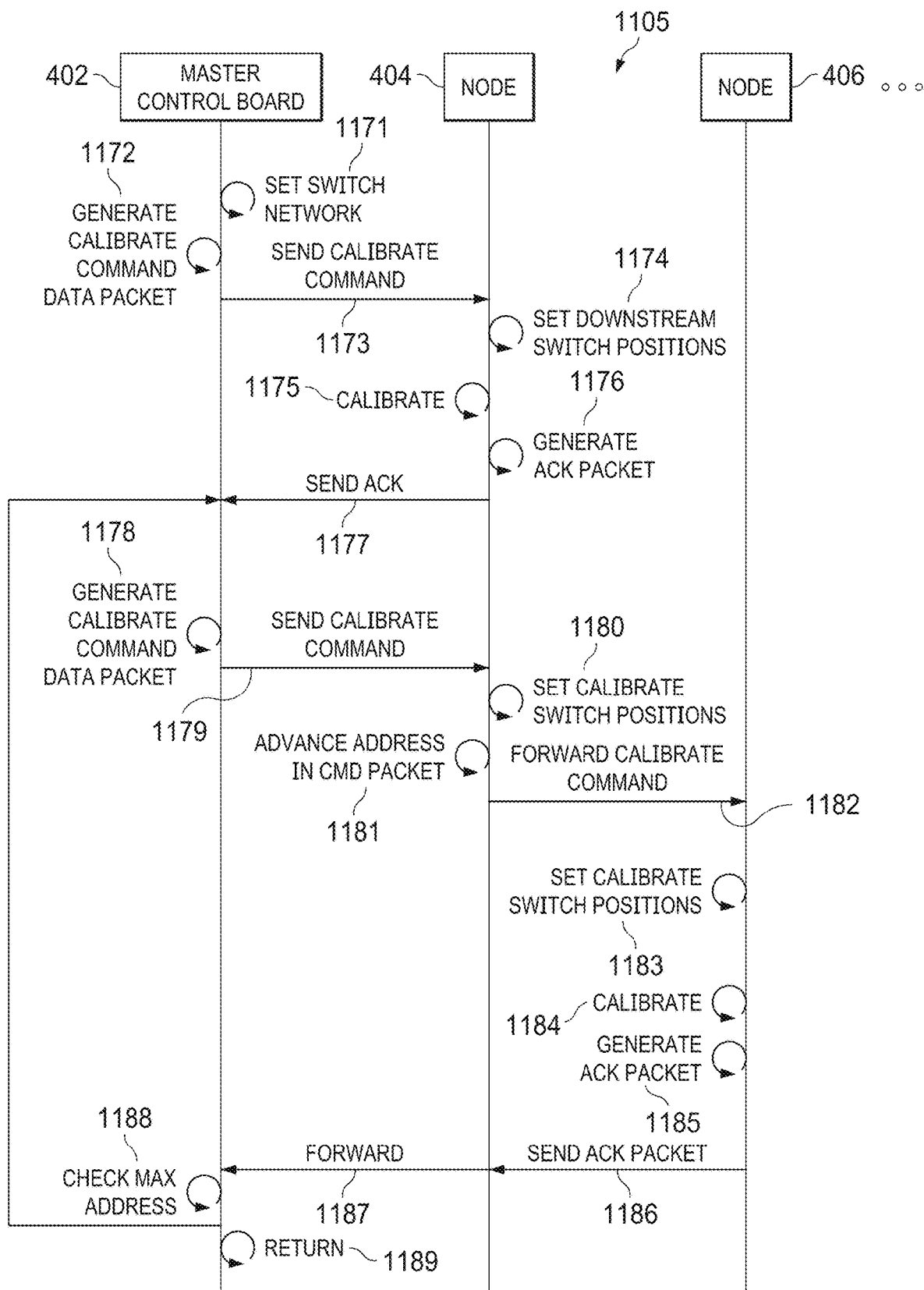
FIG. 11C is a preferred embodiment of a method of self-calibration.
Figure 11D:
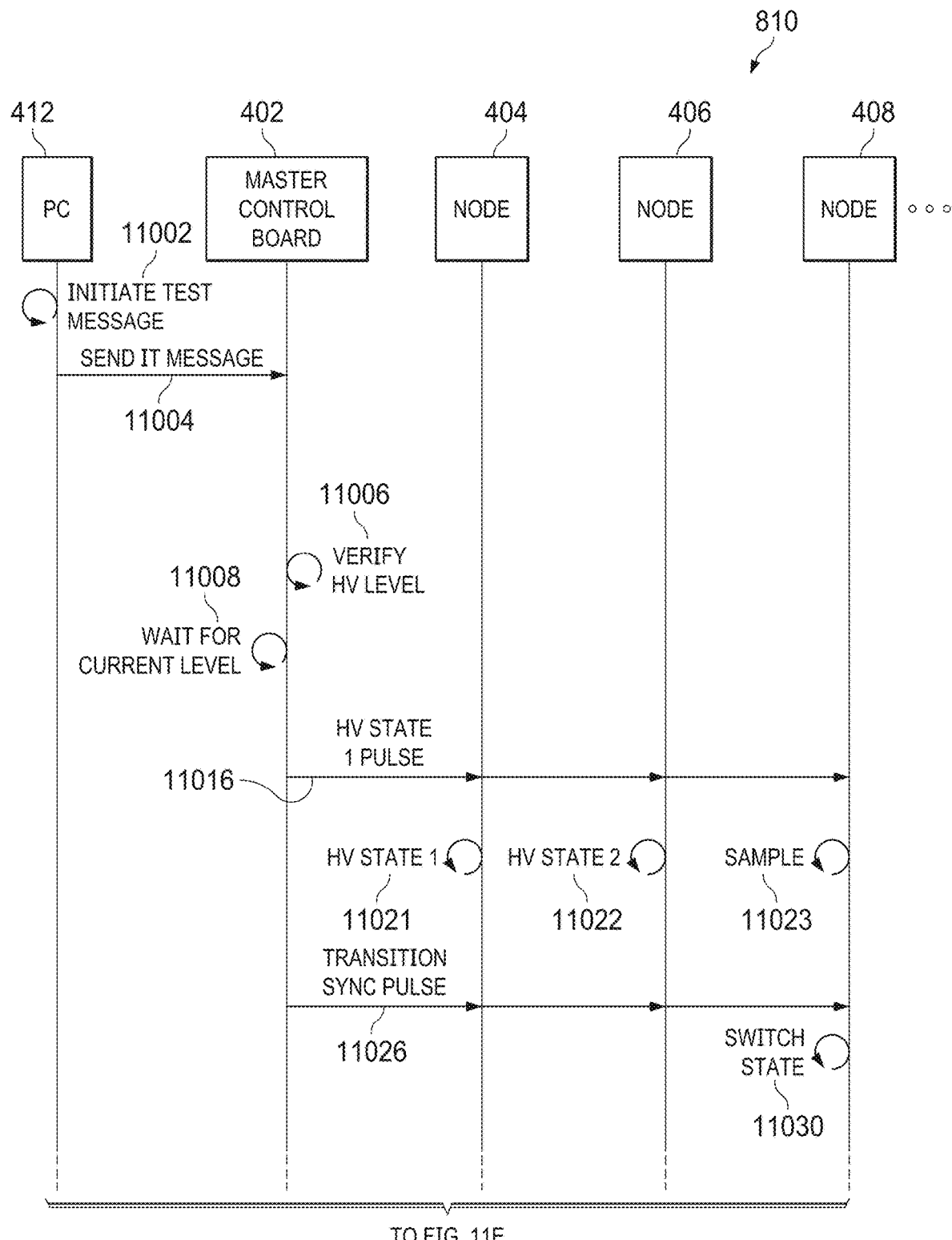
FIG. 11D is a preferred embodiment of a method of taking ERT test data.
Figure 11E:
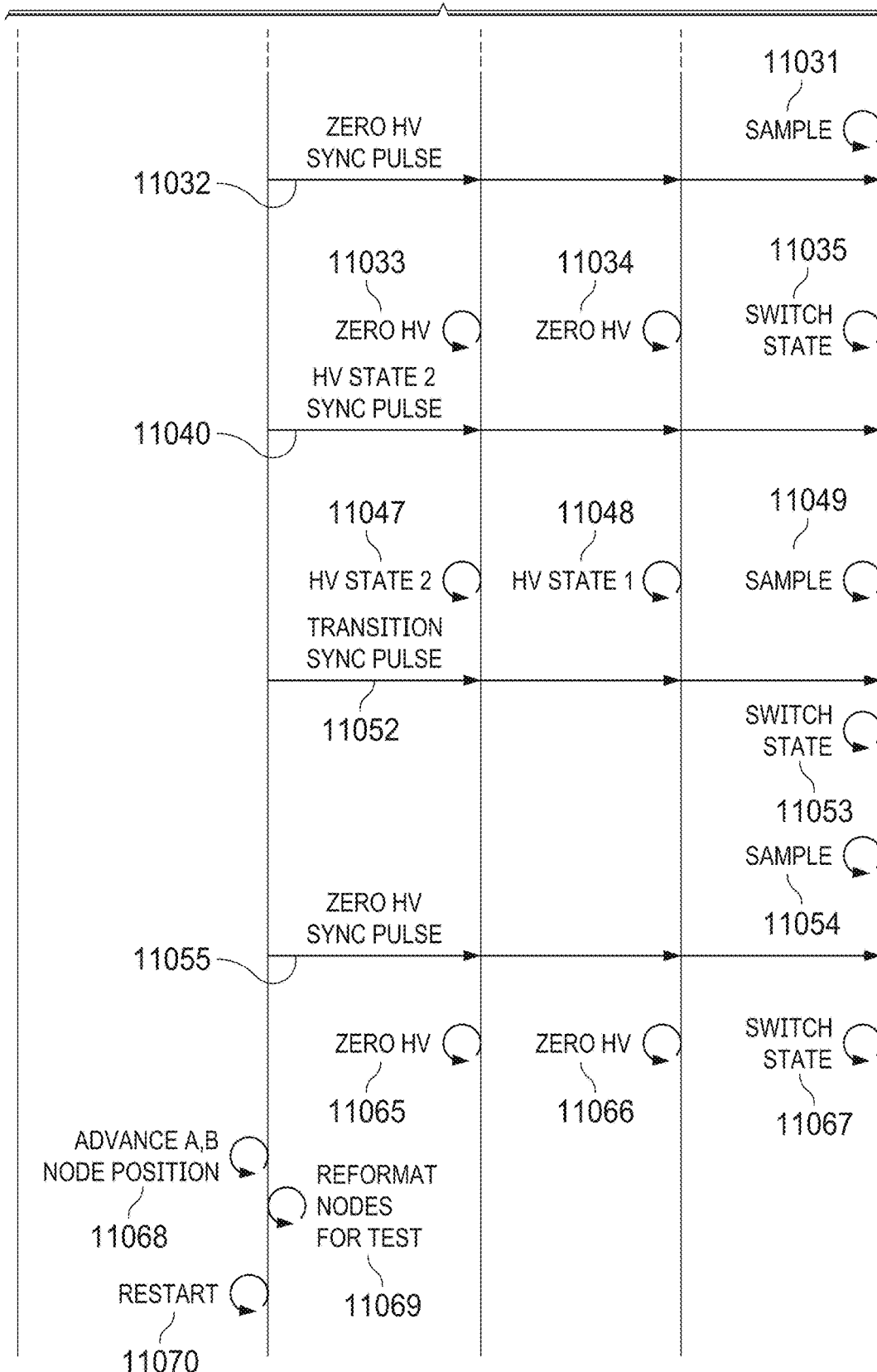
FIG. 11E is a preferred embodiment of a method of taking ERT test data.

Referring to FIGS. 11D and 11E, an alternate method of taking data by a node string of step 810, will be further described. In this example, node 404 is configured as a node type "A", node 406 is configured as node type "B" and node 408 is configured as a measurement node type. In this example, the circuits of FIGS. 5B and 6B are employed.

At step 11002, PC controller 412 generates an initiate test message. At step 11004, PC controller 412 sends the initiate test message to master control board 402.

At step 11006, master control board 402 verifies the current and voltage levels present at the high voltage supply by reading current sense resistor 5052 and voltage resistor divider 5054, respectively. At step 11008, master control board 402 waits for the current level to reach a predetermined value, as previously.

At step 11016, master control board 402 sends a high voltage state 1 sync pulse on the RS485 sync line. In each connection to the high voltage supply line, cross conduction logic 6067 delays connection by a sufficient time to allow discharge of each MOSFET.

At step 11021, node 404 activates high voltage state 1. In a preferred embodiment, node 404 activates high voltage MOSFET 6055 and high voltage relay 6059 to connect to the positive high voltage signal to stake connection 6046.

At step 11022, node 406 activates high voltage state 2. In a preferred embodiment, node 406 activates high voltage MOSFET 6057 and high voltage relay 6059 to connect to the negative high voltage signal to stake connection 6046.

At step 11023, node 408 participates in taking two measurement samples in its original node type configuration. In this example, node 408 would be set to an "LM" node type assignment and so direct its stake connection to the next upstream node for measurement.

Referring again to FIG. 6B, switch and relay settings for the various node type assignments are shown in Table 6 below.

TABLE 6

| Node Type | 6055 | 6057 | 6048 | 6052 | 6056 | 6060 | 6112 | 6114 | 6059 |
|---|---|---|---|---|---|---|---|---|---|
| A | C | O | O | O | O | O | O | O | C |
| B | O | C | O | O | O | O | O | O | C |
| P | O | O | O | O | C | C | C | C | O |
| M | O | O | C | O | O | O | O | O | O |
| N | O | O | O | C | O | O | C | C | O |
| LM | O | O | C/O/O | O/C/C | O | O | O/C/C | O/C/C | O |
| LN | O | O | O/C/C | C/O/O | O | O | C/O/O | C/O/O | O |
| SM | O | O | C/C/O | O/O/C | O | O | O/O/C | O/O/C | O |
| SN | O | O | O/O/C | C/C/O | O | O | C/C/O | C/C/O | O |
| S | O | O | O | O | O | O | O | O | O |

When the auto scaling resistor divider networks 6104 and 6106 are used, switch and relay settings for the various node type assignments are shown in Table 7 below:

TABLE 7

| Node Type | 6055 | 6057 | 6048 | 6052 | 6056 | 6060 | 6108 | 6110 | 6100 | 6102 | 6112 | 6114 | 6059 |
|---|---|---|---|---|---|---|---|---|---|---|---|---|---|
| A | C | O | O | O | O | O | O | O | O | O | O | O | C |
| B | O | C | O | O | O | O | O | O | O | O | O | O | C |
| P | O | O | O | O | C | C | O | O | O | O | C | C | O |
| M | O | O | C | O | O | O | O | O | O | O | O | O | O |
| N | O | O | O | C | O | O | C | C | O | O | O | O | O |
| LM | O | O | C/O/O | O/C/C | O | O | O/C/C | O/C/C | O/C/C | O/C/C | O | O | O |
| LN | O | O | O | C/O/O | O | O | C/O/O | C/O/O | C/O/O | C/O/O | O | O | O |
| SM | O | O | C/C/O | O/O/C | O | O | O/O/C | O/O/C | O/O/C | O/O/C | O | O | O |
| SN | O | O | O/O/C | C/C/O | O | O | C/C/O | C/C/O | C/C/O | C/C/O | O | O | O |
| S | O | O | O | O | O | O | O | O | O | O | O | O | O |

At step 11026, master control board 402 transmits a transition sync pulse to the nodes on the RS485 sync line.

At step 11030, node 408, in response to the transition sync pulse toggles its node type assignment, as previously described.

At step 11031, node 408 participates in taking two samples in its new node type configuration.

At step 11032, master control board 402 sends a zero high voltage sync pulse on the RS485 sync line. As a result, at step 11033, node 404 disconnects the high voltage. Likewise, common node 406, at step 11034 disconnects the high voltage. At step 11035, node 408 toggles back to its original node type configuration, as previously described.

At step 11040, master control board 402 sends a high voltage state 2 sync pulse on the RS485 sync line. As a result, at step 11047 activates high voltage MOSFET 6057 and high voltage relay 6059 to supply negative high voltage to stake connection 6046. At step 11048, node 406 activate high voltage MOSFET 6055 and closes high voltage relay 6059 to supply high voltage to stake connection 6046.

At step 11049, node 408 participates in taking two measurement samples in its original node type configuration.

At step 11052, master control board 402 sends a second transition sync pulse to the node, as previously described. At step 11053, node 408 switches its node state to its new node state node type configuration. At step 11054, node 408 participates in taking measurement samples and its new node type configuration.

At step 11055, master control board 402 sends a zero high voltage sync pulse to the nodes. As a result, at step 11065, node 404 disconnects the high voltage from the state connection by turning off high voltage MOSFET 6057 and opening high voltage relay 6059. Likewise, at step 11066, node 406 disconnects the high voltage from the stake connection by turning off high voltage MOSFET 6055 and opening high voltage relay 6059. At step 11067, node 408 returns to its original node type configuration.

At step 11068, master control board 402 advances the "A" and "B" node position upstream, to gather data for the next test channel, as will be further described.

At step 11069, master control board 402 reformats all nodes for the next upstream test channel in the survey, as previously described. At step 11070, master control board 402 restarts the test procedure returning to step 11016 and repeating 11006-11069 steps until the survey is complete.

Referring to FIG. 11C, a method of self-calibration, of step 1105 will be further described.

At step 1171, master control board 402 sets switch network 569 to its "calibrate" position. In the calibrate position, switch network 569 is disconnected from voltage reference 570 and ADC 572 and connects voltage reference 570 to outbound positive voltage measurement line 567.

At step 1172, master control board 402 generates a calibrate command data packet, addressed to the first upstream node.

At step 1173, master control board 402 sends the calibrate command data packet to node 404.

At step 1174, node 404 opens the calibrate command data packet and confirms that it is the node to which the packet is addressed. If so, it then sets its calibrate switch positions. In practice, switch network 627 is set to disconnect voltage reference 628 from ADC 616. Switch network 627 is then set to connect positive voltage measurement line 567 to voltage reference pin 677 of ADC 616. This effectively connects voltage reference 570 of the master control board to voltage reference pin 677 of ADC 616 in node 404.

At step 1175, node 404 calibrates its ADC from the voltage reference pin 677. Once calibrated, node 404 generates acknowledge packet at step 1176. At step 1177, node 404 sends the acknowledge packet to master control board 402.

At step 1178, master control board 402 generates a second calibrate command data packet instructing node 404 to reset its calibration switch positions. At step 1179, master control board 402 forwards the calibrate command packet to node 404. At step 1180, node 404 resets its calibration switch positions. In practice, node 404 sets switch network 627 to connect voltage reference 628 to reed relay 630. Node 404 further closes reed relay 630 effectively connecting voltage reference 628 to outbound positive voltage measurement output 629.

At step 1181, node 404 advances the address in the command packet to the next upstream node and changes the payload to indicate proper calibration switch positions for node 406. At step 1182, node 404 forwards the command packet to node 406. At step 1183, node 406 receives the command packet and sets its calibration switch positions. In practice, node 406 sets switch network 627 to disconnect voltage reference 628 from voltage reference pin 677 of ADC 616. Node 406 then sets switch network 627 to connect positive voltage measurement line 567 to voltage reference pin 677 of ADC 616. This effectively connects the voltage reference of node 404 to the voltage reference pin of ADC 616 in node 406.

At step 1184, node 406 calibrates its ADC. At step 1185, node 406 generates an acknowledgment packet. At step 1186, node 406 forwards the acknowledge packet to node 404. At step 1187, node 404 forwards the acknowledge packet to master control board 402 using DMA.

At step 1188, master control board 402 compares the original address of the acknowledge packet to the address of the maximum node. If the address does not match, the master control board returns to step 1178 and repeats the process until all nodes are calibrated. If the address does match, then the master control board moves to step 1189 where it returns.

The self-calibration routine is important because it enables the tolerance of each downstream device to be translated through the measurement system to the adjoining upstream device which then can mathematically compensate the measured values to the exact voltage injected. In this way, a known value with a very low ppm tolerance can be sent into the adjoining node and used to scale the resistive divider of each ADC exactly.

FIGS. 11F, 11G and 11H show an example of a method of taking data by a node string in pseudocode.

Figure 12:
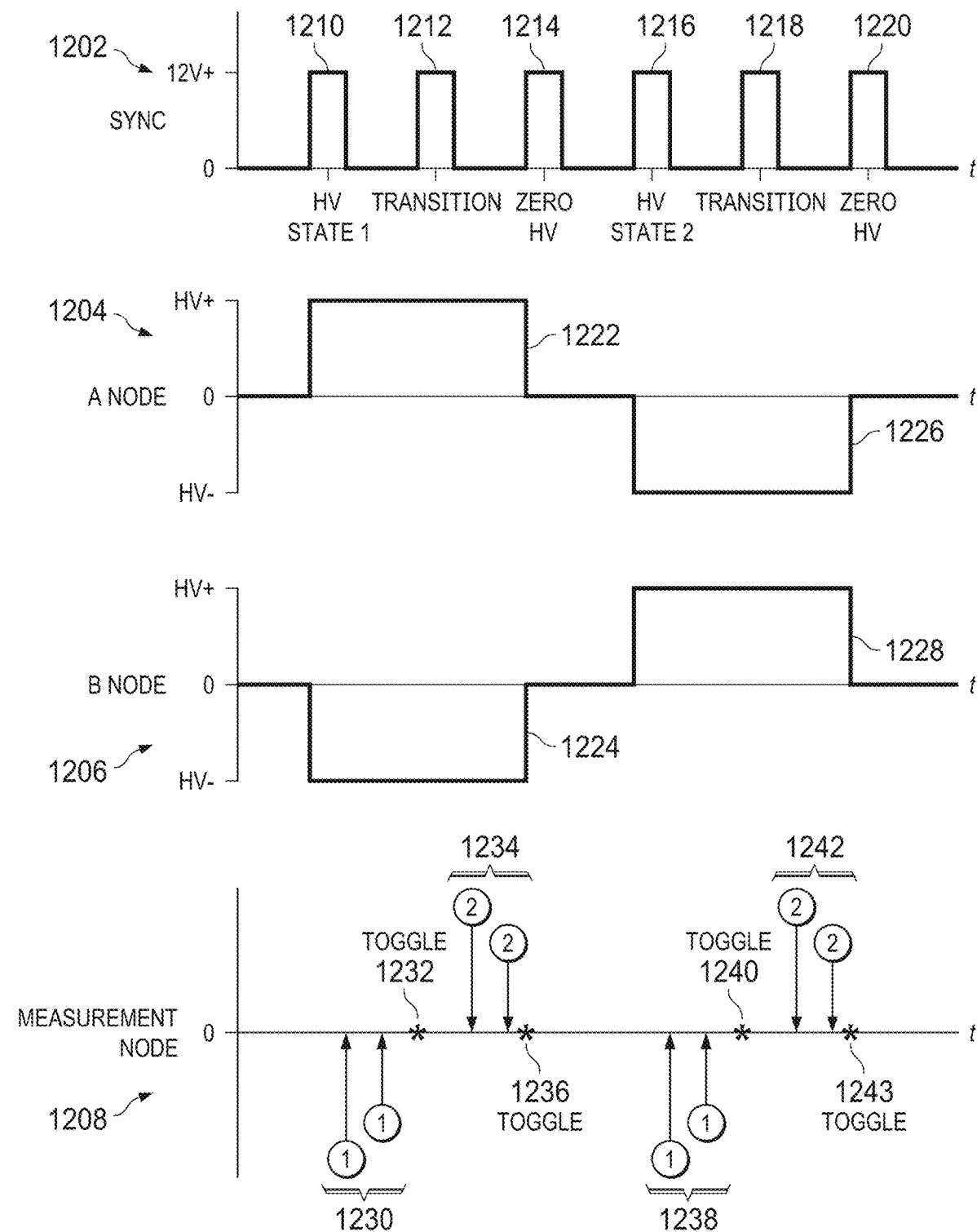
FIG. 12 is a signal timing chart for taking ERT test data of a preferred embodiment.

Referring to FIG. 12, a sync pulse timing diagram will be described. The sync pulses are triggered by the master control board and take place on 28V DC supply line 555 or by the master control board sending a sync signal on the dedicated RS485 sync line.

With reference to axis 1202, the sync pulse train will be described. With reference to axis 1204 the positive high voltage and negative high voltage waveforms at the "A" type node configuration will be described. With reference to axis 1206, the positive high voltage and negative high voltage waveforms at the "B" type node configuration will be described. With reference to axis 1208, node actions responsive to the sync pulses at a measurement node will be described.

High voltage state 1 sync pulse 1210 triggers high voltage pulse 1222 at the "A" node and negative high voltage pulse 1224 on the "B" node. Likewise, high voltage state 1 sync pulse 1210 triggers two measurements, 1230, at node state 1 at the measurement node.

Transition sync pulse 1212 causes no change at the A node or the B node, but triggers a toggle at the measurement node at 1232. In a toggle, the measurement node resets its measurement switches and relays to change from a first node type configuration to a second node type configuration. In this example, node type configuration "1" is an "M" node type configuration and node type "2" is an "N" node type configuration. However, any pairing of node type configurations is possible. Likewise, two measurements in state 2, 1234, at the measurement node are triggered.

At zero high voltage sync pulse 1214, high voltage pulse 1222 is terminated at the A node, as is negative high voltage pulse 1224 at the B node. The measurement node, in response, toggles at 1236 back to node state 1.

At high voltage state 2 sync pulse 1216, the A node produces negative high voltage waveform 1226. The B node produces positive high voltage waveform 1228. The measurement node takes two measurements in state 1 at 1238.

At transition sync pulse 1218, no change occurs at node A or node B. However, the measure node toggles at 1240 back to node state 2. Likewise, the measurement takes two measurements, at 1242.

At zero high voltage sync pulse 1220, the A node terminates negative high voltage waveform 1226. Likewise, the B node terminates positive high voltage waveform 1228. The measurement node toggles at 1243, back to node state 1.

In a preferred embodiment, the sync pulses are 0.5 seconds apart, thereby conducting an entire channel test in approximately 2.5 seconds. Those of skill in the art will recognize that a complete survey of ten test channels can now be conducted in about 25 seconds. This a vast improvement over the prior art. Further, since the test data is sent independently by the nodes using the DMA memory model and an isolated upstream communications channel, there is no delay in transmission or contention for data channel use.

Referring to FIGS. 13A through 13D, an example of interleaving a set of nodes during transition toggling will be further described.

Figure 13A:
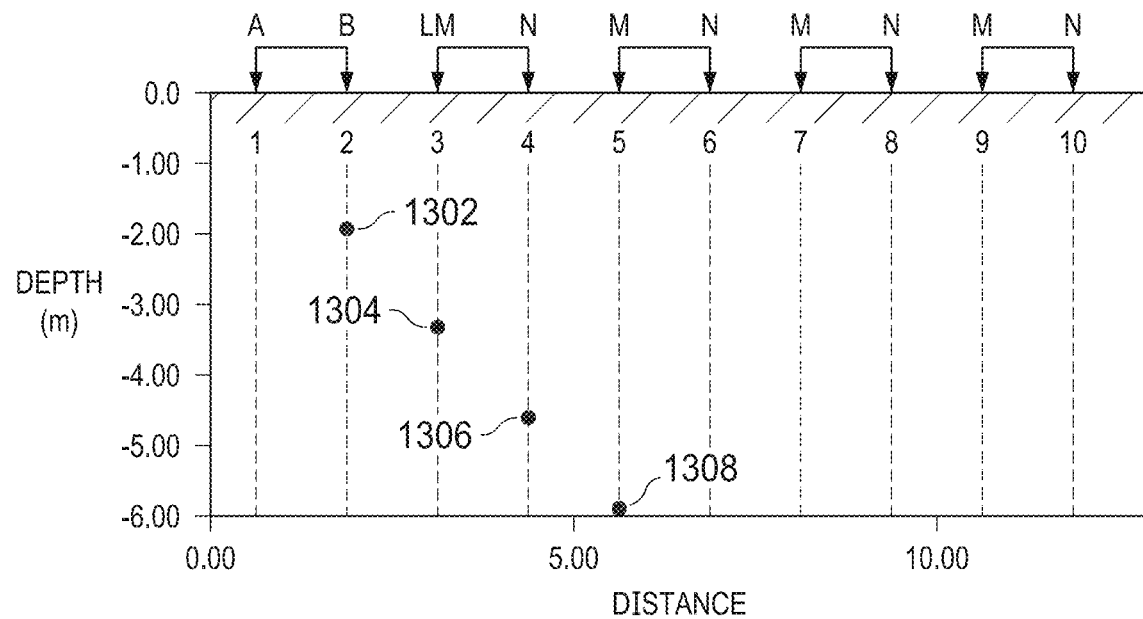
FIG. 13A is a schematic diagram of a method of node interleaving.

Referring to FIG. 13A, the nodes at positions 1 and 2 are assigned to A and B types respectively. The nodes at positions 3 and 4 are assigned node types LM and N respectively. The nodes at positions 5 and 6 are assigned node types M and N, respectively. The nodes at positions 7 and 8 are assigned node types M and N, respectively. The nodes at positions 9 and 10 are assigned node types M and N, respectively.

In the high voltage state 1, measurements will be taken at all N type nodes. In this example, measurements will be taken at node positions 4, 6, 8 and 10, resulting in measurements at positions 1302, 1304, 1306 and 1308, respectively.

Figure 13B:
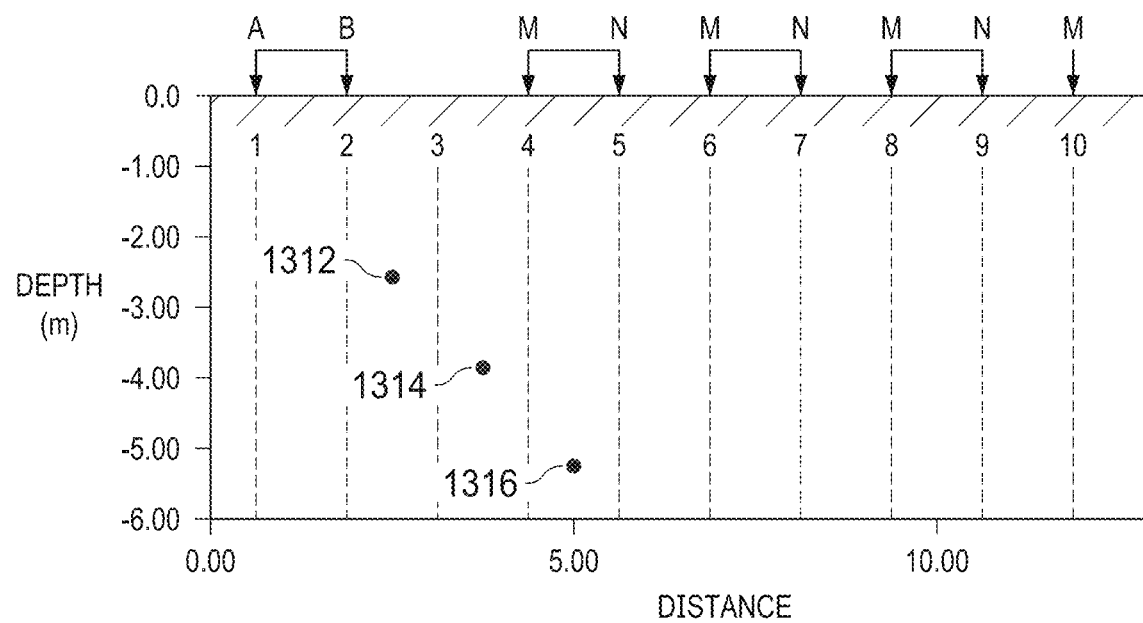
FIG. 13B is a schematic diagram of a method of node interleaving.

Referring to FIG. 13B, node assignments after the first transition sync pulse will be described.

The nodes at positions 1 and 2, remain assigned node types A and B, respectively, at the first transition sync pulse. However, each of the measurement nodes have toggled to a different state. The nodes at position 4 and 5 has toggled to states M and N, respectively. The nodes at position 6 and 7 have toggled to states M and N, respectively. The nodes at position 8 and 9 have toggled to states M and N, respectively. Likewise, the node at position 10 has toggled from an N to an M state.

In the high voltage state 1, measurements will be taken at all N type nodes. In this example, measurements will be taken at node positions 5, 7 and 9, resulting in measurements at positions 1312, 1314 and 1316, respectively.

Figure 13C:
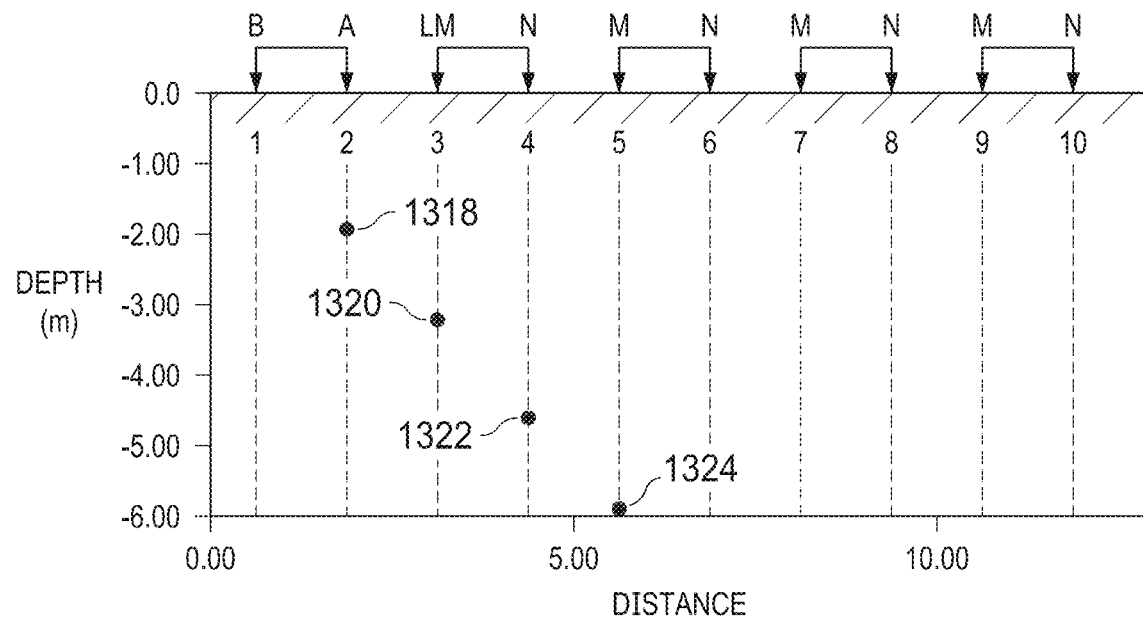
FIG. 13C is a schematic diagram of a method of node interleaving.
Figure 13D:
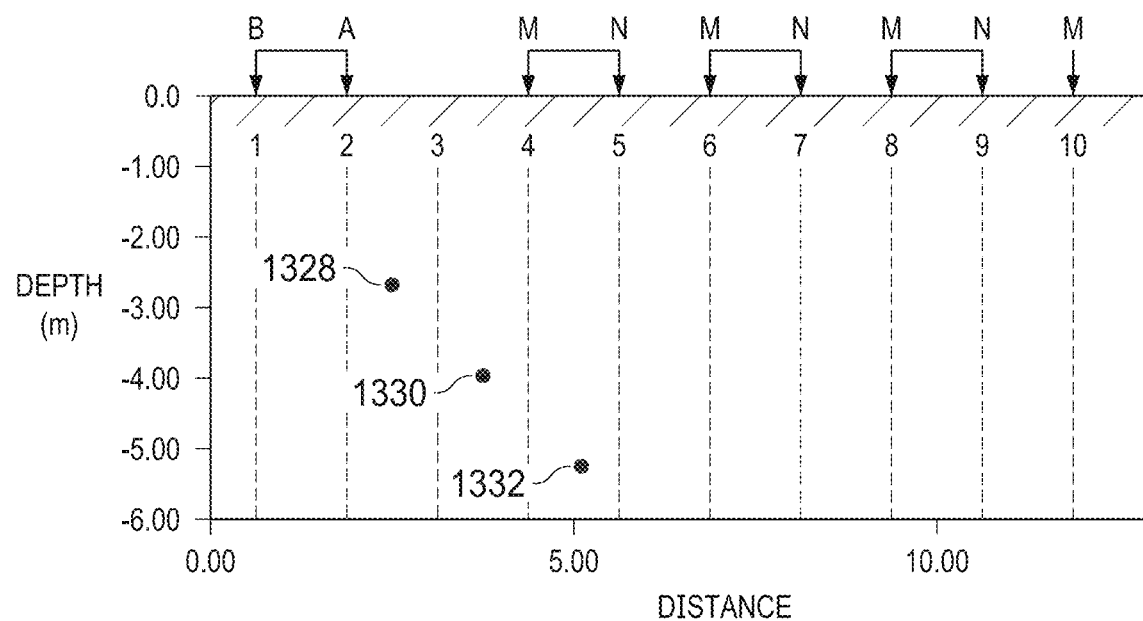
FIG. 13D is a schematic diagram of a method of node interleaving.

Referring to FIG. 13C, the node type assignments after the HV state 2 sync pulse will be described. The nodes at position 1 and 2 are assigned to B and A types, respectively. The nodes at positions 3 and 4 are assigned node types LM and N, respectively. The nodes at positions 5 and 6 are assigned node types M and N, respectively. The nodes at positions 7 and 8 are assigned node types M and N, respectively. The nodes at positions 9 and 10 are assigned node types M and N, respectively.

In the high voltage state 2, measurements will be taken at all N type nodes. In this example, measurements will be taken at node positions 4, 6, 8 and 10, resulting in measurements at positions 1318, 1320, 1322 and 1324, respectively Referring to FIG. 13D, the node assignments after the second transition sync pulse will be described.

The nodes at positions 1 and 2, remain assigned node types B and A, respectively. However, each of the measurement nodes has toggled to a different state. The nodes at position 4 and 5 have toggled to states M and N, respectively. The nodes at position 6 and 7 have toggled to states M and N, respectively. The nodes at position 8 and 9 have toggled to states M and N, respectively. Likewise, the node at position 10 has toggled from an N to an M state.

In the high voltage state 2, measurements will be taken at all N type nodes. In this example, measurements will be taken at node positions 5, 7 and 9, resulting in measurements at positions 1328, 1330 and 1332, respectively.

The method of interleaving is important because it increases the amount of data that can be taken in each channel test. The method of switching polarity at the current injection nodes is important because it aids in deionizing the soil.

Figure 14:
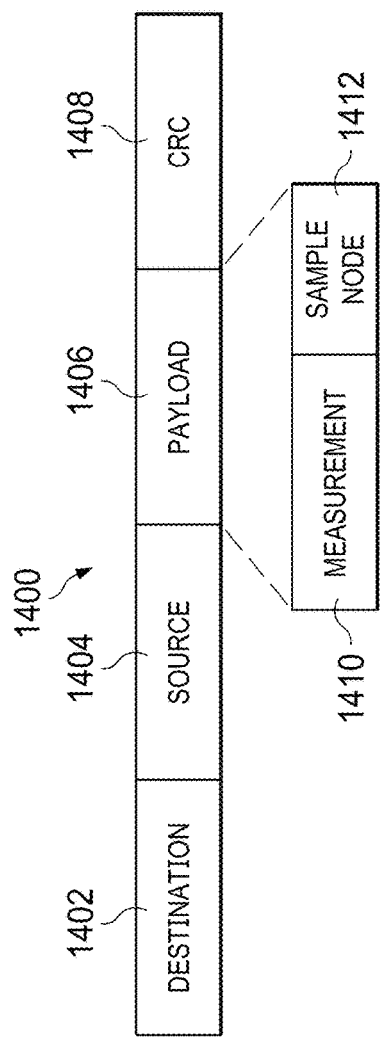
FIG. 14 is a schematic diagram of a data communication packet.

FIG. 14 shows a memory model for each packet of measurement data sent from the N type nodes to the master control board by DMA.

Packet 1400 includes destination 1402, source section 1404, payload section 1406, and CRC section 1408. The destination section includes a 4 byte address of the processor to which the node is sending the packet. Source section 1404 includes a 4 byte address of the node sending the packet. Payload section 1406 includes a 2 byte payload which includes a measurement section 1410 and a sample node under section 1412. Measurement section 1410 includes the digital measurement taken from ADC 616 during the measurement step. Section 1412 includes a 4 byte sample number. In a preferred embodiment, the sample numbers include 1 through 4. CRC section 1408 includes a 4 byte summation of the destination source and payload sections.

Figure 15:
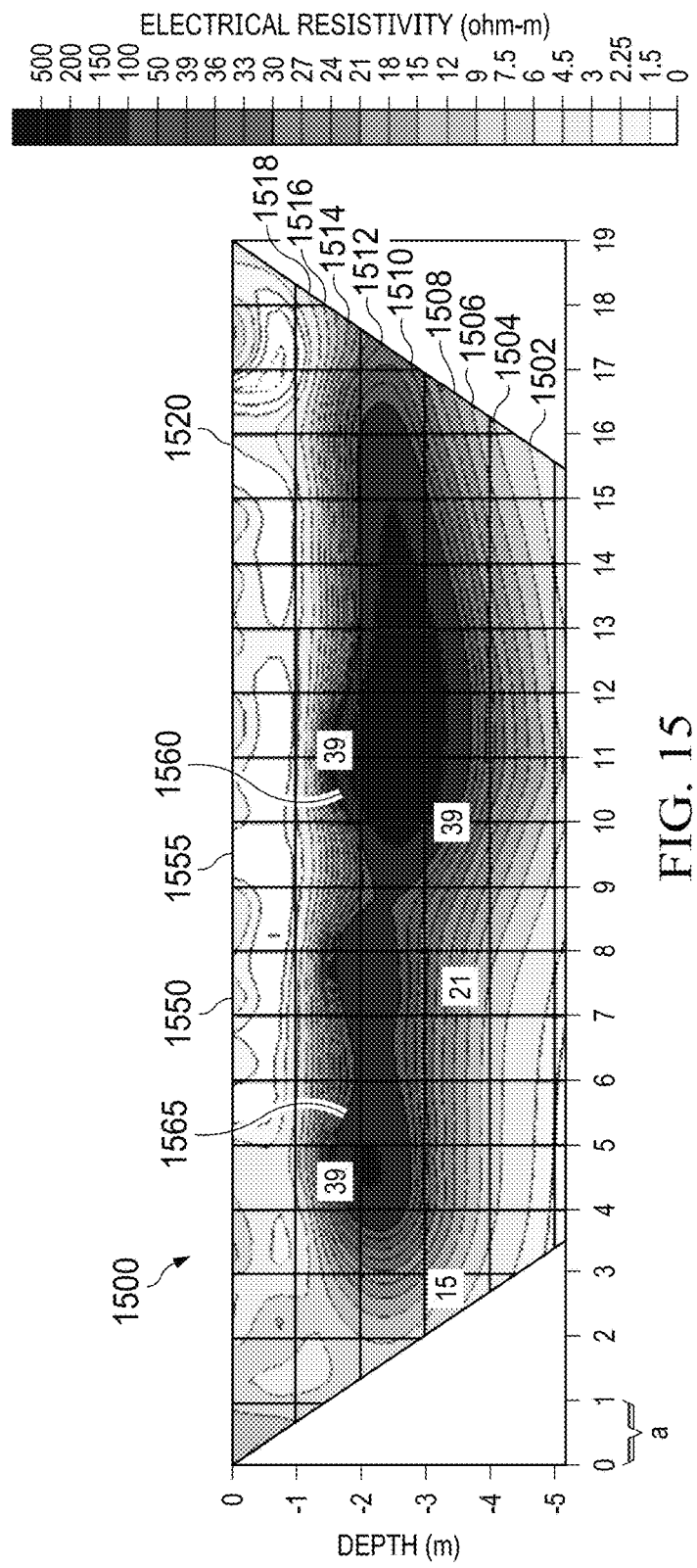
FIG. 15 is a test result ERT map resulting from a field test of a preferred embodiment.
Figure 16A:
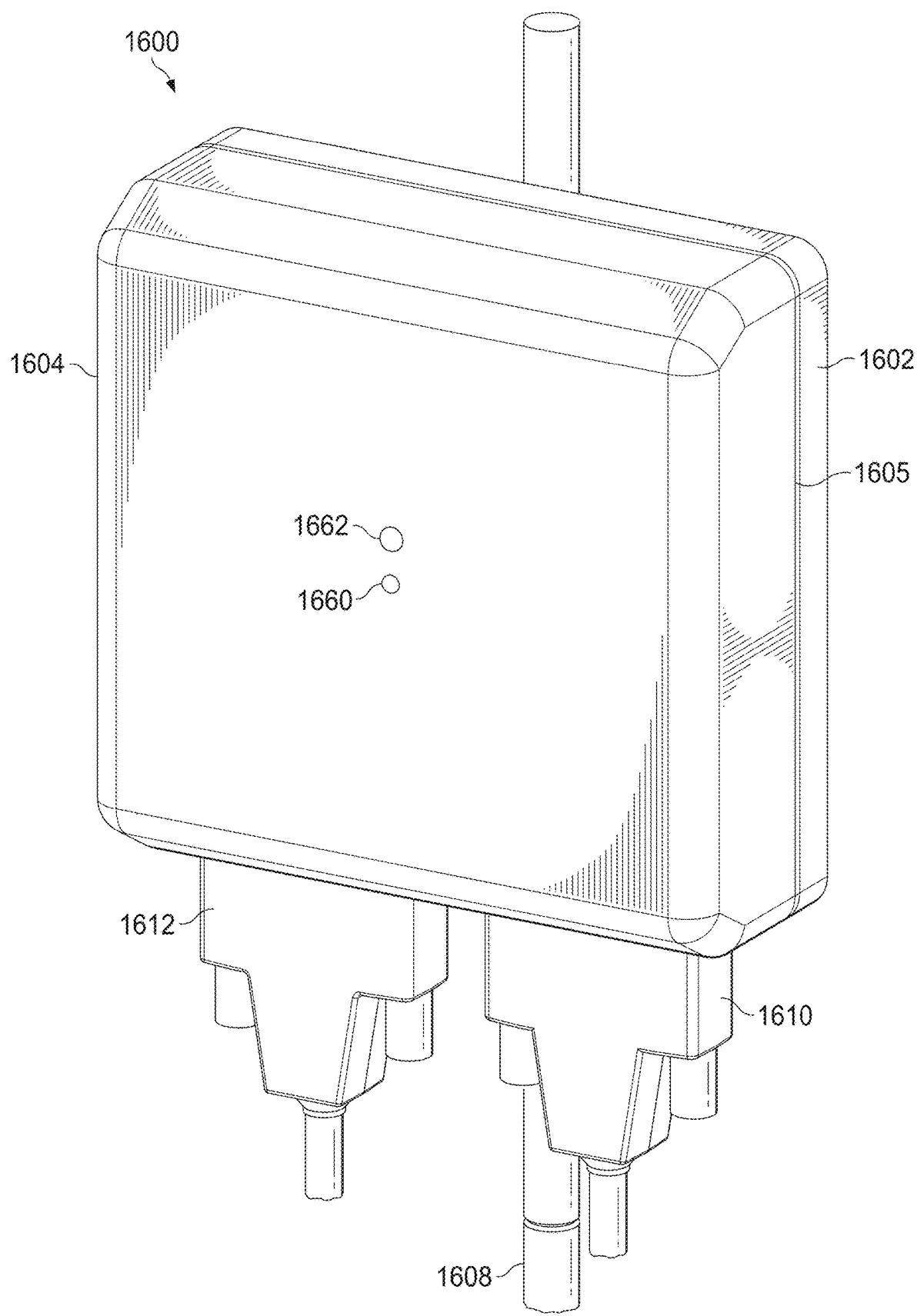
FIG. 16A is an isometric view of a node housing for a preferred embodiment.
Figure 16B:
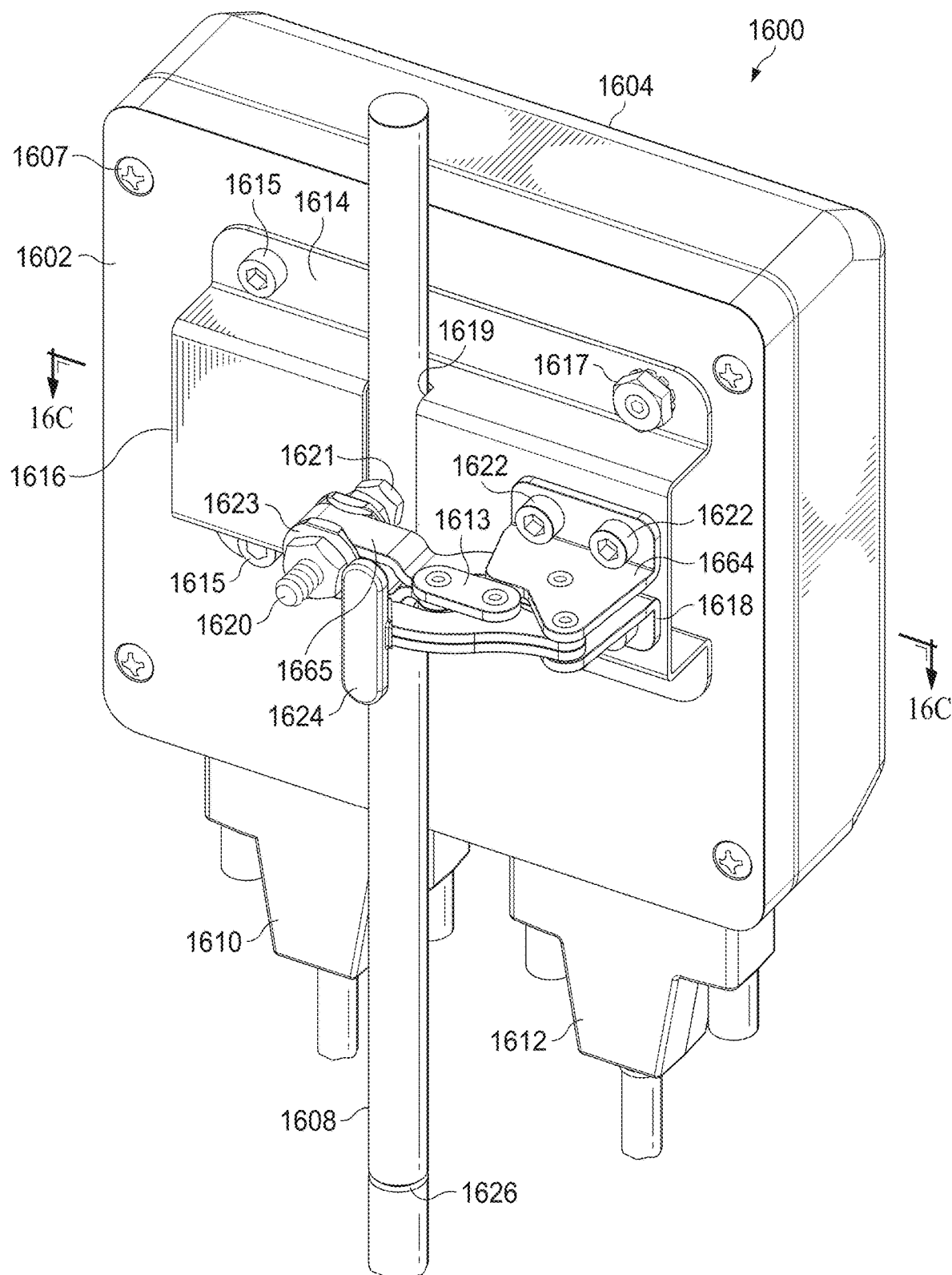
FIG. 16B is an isometric view of a node housing for a preferred embodiment.
Figure 16C:
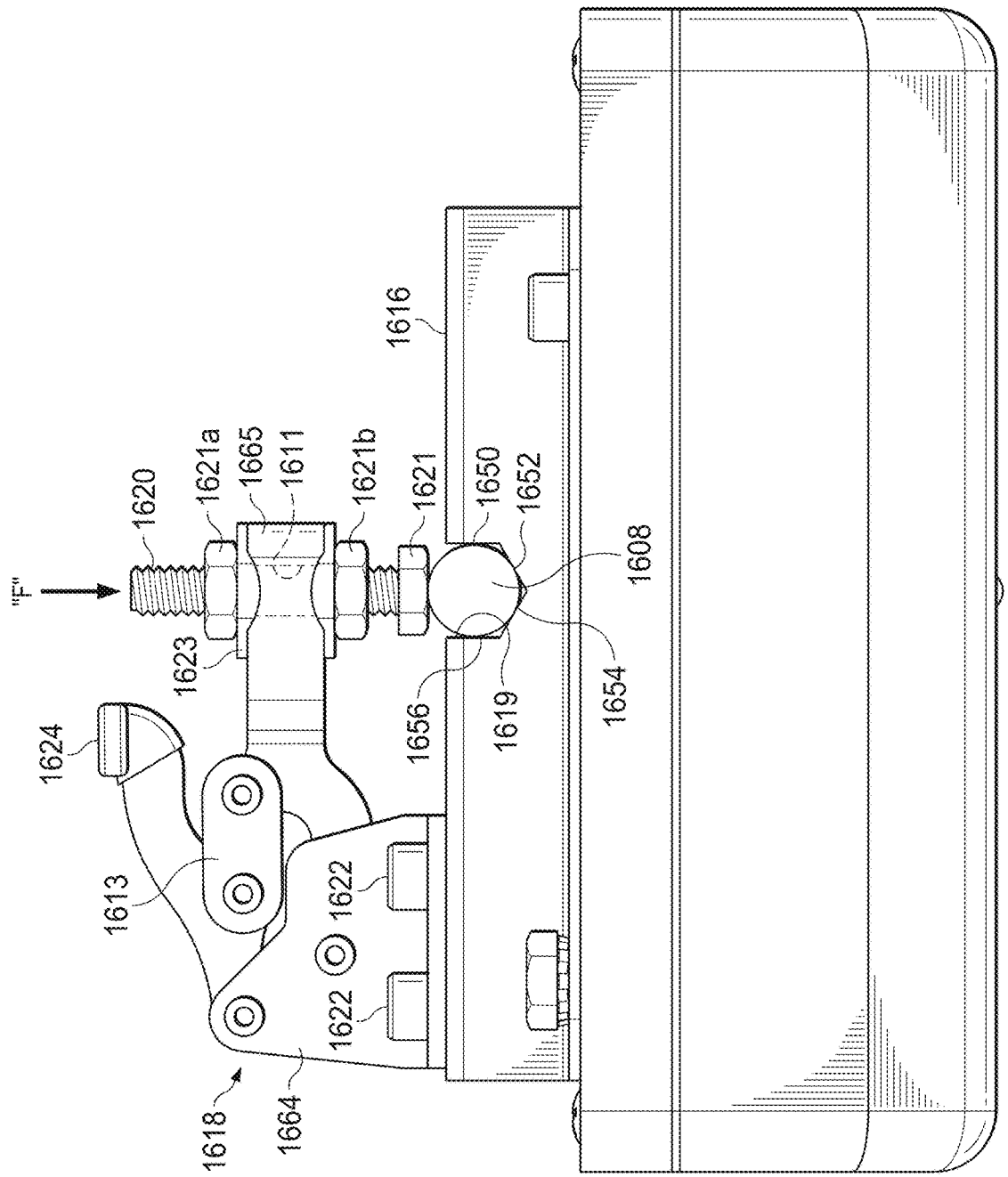
FIG. 16C is a partial section view of a node housing along lines C-C.
Figure 16D:
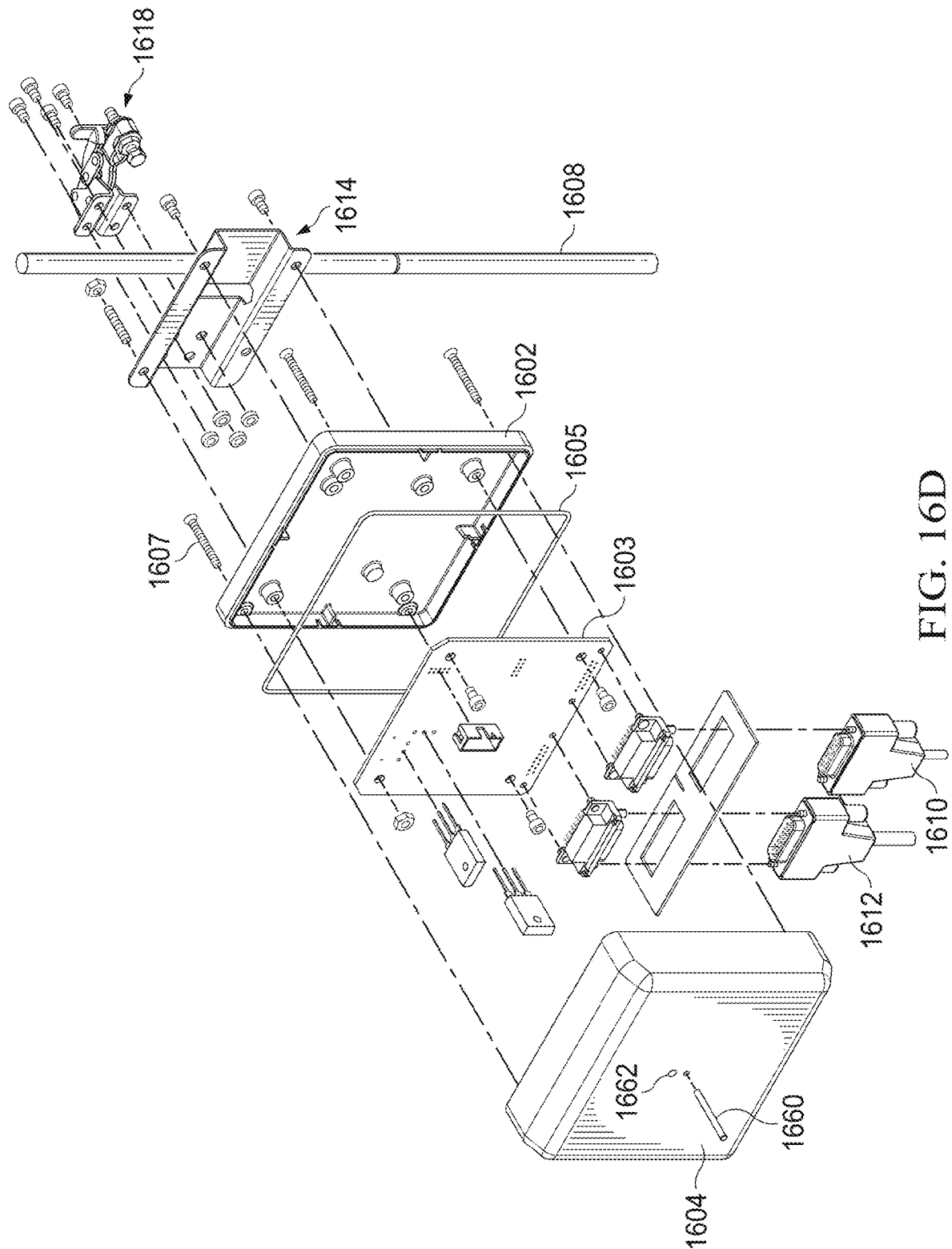
FIG. 16D is an exploded view of a node housing for a preferred embodiment.

Referring to FIG. 15, potential map 1500 will be described.

PC controller 412 processes the data received from the master control board at step 816. After processing, as previously described, potential map 1500 results. Potential map 1500 is a result of the survey that has eighteen nodes at positions 1 through 19. Equipotential lines 1502, 1504, 1506, 1508, 1510, 1512, 1514, 1516, 1518 and 1520 indicate electrical resistivity profiles ranging from about 18 Ohms/meter to about and 200 Ohms/meter, at depths ranging from about 0 to about 5 meters below the surface. Each of the nodes is placed at an internode spacing of about 1 meter. Low resistivity readings at 1550 and 1555 indicate potential moisture in the soil. High resistivity readings at position 1560 and 1565 indicate high resistivity readings indicating high density anomalies such as rocks or concrete.

Referring to FIGS. 16A, 16B, 16C and 16D, preferred node housing 1600 will be described.

Housing 1600 comprises front panel 1604 and rear panel 1602. Rear panel 1602 supports PCB 1603 by appropriate standoffs. Front panel 1604 is removably secured to rear panel 1602 by a plurality of screws 1607, or a suitable industrial adhesive.

Gasket 1605 is positioned between rear panel 1602 and front panel 1604 and provides a watertight seal for the interior of the housing. Downstream cable connector 1612 and upstream cable connector 1610 are provided at the base of the container with appropriate watertight connections to the interior for further connection to PCB 1603.

Front panel 1604 further includes indicator lights 1660 and 1662 which are both operatively connected to PCB 1603, for indication of status. Stake mount bracket 1614 is fitted to rear panel 1602 with mounting screws 1615 and high voltage supply post 1617. When in use, high voltage supply post 1617 is connected to PCB 1603 for communication of a high voltage signal to the stake mount bracket.

Stake mount bracket 1614 further comprises raised channel 1616 which, in a preferred embodiment, is horizontally positioned across the back of the rear panel. Raised channel 1616 further includes hexagonal clamp channel 1619. In a preferred embodiment, hexagonal clamp channel 1619 is vertically positioned with respect to housing 1600. The hexagonal clamp channel is sized to accommodate the diameter of the stake to within ±1/10 inch tolerance.

The shape of the hexagonal channel is important because it provides a self-centering placement of stake 1608 in the hexagonal channel due to pressure from adjustment bolt head 1621, thereby creating a positive and secure mechanical and electrical contact at points 1650, 1652, 1654 and 1656. Further, since the stake contacts the hexagonal channel in four (4) places in at least two vertical positions, the hexagonal channel prevents rotation of housing about the longitudinal and latitudinal axes of the stake.

Stake 1608 is positioned within hexagonal clamp channel 1619 and held in position by toggle clamp 1618.

Toggle clamp 1618 further comprises base bracket 1664, pivotally connected to engagement link 1665 and crank 1624. Engagement link 1665 is pivotally connected to crank 1624 by coupler 1613.

Base bracket 1664, engagement link 1665, crank 1624 and coupler 1613 cooperate to form a 4-bar linkage. Base bracket 1664 is rigidly connected to raised channel 1616 with mounting screws 1622. Engagement link 1665 includes bolt hole 1611, positioned generally perpendicular with hexagonal clamp channel 1619. Collar 1623 is seated in bolt hole 1611. Collar 1623 accommodates adjustment bolt 1620. Adjustment bolt 1620 includes bolt head 1621. Adjustment bolt 1620 is held in position by lock nuts 1621a and 1621b adjacent collar 1623.

Adjustment bolt 1620 and lock nuts 1621a and 1621b are positioned centrally with respect to the raised channel so as to equalize the pressure exerted by bolt head 1621 on stake 1608 when the toggle clamp is in a closed position.

In a preferred embodiment, toggle clamp 1618 is operated by crank 1624. Toggle clamp 1618 is closed by depressing crank 1624, whereby toggle clamp 1618 forces stake 1608 firmly into hexagonal clamp channel 1619, through force "F", thereby creating an electrical contact between the stake mount bracket, the high voltage supply post and stake 1608. When crank 1624 is released, the adjustment bolt moves away from stake 1608 allowing housing 1600 to be removed from stake 1608 and disengaging the stake from electrical contact with stake mount bracket 1614 and high voltage supply post 1617.

Stake 1608 is further provided with gradations 1626. In a preferred embodiment, gradations 1626 are placed at 6" intervals along the length of the stake to indicate the depth into the ground that the stake has been driven. In a preferred embodiment, the stake is a ¾" diameter round stainless steel rod about 4' long.

Figure 17A:
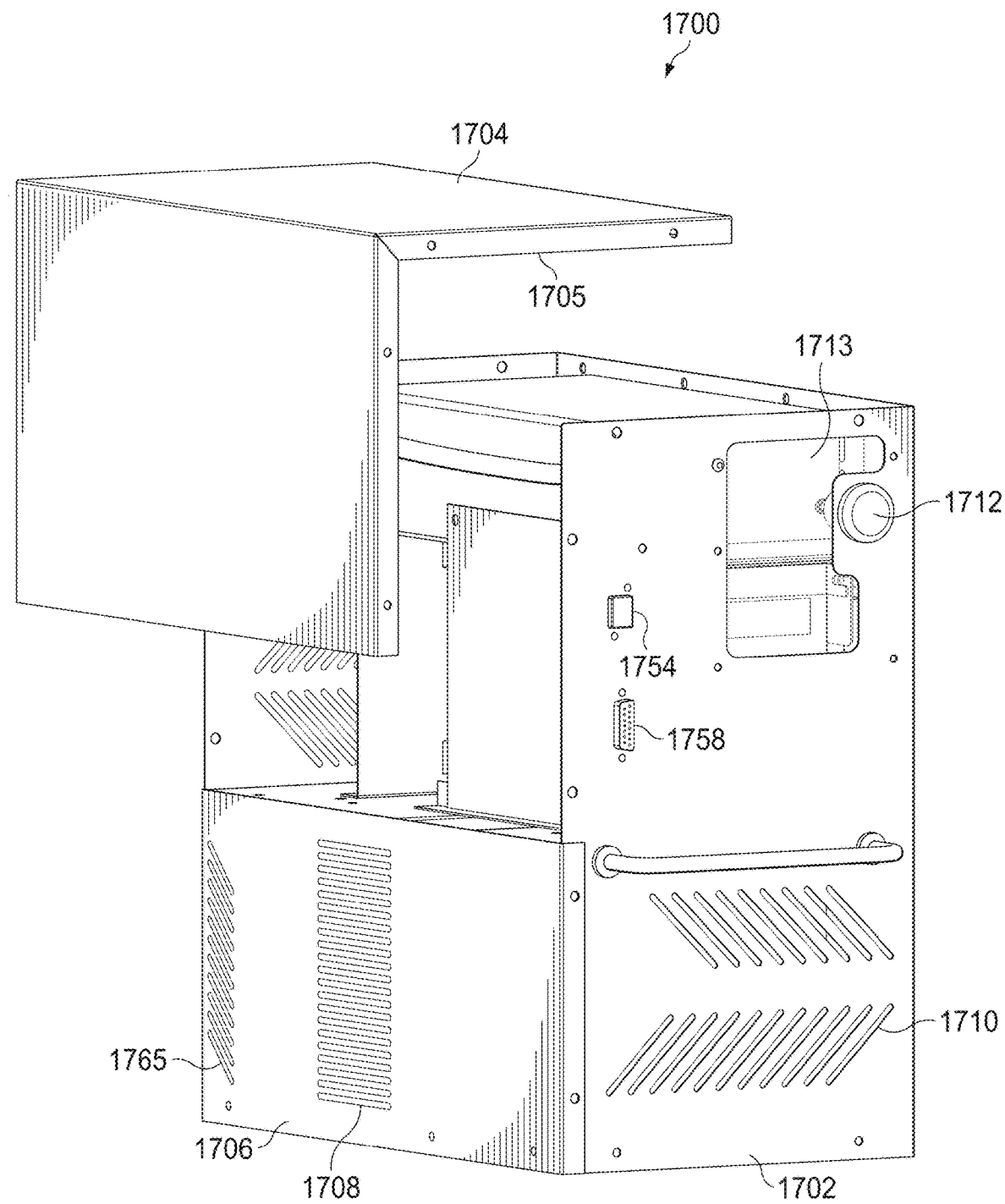
FIG. 17A is an isometric exploded view of a preferred system enclosure.
Figure 17B:
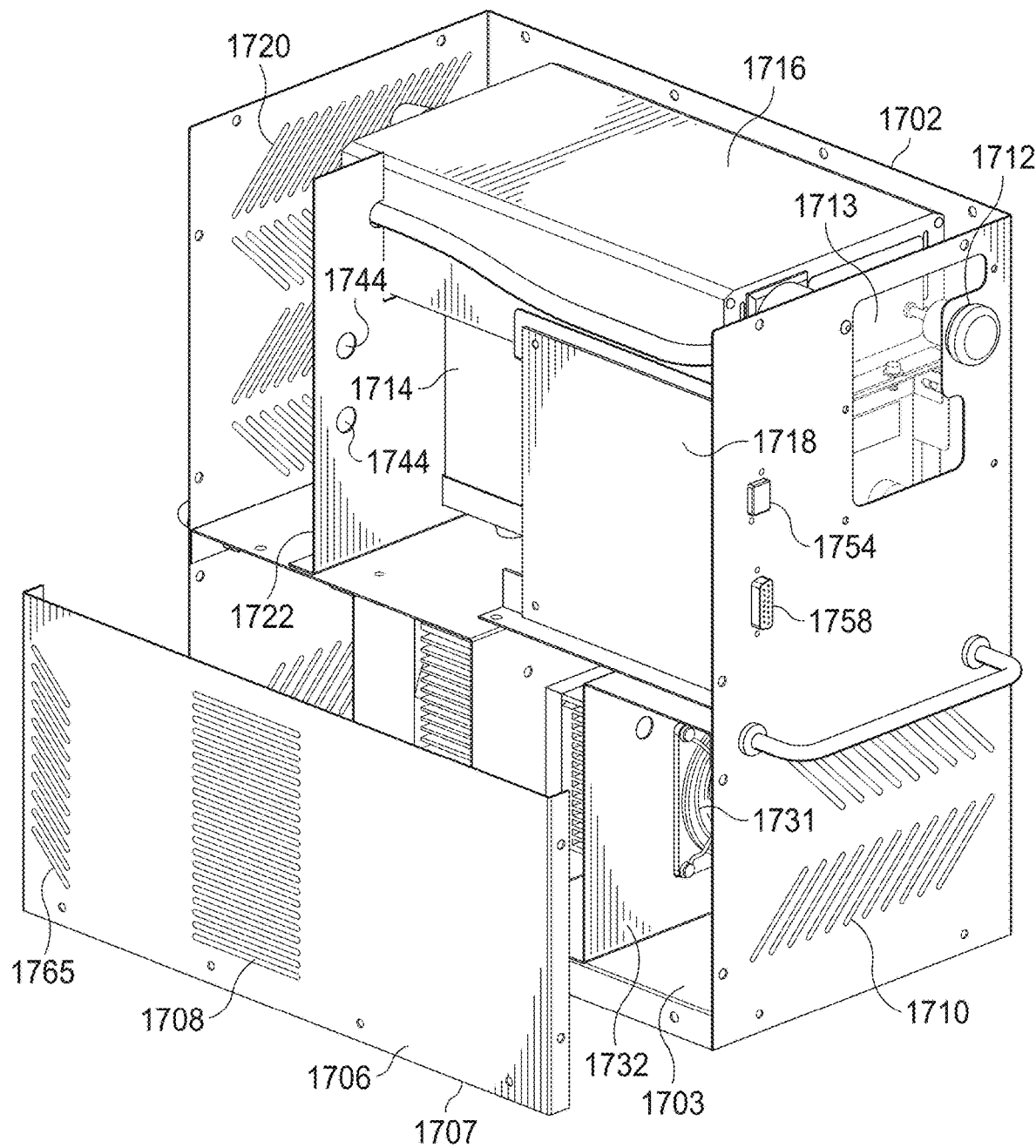
FIG. 17B is an isometric exploded view of a preferred system enclosure.
Figure 17C:
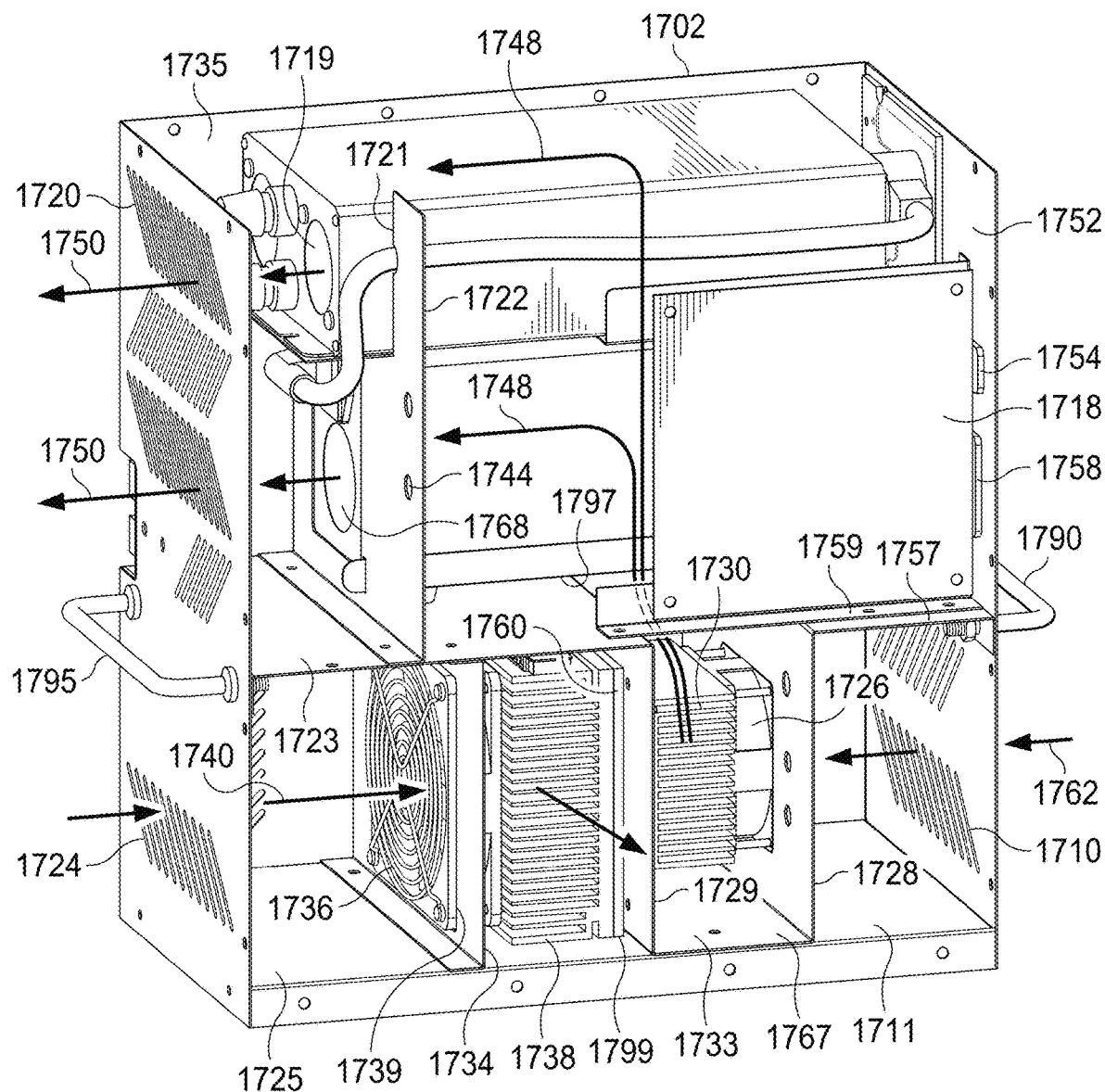
FIG. 17C is an isometric view of a preferred system enclosure.

Referring to FIGS. 17A, 17B and 17C a preferred embodiment of system housing 1700 will be described.

System housing 1700 includes enclosure 1702. Enclosure 1702 further comprises base 1703, removable side panel 1706 and top cover 1704. The enclosure, the side panel and the top cover is preferably 0.8 mm stainless steel. The interior surface of top cover 1704 includes insulated radiant barrier 1705. In a preferred embodiment, insulated radiant barrier 1705 is a 90 mil fiberglass and aluminum foil composite applied with a suitable adhesive. Likewise, side panel 1706 includes insulated radiant barrier 1707 applied to its interior surface. Top cover 1704 and side panel 1706 are removable and are affixed to enclosure 1702 through accessible screws.

Side panel 1706 includes side exhaust vent 1708 and side intake vent 1765. Enclosure 1702 includes front intake vent 1710, rear intake vent 1724 and rear exhaust vent 1720.

Enclosure 1702 encloses and mechanically supports inverter 1716, high voltage supply 1714 and master control board 1718, as will be further described.

Enclosure 1702 includes rear panel 1713 and spring loaded push rod activation button 1712. Rear panel 1713 provides visual access to control functions of the inverter and the high voltage supply. Push rod activation button 1712 controls power activation of inverter 1716 while providing for ease of replacement of the inverter. The push rod configuration is important because it electrically isolates the enclosure from the inverter and further allows removal and replacement of the invertor without replacing an electrical switch connection.

The exterior surface of enclosure 1702 further supports USB connector 1754 and upstream node connector 1758, operatively attached to master control board 1718.

Support bracket 1732 is rigidly attached to the interior of the enclosure. Support bracket 1732 further comprises rear support shelf 1723, rear support column 1729, channel base 1767, forward support column 1728 and forward support shelf 1757. In a preferred embodiment, the support bracket is integrally formed for 0.8 mm stainless steel. Channel base 1767 is riveted or spot welded to base 1703. Rear support shelf 1723 is riveted or spot welded to the interior of enclosure 1702. Likewise, forward support shelf 1757 is riveted or spot welded to the interior of enclosure 1702. Card support channel 1759 is riveted or spot welded to forward support shelf 1757 and rear support shelf 1723. Rear support shelf 1723 further supports interior baffle 1722 and interior baffle 1734. Interior baffle 1722 is riveted to the surface of rear support shelf 1723. Interior baffle 1734 is riveted in between base 1703 and the lower surface of rear support shelf 1723. Handles 1790 and 1795 are bolted in place on the exterior of the enclosure adjacent and under forward support shelf 1757 and rear support shelf 1723, respectively.

Interior baffle 1722 includes opening 1721 sufficient to allow protrusion of inverter 1716 and high voltage supply 1714 at the rear of the enclosure. Interior baffle 1722 further includes internal vents 1744, as will be further described.

Interior baffle 1734 further comprises opening 1739 sufficient to allow protrusion of heat rejection fan 1736 of thermoelectric cooler 1760. Rear support column 1729 further comprises opening 1731, sufficient to allow protrusion of cooling heat sink 1730 of thermoelectric cooler 1760.

Forward support column 1728 further comprises opening 1731, sufficient to allow protrusion of cooling intake fan 1726, as will be further described.

Rear support shelf 1723 further comprises insulated radiant barrier 1705 on its upper surface. Insulated radiant barrier 1705, in a preferred embodiment also encompasses the rear surface of interior baffle 1722.

Forward support column 1728, forward support shelf 1757, base 1703 and the interior of side panel 1706 form front intake duct 1711. Front intake duct 1711 is ductedly connected to front intake vent 1710 in the front of enclosure 1702. Likewise, interior baffle 1734, rear support shelf 1723, base 1703 and the interior of side panel 1706 form rear intake duct 1725. Rear intake duct 1725 is ductedly connected with rear intake vent 1724 and side intake vent 1765, as will be further described. Rear intake duct 1725 is also ductedly connected to side exhaust vent 1708 through heat rejection fan 1736 and heat rejection heat sink 1738.

Forward support column 1728 and rear support column 1729 form cooling duct 1733. Cooling duct 1733 is ductedly connected to front intake duct 1711 through cooling intake fan 1726 and cooling heat sink 1730.

Peltier junction 1799 is fixed between cooling heat sink 1730 and heat rejection heat sink 1738.

Forward support shelf 1757, rear support shelf 1723, interior baffle 1722 and top cover 1704 form cooled compartment 1752. Cooled compartment 1752 is ductedly connected with cooling duct 1733 through portal 1797.

Rear support shelf 1723, interior baffle 1722 and top cover 1704 form exhaust compartment 1735. Exhaust compartment 1735 is ductedly connected to rear exhaust vent 1720 and internal vent 1744, as will be further described.

Thermoelectric cooler 1760 is comprised of large Peltier junction 1799 sandwiched between heat rejection heat sink 1738 and cooling heat sink 1730. Cooling intake fan 1726 is affixed to cooling heat sink 1730. Heat rejection fan 1736 is affixed to heat rejection heat sink 1738.

In use, when current is supplied to Peltier junction 1799, heat is drawn from cooling heat sink 1730 and moved to heat rejection heat sink 1738. Heat rejection fan 1736 and cooling intake fan 1726 are activated. As a result, cooling air is drawn along cool airflow path 1762 through front intake vent 1710 by cooling intake fan 1726. Cooling intake fan 1726 forces incoming air across cooling heat sink 1730 and into cooling duct 1733. Cooling duct 1733 forces air upward through portal 1797 and into cooled compartment 1752, along cool air path 1748, where it draws heat from master control board 1718 and exits through internal vent 1744 into exhaust compartment 1735. Cool air flow path further enters inverter 1716 and high voltage supply 1714 through intake ducts in both components (not shown). Cool airflow path 1762 further flows through these components and exits through inverter heat exhaust fan 1719 and high voltage supply heat exhaust fan 1768. Cool airflow path 1762 then exits through exhaust compartment 1735 forming exhaust air path 1750 through rear exhaust vent 1720.

Heat rejection air path 1740 enters rear intake vent 1724 and side intake vent 1765, and enters rear intake duct 1725. Heat rejection air path 1740 is drawn into thermoelectric cooler 1760 through heat rejection fan 1736. Heat rejection fan 1736 forces ambient air through heat rejection heat sink 1738 of thermoelectric cooler 1760 which exits through side exhaust vent 1708.

In use, the thermoelectric cooler, reduces the temperature of the components in the cooled compartment by between about 15° F. and 20° F. Maintaining inverter 1716, high voltage supply 1714, and master control board 1718 at a reduced temperature is important when the system is used in elevated outdoor temperatures because it reduces variation in the resistive values of the electrical components thereby decreasing error and increasing precision of the measurements taken by the system.

The invention claimed is:

1. A method for collecting geophysical data from a set of electrodes impressed in a ground surface, comprising:
   providing a high voltage source;
   providing a master controller, having a microprocessor and a memory;
   providing a set of nodes, in electrical connection with the set of electrodes;
   providing a high voltage bus, connected to the high voltage source, the master controller and the set of nodes;
   providing an upstream communication bus, connected to the master controller and the set of nodes;
   providing a downstream communication bus, connected to the master controller and the set of nodes;
   providing the memory with a set of instructions, that when executed, cause the master controller to:
      format the set of nodes using the upstream communication bus;
      read a current signal from the high voltage bus;
      programmably distribute a high voltage signal to the set of electrodes from the high voltage bus;
      programmably read a set of voltage measurement values, from the set of electrodes; and
      send the set of voltage measurement values to the master controller using the downstream communication bus; and
   providing the master controller with:
      a current sense resistor, connected to the high voltage bus;
      a high voltage current measurement amplifier connected to the current sense resistor;
      a first digital to analog converter connected to the high voltage current measurement amplifier; and
      a high voltage isolation barrier connected between the first digital to analog converter and the microprocessor.

2. The method of claim 1, further comprising:
   providing the master controller with:
      a voltage resistor divider, connected to the high voltage bus;
      a high voltage measurement amplifier, connected to the voltage resistor divider;
      a second digital to analog converter connected to the high voltage measurement amplifier;
      the high voltage isolation barrier connected between the second digital to analog converter and the microprocessor;
      a digital to analog high voltage adjustment output amplifier, connected to the high voltage source;
      a third digital to analog converter, connected to the digital to analog high voltage adjustment output amplifier; and
      the high voltage isolation barrier, connected between the third digital to analog converter and the microprocessor.

3. The method of claim 2, further comprising:
providing the high voltage isolation barrier with:
a first isolation transceiver connected between the first digital to analog converter and the microprocessor; and
a second isolation transceiver connected between the second digital to analog converter and the microprocessor.

4. The method of claim 1, further comprising:
providing the microprocessor with a direct memory access configuration, operational on the upstream communication bus and the downstream communication bus, programmed to move a set of data between the master controller and the set of nodes.

5. The method of claim 1, further comprising:
providing a synchronization channel, connected to the master controller and the set of nodes.

6. The method of claim 5, further comprising:
providing the master controller with:
a synchronization channel transceiver operatively connected between the microprocessor and the synchronization channel.

7. The method of claim 5, further comprising:
providing the synchronization channel with a DC power distribution bus.

8. The method of claim 1, further comprising:
providing a display processor, operatively connected to the master controller, through a universal serial bus ("USB") to universal asynchronous receiver/transmitter ("UART") converter;
wherein the display processor is configured to display a graphical representation of the set of voltage measurement values.

9. A method for collecting geophysical data from a set of electrodes impressed in a ground surface, comprising:
providing a high voltage source;
providing a master controller, having a microprocessor and a memory;
providing a set of nodes, in electrical connection with the set of electrodes;
providing a high voltage bus, connected to the high voltage source, the master controller and the set of nodes;
providing an upstream communication bus, connected to the master controller and the set of nodes;
providing a downstream communication bus, connected to the master controller and the set of nodes;
providing the memory with a set of instructions, that when executed, cause the master controller to:
format the set of nodes using the upstream communication bus;
read a current signal from the high voltage bus;
programmably distribute a high voltage signal to the set of electrodes from the high voltage bus;
programmably read a set of voltage measurement values, from the set of electrodes; and
send the set of voltage measurement values to the master controller using the downstream communication bus; and
providing the master controller with:
a measurement bus, connected to the master controller and the set of nodes;
a voltage divider network, connected to the measurement bus;
an amplifier connected to the voltage divider network; and
an analog to digital converter, operatively connected to the amplifier and to the microprocessor.

10. A method for collecting geophysical data from a set of electrodes impressed in a ground surface, comprising:
providing a high voltage source;
providing a master controller, having a microprocessor and a memory;
providing a set of nodes, in electrical connection with the set of electrodes;
providing a high voltage bus, connected to the high voltage source, the master controller and the set of nodes;
providing an upstream communication bus, connected to the master controller and the set of nodes;
providing a downstream communication bus, connected to the master controller and the set of nodes;
providing the memory with a set of instructions, that when executed, cause the master controller to:
format the set of nodes using the upstream communication bus;
read a current signal from the high voltage bus;
programmably distribute a high voltage signal to the set of electrodes from the high voltage bus;
programmably read a set of voltage measurement values, from the set of electrodes; and
send the set of voltage measurement values to the master controller using the downstream communication bus; and
providing at least one node of the set of nodes with:
a node microprocessor;
a switchable current injection means, connected between the node microprocessor and at least one electrode of the set of electrodes, for placing the at least one electrode in one of a positive polarity current injection state and a negative polarity current injection state;
a switchable voltage measurement means, connected between the node microprocessor and the at least one electrode of the set of electrodes, for placing the at least one electrode in one of a positive polarity voltage measurement state and a negative polarity voltage measurement state; and
providing the switchable voltage measurement means for placing the at least one electrode in one of a bifunction positive polarity measurement state and a bifunction negative polarity measurement state.

11. The method of claim 10, further comprising:
providing a high voltage isolation barrier means, connected to the switchable current injection means and the switchable voltage measurement means, for isolating the high voltage bus.

12. The method of claim 10, further comprising:
providing the switchable voltage measurement means with an autoscaling means, connected between the node microprocessor and the at least one electrode of the set of electrodes, for selectively engaging a set of resistor divider networks.

13. A method for collecting geophysical data from a set of electrodes impressed in a ground surface, comprising:
providing a high voltage source;
providing a master controller, having a microprocessor and a memory;
providing a set of nodes, in electrical connection with the set of electrodes;
providing a high voltage bus, connected to the high voltage source, the master controller and the set of nodes;

providing an upstream communication bus, connected to the master controller and the set of nodes;
providing a downstream communication bus, connected to the master controller and the set of nodes;
providing the memory with a set of instructions, that when executed, cause the master controller to:
  format the set of nodes using the upstream communication bus;
  read a current signal from the high voltage bus;
  programmably distribute a high voltage signal to the set of electrodes from the high voltage bus;
  programmably read a set of voltage measurement values, from the set of electrodes; and
  send the set of voltage measurement values to the master controller using the downstream communication bus;
providing the high voltage bus with a high voltage positive line and a high voltage negative line;
providing at least one node of the set of nodes with:
  a node microprocessor;
  a high voltage relay, connected to at least one electrode of the set of electrodes, activated by the node microprocessor;
  a first high voltage metal oxide semiconductor field effect transistor ("MOSFET") connected between the high voltage relay and the high voltage positive line;
  a first floating gate driver circuit, connected to the first high voltage MOSFET; and
  a high voltage isolation barrier, connected between the first floating gate driver circuit and the node microprocessor; and
providing the high voltage isolation barrier with a first optoisolator connected between the first floating gate driver circuit and the node microprocessor.

14. The method of claim 13, further comprising:
providing a second high voltage MOSFET, connected between the high voltage relay and the high voltage negative line;
providing a second floating gate driver circuit connected to the second high voltage MOSFET; and
providing the high voltage isolation barrier between the second floating gate driver circuit and the node microprocessor.

15. The method of claim 14, further comprising:
providing the high voltage isolation barrier with a second optoisolator connected between the second floating gate driver circuit and the microprocessor; and
providing a cross-conduction logic circuit connected between the microprocessor, and the first optoisolator and the second optoisolator.

16. The method of claim 15, further comprising:
providing the high voltage isolation barrier with:
  a first isolated DC to DC converter connected to the first floating gate driver circuit;
  a second isolated DC to DC converter connected to the second floating gate driver circuit; and
  a DC supply, connected to the first isolated DC to DC converter and the second isolated DC to DC converter.

17. A method for collecting geophysical data from a set of electrodes impressed in a ground surface, comprising:
providing a high voltage source;
providing a master controller, having a microprocessor and a memory;
providing a set of nodes, in electrical connection with the set of electrodes;
providing a high voltage bus, connected to the high voltage source, the master controller and the set of nodes;
providing an upstream communication bus, connected to the master controller and the set of nodes;
providing a downstream communication bus, connected to the master controller and the set of nodes;
providing the memory with a set of instructions, that when executed, cause the master controller to:
  format the set of nodes using the upstream communication bus;
  read a current signal from the high voltage bus;
  programmably distribute a high voltage signal to the set of electrodes from the high voltage bus;
  programmably read a set of voltage measurement values, from the set of electrodes; and
  send the set of voltage measurement values to the master controller using the downstream communication bus;
providing a measurement bus, connected to the master controller and the set of nodes; and
providing the measurement bus with:
  a voltage measurement positive line and a voltage measurement negative line;
wherein at least one node of the set of nodes further comprises:
  a node microprocessor;
  a relay, connected to at least one electrode of the set of electrodes, activated by the node microprocessor; and
  connecting the relay to the voltage measurement positive line.

18. The method of claim 17, further comprising:
providing the node microprocessor with:
  a direct memory access configuration, operational on the upstream communication bus and the downstream communication bus, programmed to move a set of data between the master controller and the set of nodes.

19. A method for collecting geophysical data from a set of electrodes impressed in a ground surface, comprising:
providing a high voltage source;
providing a master controller, having a microprocessor and a memory;
providing a set of nodes, in electrical connection with the set of electrodes;
providing a high voltage bus, connected to the high voltage source, the master controller and the set of nodes;
providing an upstream communication bus, connected to the master controller and the set of nodes;
providing a downstream communication bus, connected to the master controller and the set of nodes;
providing the memory with a set of instructions, that when executed, cause the master controller to:
  format the set of nodes using the upstream communication bus;
  read a current signal from the high voltage bus;
  programmably distribute a high voltage signal to the set of electrodes from the high voltage bus;
  programmably read a set of voltage measurement values, from the set of electrodes; and
  send the set of voltage measurement values to the master controller using the downstream communication bus;

providing a measurement bus, connected to the master controller and the set of nodes, with a voltage measurement positive line and a voltage measurement negative line; and providing at least one node of the set of nodes with:
- a node microprocessor;
- a first relay, activated by the node microprocessor, interposed in the voltage measurement positive line; and
- a second relay, activated by the node microprocessor, interposed in the voltage measurement negative line.

* * * * *